US012660150B2

(12) United States Patent
Matsuzaki et al.

(10) Patent No.: US 12,660,150 B2
(45) Date of Patent: Jun. 16, 2026

(54) SEMICONDUCTOR DEVICE

(71) Applicant: SEMICONDUCTOR ENERGY LABORATORY CO., LTD., Atsugi (JP)

(72) Inventors: Takanori Matsuzaki, Atsugi (JP); Toshihiko Saito, Atsugi (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/485,385

(22) Filed: Oct. 12, 2023

(65) Prior Publication Data

US 2024/0130101 A1 Apr. 18, 2024

(30) Foreign Application Priority Data

Oct. 14, 2022 (JP) .................................. 2022-165163

(51) Int. Cl.
*H10B 12/00* (2023.01)
(52) U.S. Cl.
CPC ............. *H10B 12/00* (2023.02); *H10B 12/03* (2023.02); *H10B 12/05* (2023.02); *H10B 12/482* (2023.02); *H10B 12/488* (2023.02); *H10B 12/50* (2023.02)
(58) Field of Classification Search
CPC .............................. H10B 12/00; H10B 12/482
USPC .......................................................... 257/71
See application file for complete search history.

(56) References Cited

U.S. PATENT DOCUMENTS

| | | | |
|---|---|---|---|
| 8,455,868 B2 | 6/2013 | Yamazaki et al. | |
| 8,547,771 B2 | 10/2013 | Koyama | |
| 8,995,174 B2 | 3/2015 | Koyama | |
| 9,312,257 B2 | 4/2016 | Yamazaki et al. | |
| 9,349,735 B2 | 5/2016 | Yamazaki et al. | |
| 9,748,273 B2 | 8/2017 | Yamazaki et al. | |
| 9,991,265 B2 | 6/2018 | Yamazaki et al. | |
| 10,038,011 B2 | 7/2018 | Yamazaki et al. | |
| 10,418,381 B2 | 9/2019 | Yamazaki et al. | |
| 10,553,589 B2 | 2/2020 | Yamazaki et al. | |

(Continued)

FOREIGN PATENT DOCUMENTS

| | | |
|---|---|---|
| JP | 2011-151383 A | 8/2011 |
| JP | 2012-257187 A | 12/2012 |

(Continued)

OTHER PUBLICATIONS

Oota.M et al., "3D-Stacked CAAC-In—Ga—Zn Oxide FETs with Gate Length of 72nm", IEDM 19: Technical Digest of International Electron Devices Meeting, Dec. 7, 2019, pp. 50-53.

*Primary Examiner* — Ajay Arora
(74) *Attorney, Agent, or Firm* — Fish & Richardson P.C.

(57) ABSTRACT

A semiconductor device that can be miniaturized or highly integrated is provided. The semiconductor device includes a transistor, a capacitor, and a first insulating layer. The first insulating layer is provided over a first conductive layer and a second conductive layer and includes a first opening reaching the first conductive layer and a second opening reaching the second conductive layer. The transistor is a vertical transistor in which a channel formation region is provided along the side wall of the first opening. The capacitor is a vertical capacitor in which a pair of electrodes and a dielectric are provided along the side surface of the second opening.

22 Claims, 27 Drawing Sheets

(56)     References Cited

U.S. PATENT DOCUMENTS

| | | | |
|---|---|---|---|
| 10,685,984 B2 | 6/2020 | Yamazaki et al. | |
| 11,133,330 B2 | 9/2021 | Yamazaki et al. | |
| 11,177,792 B2 | 11/2021 | Koyama | |
| 11,456,296 B2 | 9/2022 | Yamazaki et al. | |
| 11,677,384 B2 | 6/2023 | Koyama | |
| 11,825,665 B2 | 11/2023 | Yamazaki et al. | |
| 2015/0280691 A1 | 10/2015 | Koyama | |
| 2017/0285425 A1* | 10/2017 | Yamazaki | G02F 1/136204 |
| 2022/0352384 A1 | 11/2022 | Oota et al. | |
| 2022/0416060 A1* | 12/2022 | Kimura | H10D 99/00 |
| 2023/0253955 A1 | 8/2023 | Koyama | |
| 2023/0387130 A1 | 11/2023 | Yamazaki et al. | |
| 2023/0395609 A1 | 12/2023 | Yamazaki et al. | |
| 2023/0413587 A1 | 12/2023 | Yamazaki et al. | |
| 2025/0267848 A1* | 8/2025 | Yamazaki | H10B 12/33 |

FOREIGN PATENT DOCUMENTS

| | | |
|---|---|---|
| JP | 2013-211537 A | 10/2013 |
| WO | WO-2021/053473 | 3/2021 |

* cited by examiner

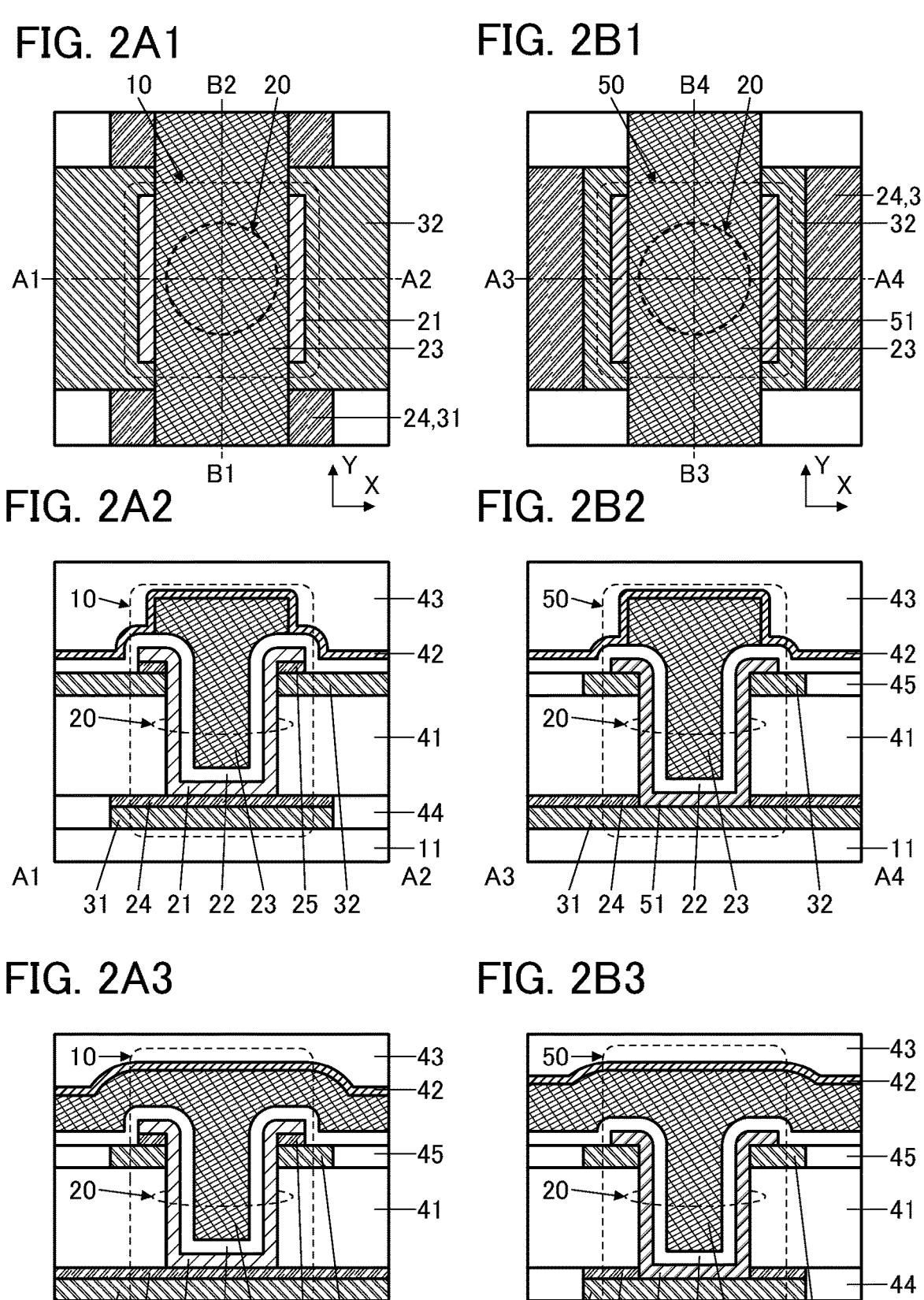
FIG. 2A1
FIG. 2B1
FIG. 2A2
FIG. 2B2
FIG. 2A3
FIG. 2B3

FIG. 5A1
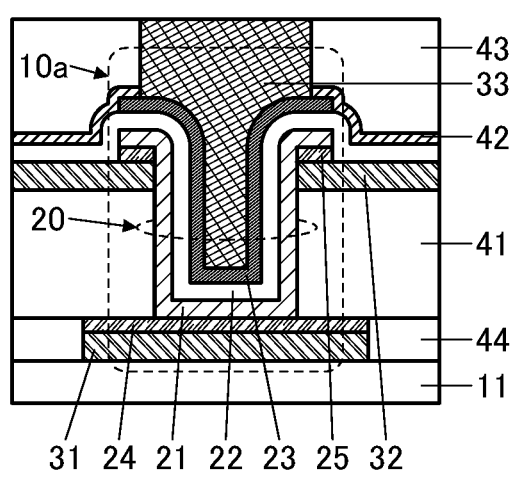
FIG. 5B1
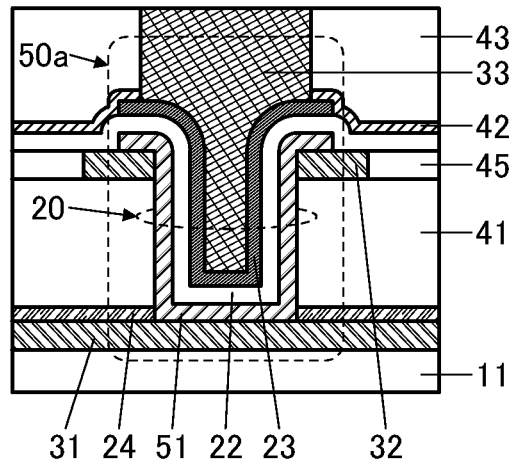
FIG. 5A2
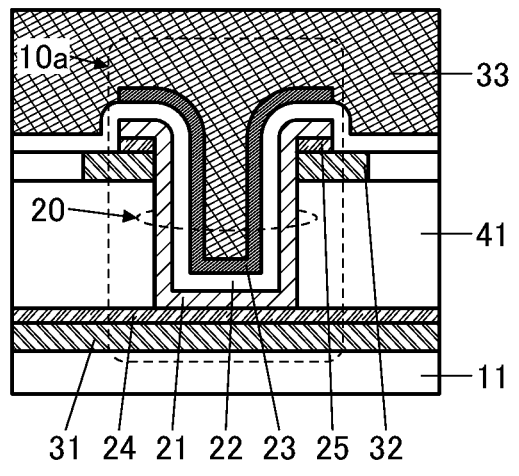
FIG. 5B2
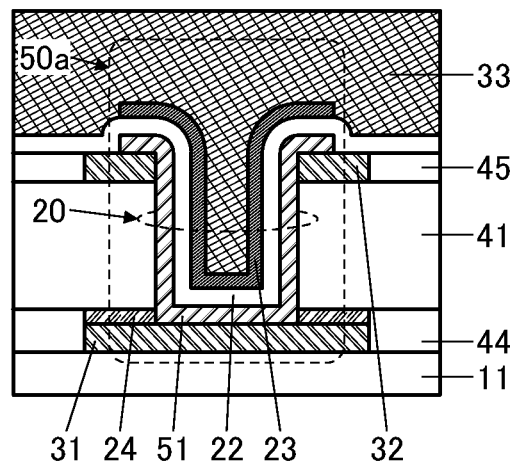

40a     WWL     PL

BL     Tr1     C 40a     23a     32a     23b     32b 10     50     43

20     20     42

41

44

11     24  21  22  25     31     51

40a     23a     32     23b 10     50     43

20     20     42

41

44

11  31a  24  21  22  25     51     31b 5500
5511
5510
700

5900
5905
5902
5901
700
5904
5903

5300
5301
5302
700
5303

5800
700
5801
5802
5803

5200
5202
5203
700
5201

7500
7520
700
7522

5700
700

6240
6246
6244
700
6241
6242
6243

6300
700
6304
6301
6306
6303
6302
6305

5400
5405
5406
5401
700
5402
5404
5403

6100

5110

5112

5111

5110

5115

700

5113

5150

5152

5151

5153    5156    5155    5152

700

SEMICONDUCTOR DEVICE

BACKGROUND OF THE INVENTION

1. Field of the Invention

One embodiment of the present invention relates to a transistor, a semiconductor device, a memory device, and an electronic device. Another embodiment of the present invention relates to a method for manufacturing a memory device or a semiconductor device. Another embodiment of the present invention relates to a semiconductor wafer and a module.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

2. Description of the Related Art

In recent years, semiconductor devices have been developed, and CPUs (Central Processing Units), memories, and other LSI (Large Scale Integration) are mainly used in the semiconductor devices. A CPU is an aggregation of semiconductor elements; the CPU includes a semiconductor integrated circuit (including at least a transistor and a memory) formed into a chip by processing a semiconductor wafer, and is provided with an electrode that is a connection terminal.

A semiconductor circuit (IC chip) of a CPU, a memory, or other LSI is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is applied to a wide range of semiconductor components such as integrated circuits and image display devices (also simply referred to as display devices). A silicon-based semiconductor material is widely known as a material for a semiconductor thin film that can be used in a transistor. As another material, an oxide semiconductor has been attracting attention.

It is known that a transistor including an oxide semiconductor has an extremely low leakage current in a non-conducting state. For example, Patent Document 1 discloses a low-power CPU utilizing the characteristic of a low leakage current. Furthermore, for example, Patent Document 2 discloses a memory device that can retain stored data for a long time.

In recent years, demand for an integrated circuit with higher density has risen with reductions in size and weight of electronic devices. In addition, the productivity of a semiconductor device including an integrated circuit is desired to be improved. For example, Patent Document 3 and Non-Patent Document 1 disclose a technique to achieve an integrated circuit with higher density by providing a plurality of memory cells, which include transistors with oxide semiconductor films, so as to overlap with each other.

REFERENCES

Patent Documents

[Patent Document 1] Japanese Published Patent Application No. 2012-257187
[Patent Document 2] Japanese Published Patent Application No. 2011-151383
[Patent Document 3] PCT International Publication No. 2021/053473
[Patent Document 4] Japanese Published Patent Application No. 2013-211537

Non-Patent Document

[Non-Patent Document 1] M. Oota, et al., "3D-Stacked CAAC—In—Ga—Zn Oxide FETs with Gate Length of 72 nm", IEDM Tech. Dig., 2019, pp. 50-53

SUMMARY OF THE INVENTION

An object of one embodiment of the present invention is to provide a semiconductor device or a memory device that can be miniaturized or highly integrated. Another object is to provide a memory device including a memory element and a peripheral circuit that are formed separately at a low cost. Another object is to provide a semiconductor device or a memory device that can reduce the load on a wiring. Another object is to provide a semiconductor device or a memory device that operates at high speed. Another object is to provide a semiconductor device or a memory device that has favorable electrical characteristics. Another object is to provide a semiconductor device or a memory device that has a small variation in electrical characteristics of transistors. Another object is to provide a highly reliable semiconductor device or memory device. Another object is to provide a semiconductor device that has a high on-state current. Another object is to provide a semiconductor device or a memory device that has low power consumption. Another object is to provide a novel semiconductor device or memory device. Another object is to provide a method for manufacturing a novel semiconductor device or memory device. Another object of one embodiment of the present invention is to at least alleviate at least one of problems in the conventional art.

Note that the description of these objects does not preclude the existence of other objects. One embodiment of the present invention does not necessarily achieve all of these objects. Other objects can be derived from the description of the specification, the drawings, the claims, and the like.

One embodiment of the present invention is a semiconductor device including a first transistor, a capacitor, and a first insulating layer. The first transistor includes a first conductive layer, a second conductive layer, a third conductive layer, a semiconductor layer, and a second insulating layer. The capacitor includes a fourth conductive layer, a fifth conductive layer, a sixth conductive layer, a seventh conductive layer, and the second insulating layer. The first insulating layer is provided over the first conductive layer and the fourth conductive layer and includes a first opening reaching the first conductive layer and a second opening reaching the fourth conductive layer. The second conductive layer and the fifth conductive layer are provided over the first insulating layer. The semiconductor layer includes a part in contact with the second conductive layer and a part in contact with the first conductive layer in the first opening. The sixth conductive layer includes a part in contact with the fifth conductive layer and a part in contact with the fourth conductive layer in the second opening. The second insulating layer includes a part covering the semiconductor layer in the first opening and a part covering the sixth conductive layer in the second opening. The third conductive layer includes a part overlapping with the semiconductor layer with the second insulating layer therebetween in the first opening. The seventh conductive layer includes a part overlapping with the sixth conductive layer with the second insulating layer therebetween in the second opening.

In the above, the first conductive layer preferably includes a first metal layer and a first oxide layer over the first metal layer. Furthermore, the second conductive layer preferably includes a second metal layer and a second oxide layer over the second metal layer. In that case, the semiconductor layer is preferably in contact with the first oxide layer and the second oxide layer.

In the above, a material for the first conductive layer is preferably the same as a material for the fourth conductive layer. A material for the second conductive layer is preferably the same as a material for the fifth conductive layer. Furthermore, a material for the third conductive layer is preferably the same as a material for the seventh conductive layer.

In the above, a third insulating layer is preferably further provided. In that case, the third conductive layer and the seventh conductive layer are preferably provided so as to be embedded in the third insulating layer.

In the above, an eighth conductive layer and a ninth conductive layer are preferably further provided. In that case, the eighth conductive layer is preferably positioned between the second insulating layer and the third conductive layer in the first opening. The ninth conductive layer is preferably positioned between the second insulating layer and the seventh conductive layer in the second opening.

In the above, each of the first opening and the second opening preferably has a larger diameter at an upper end than at a lower end.

In the above, the first conductive layer is preferably electrically connected to the fourth conductive layer, the fifth conductive layer, and the sixth conductive layer.

In the above, the second conductive layer is preferably electrically connected to the fourth conductive layer, the fifth conductive layer, and the sixth conductive layer.

In the above, a second transistor and a third transistor are preferably further provided. A gate of the second transistor is preferably electrically connected to the first conductive layer, and one of a source and a drain of the third transistor is preferably electrically connected to one of a source and a drain of the second transistor.

In the above, the second transistor and the third transistor are preferably positioned below the first conductive layer. The second transistor preferably includes a part overlapping with the first transistor. The third transistor preferably includes a part overlapping with the capacitor.

In the above, the second transistor and the third transistor are preferably positioned below the first conductive layer. The second transistor preferably includes a part overlapping with the capacitor. The third transistor preferably includes a part overlapping with the first transistor.

According to one embodiment of the present invention, a semiconductor device or a memory device that can be miniaturized or highly integrated can be provided. In a memory device, a memory element and a peripheral circuit can be formed separately at a low cost. A semiconductor device or a memory device that can reduce the load on a wiring can be provided. A semiconductor device or a memory device that operates at high speed can be provided. A highly reliable semiconductor device or memory device can be provided. A semiconductor device or a memory device that has a small variation in electrical characteristics of transistors can be provided. A semiconductor device or a memory device that has favorable electrical characteristics can be provided. A semiconductor device that has a high on-state current can be provided. A semiconductor device or a memory device that has low power consumption can be provided. A novel semiconductor device or memory device can be provided. A method for manufacturing a novel semiconductor device or memory device can be provided. According to one embodiment of the present invention, at least one of problems in the conventional art can be at least alleviated.

Note that the description of these effects does not preclude the existence of other effects. One embodiment of the present invention does not necessarily have all of these effects. Other effects can be derived from the description of the specification, the drawings, the claims, and the like.

BRIEF DESCRIPTION OF THE DRAWINGS

FIGS. 2A1 to 2B3 each illustrate a structure example of a semiconductor device.

FIGS. 5A1 to 5B2 each illustrate a structure example of a semiconductor device.

DETAILED DESCRIPTION OF THE INVENTION

Figure 1A:
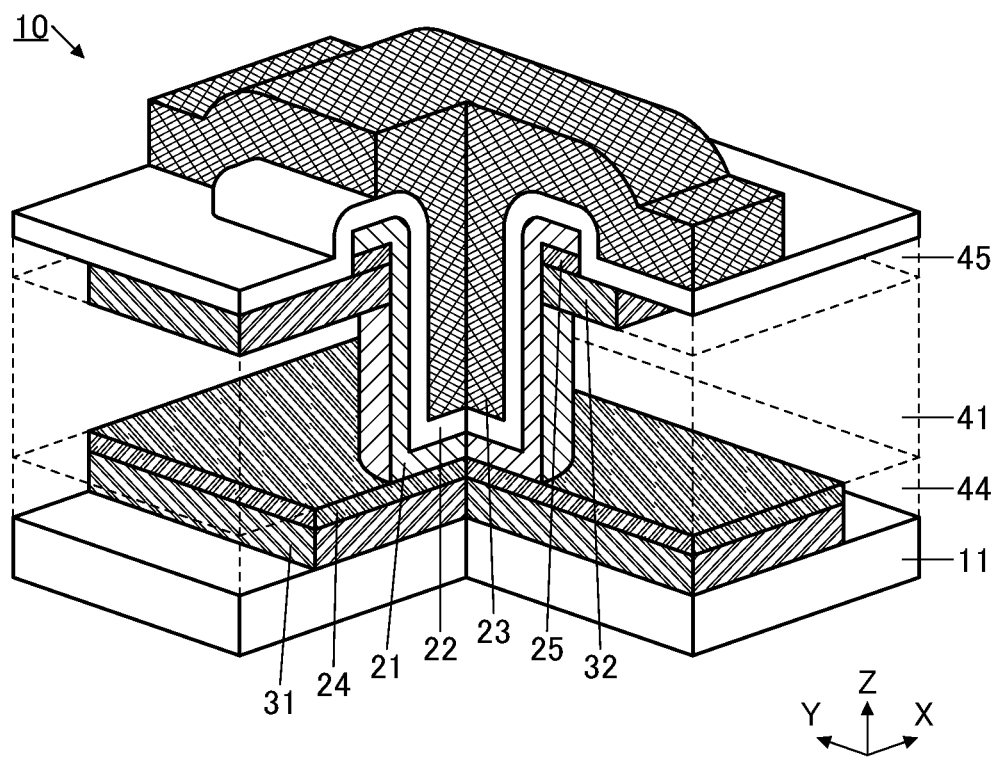
FIGS. 1A and 1B each illustrate a structure example of a semiconductor device.

Embodiments will be described below with reference to the drawings. Note that the embodiments can be implemented with many different modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is sometimes exaggerated for clarity. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. The same hatching pattern is used for portions having similar functions, and the portions are not denoted by specific reference numerals in some cases.

In a plan view (also referred to as a top view), a perspective view, or the like, especially, some components might not be illustrated for easy understanding of the invention. In addition, some hidden lines might not be shown.

The ordinal numbers such as "first" and "second" in this specification and the like are used for convenience and do not denote the order of steps or the stacking order of layers. Therefore, for example, description can be made even when "first" is replaced with "second", "third", or the like as appropriate. In addition, the ordinal numbers in this specification and the like are not necessarily the same as those used to specify one embodiment of the present invention.

In this specification and the like, terms for describing arrangement, such as "over", "above", "under", and "below", are used for convenience in describing a positional relation between components with reference to drawings. The positional relation between components is changed as appropriate in accordance with the direction from which each component is described. Thus, the positional relation is not limited to that described with a term used in this specification and can be explained with other terms as appropriate depending on the situation.

For example, the phrase "X and Y are connected" in this specification and the like also means electrical connection between X and Y. Here, the phrase "X and Y are electrically connected" means connection that enables electrical signal transmission between X and Y in the case where an object (that refers to an element such as a switch, a transistor element, or a diode, a circuit including the element and a wiring, or the like) exists between X and Y. Note that the case where X and Y are electrically connected includes the case where X and Y are directly connected. Here, the phrase "X and Y are directly connected" means connection that enables electrical signal transmission between X and Y through a wiring (or an electrode) or the like, not through the above object. In other words, direct connection refers to connection that can be regarded as the same circuit diagram when represented by an equivalent circuit.

In this specification and the like, a transistor is an element having at least three terminals of a gate, a drain, and a source. The transistor includes a region where a channel is formed (also referred to as a channel formation region) between the drain (a drain terminal, a drain region, or a drain electrode) and the source (a source terminal, a source region, or a source electrode), and a current can flow between the source and the drain through the channel formation region. Note that in this specification and the like, a channel formation region refers to a region through which a current mainly flows.

The functions of a source and a drain are sometimes replaced with each other when a transistor of different polarity is used or when the direction of current flow is changed in circuit operation, for example. Thus, the terms "source" and "drain" can be used interchangeably in this specification and the like.

Note that impurities in a semiconductor refer to, for example, elements other than the main components of the semiconductor. For example, an element with a concentration of lower than 0.1 atomic % is an impurity. When a semiconductor contains an impurity, an increase in density of defect states or a reduction in crystallinity of the semiconductor may occur, for example. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor. Specific examples include hydrogen, lithium, sodium, silicon, boron, phosphorus, carbon, and nitrogen. Note that water also serves as an impurity in some cases. Entry of an impurity may cause oxygen vacancies (also referred to as $V_O$) in an oxide semiconductor, for example.

Note that in this specification and the like, oxynitride refers to a material that contains more oxygen than nitrogen. Examples of oxynitride include silicon oxynitride, aluminum oxynitride, and hafnium oxynitride. Nitride oxide refers to a material that contains more nitrogen than oxygen. Examples of nitride oxide include silicon nitride oxide, aluminum nitride oxide, and hafnium nitride oxide.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, the term "parallel" indicates that the angle formed between two straight lines is greater than or equal to −10° and less than or equal to 10°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. In addition, the term "substantially perpendicular" indicates that the angle formed between two straight lines is greater than or equal to 60° and less than or equal to 120°.

In this specification and the like, "voltage" and "potential" can be replaced with each other as appropriate. The term "voltage" refers to a potential difference from a reference potential. When the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential.

Note that in this specification and the like, the expression "substantially level with" indicates a structure having the same level from a reference surface (e.g., a flat surface such as a substrate surface) in a cross-sectional view. For example, in a manufacturing process of a memory device, planarization treatment (typically, chemical mechanical polishing (CMP) treatment) is performed, whereby the surface(s) of a single layer or a plurality of layers are exposed in some cases. In this case, the surfaces on which the CMP treatment is performed are at the same level from a reference surface. However, a plurality of layers may be on the different levels depending on a treatment apparatus, a treatment method, or a material of the treated surfaces, used for CMP treatment. This case is also included in the scope of "level with" in this specification and the like. For example, the expression "level with" also includes the case where two layers (here, given as a first layer and a second layer) have different levels with respect to the reference surface and the difference in the top-surface level between the first and second layers is less than or equal to 20 nm.

In this specification and the like, the expression "an end portion is aligned with another end portion" means that at least outlines of stacked layers partly overlap with each other in a plan view. For example, the case of patterning or partly patterning an upper layer and a lower layer with the use of the same mask pattern is included. The expression "an end portion is aligned with another end portion" also includes the case where the outlines do not completely overlap with each other; for instance, the outline of the upper layer may be positioned inward or outward from the outline of the lower layer.

In general, it is difficult to clearly differentiate "completely aligned" from "substantially aligned". Thus, in this specification and the like, the expression "aligned" includes both "completely aligned" and "substantially aligned".

Note that "normally-on characteristics" in this specification and the like mean a state where a channel exists without potential application to a gate and current flows through a transistor. Furthermore, "normally-off characteristics" mean a state where current does not flow through a transistor when no potential or a ground potential is applied to a gate.

In this specification and the like, the term "leakage current" sometimes expresses the same meaning as "off-state current". In this specification and the like, the off-state current sometimes refers to current that flows between a source and a drain of a transistor in the off state, for example.

Embodiment 1

Described in this embodiment are structure examples of a semiconductor device of one embodiment of the present invention and a manufacturing method example thereof.

One embodiment of the present invention includes a transistor and a capacitor that are formed separately over the same plane.

In the transistor, a source electrode and a drain electrode are positioned at different heights, so that current flows in a semiconductor layer in the height direction. In other words, the channel length direction includes a height (vertical) component, so that the transistor of one embodiment of the present invention can also be referred to as a vertical transistor, a vertical channel transistor, or the like.

More specifically, an insulating layer serving as a spacer is provided between a lower electrode, which is one of the source electrode and the drain electrode of the transistor, and an upper electrode, which is the other of the source electrode and the drain electrode of the transistor; in an opening in the insulating layer, a semiconductor layer where a channel is formed is provided so as to connect the lower electrode and the upper electrode. In the opening, an insulating layer serving as a gate insulating layer and a conductive layer serving as a gate electrode are provided so as to overlap with the semiconductor layer. Since the source electrode, the semiconductor layer, and the drain electrode can be provided to overlap with each other, the area occupied by the transistor can be significantly smaller than that of what is called a planar transistor in which a semiconductor layer is positioned over a flat plane.

In contrast, the capacitor has a structure in which the semiconductor layer in the above transistor is replaced with a conductive layer serving as one electrode of the capacitor. The capacitor is positioned in the opening and includes the insulating layer serving as the gate insulating layer and a pair of conductive layers between which the insulating layer is provided, so that a metal-insulator-metal (MIM) capacitor is constituted. Electrical continuity is established between the upper electrode and the lower electrode, between which the insulating layer serving as the spacer is provided, through the conductive layers in contact with the upper electrode and the lower electrode.

As described above, the transistor and the capacitor have almost the same structure except for the semiconductor layer and the conductive layer. This structure allows the transistor and the capacitor to be separately formed over the same plane only by adding a step of separately forming the semiconductor layer and the conductive layer.

Combination of transistors and capacitors provides memory cells with a variety of structures, for example, thereby offering a variety of memory devices.

Here, the channel length of the transistor can be precisely adjusted by the thickness of the insulating layer; therefore, a variation in the channel length can be extremely smaller than that of a planar transistor. Furthermore, by reducing the thickness of the insulating layer, a transistor with an extremely short channel length can be manufactured. For example, it is possible to manufacture a transistor with a channel length of 2 μm or shorter, 1 μm or shorter, 500 nm or shorter, 300 nm or shorter, 200 nm or shorter, 100 nm or shorter, 50 nm or shorter, 30 nm or shorter, or 20 nm or shorter and nm or longer, 7 nm or longer, or 10 nm or longer. Thus, it is possible to achieve a transistor with an extremely short channel length that could not be achieved with a light-exposure apparatus for mass production. Moreover, a transistor with a channel length shorter than 10 nm can also be achieved without using an extremely expensive light-exposure apparatus used in the latest LSI technology.

For the semiconductor layer, a metal oxide having semiconductor characteristics (also referred to as an oxide semiconductor) is particularly preferably used, in which case both high performance and high productivity can be achieved. In particular, an oxide semiconductor having crystallinity is further preferably used so that high reliability can be achieved.

More specific examples are described below with reference to drawings.

Structure Example

Figure 1B:
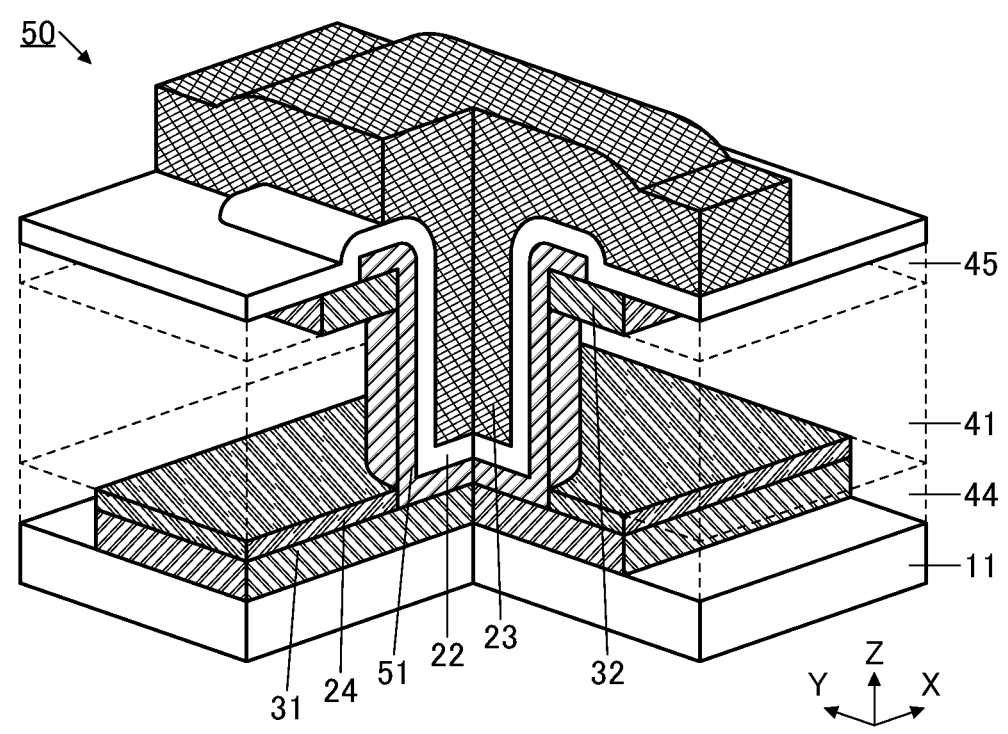

FIG. 1A is a schematic perspective view of a transistor 10, and FIG. 1B is a schematic perspective view of a capacitor 50. In FIGS. 1A and 1B, some parts are cut for easy understanding. Also in FIGS. 1A and 1B, some components (e.g., insulating layers) are shown to have only outlines indicated by dashed lines.

In FIGS. 1A and 1B, the X direction, the Y direction, and the Z direction are shown by arrows, which do not necessarily indicate the same direction in FIGS. 1A and 1B.

FIG. 2A1 is a plan view of the transistor 10, and FIGS. 2A2 and 2A3 are schematic cross-sectional views along the line A1-A2 and the line B1-B2, respectively, in FIG. 2A1. FIG. 2B1 is a plan view of the capacitor 50, and FIGS. 2B2 and 2B3 are schematic cross-sectional views along the line A3-A4 and the line B3-B4, respectively, in FIG. 2B1. Note that some components (e.g., insulating layers) are omitted in FIGS. 2A1 and 2B1. An insulating layer 42 and an insulating layer 43 are stacked to cover the transistor 10 and the capacitor 50. {Transistor 10} The transistor 10 is provided over an insulating layer 11 provided over a substrate (not illustrated). The transistor 10 includes a conductive layer 24 serving as one of a source electrode and a drain electrode, a semiconductor layer 21, an insulating layer 22 partly serving as a gate insulating layer, a conductive layer 23 partly serving as a gate electrode, and a conductive layer 25 serving as the other of the source electrode and the drain electrode. The conductive layer 24 is provided on and in contact with a conductive layer 31 and the conductive layer 25 is provided on and in contact with a conductive layer 32. A part of the conductive layer 31 serves as one of the source electrode and the drain electrode together with the conductive layer 24, and a part of the conductive layer 32 serves as the other of the source electrode and the drain electrode together with the conductive layer 25. A stack of the conductive layer 31 and the conductive layer 24 can also be referred to as a conductive layer. Likewise, a stack of the conductive layer 32 and the conductive layer 25 can also be referred to as a conductive layer.

An insulating layer 41 is provided over the conductive layer 24 and includes an opening 20 that reaches the conductive layer 24. The semiconductor layer 21 is provided along the inner wall of the opening in the insulating layer 41 and is in contact with the conductive layers 24 and 25. A part of the insulating layer 22 is provided so as to cover the top surface of the semiconductor layer 21 in the opening in the insulating layer 41. The conductive layer 23 is provided over the insulating layer 22 so as to fill the depression of the insulating layer 22 in the opening in the insulating layer 41. The conductive layers 31 and 24 are provided so as to be embedded in an insulating layer 44. The conductive layer 32 is provided so as to be embedded in an insulating layer 45.

In the transistor 10 with the above structure, the source electrode and the drain electrode are positioned at different heights, so that current flows in the semiconductor layer in the height direction. In other words, the channel length direction includes a height (vertical) component, so that the transistor of one embodiment of the present invention can also be referred to as a vertical field effect transistor (VFET), a vertical transistor, a vertical channel transistor, or the like. Since the source electrode, the semiconductor layer, and the drain electrode can be provided to overlap with each other in the transistor 10, the area occupied by the transistor 10 can be significantly smaller than that of what is called a planar transistor (also referred to as a lateral transistor, lateral FET (LFET), or the like) in which a semiconductor layer is positioned over a flat plane.

The channel length of the transistor 10 can be precisely adjusted by the thickness of the insulating layer 41 serving as a spacer; therefore, a variation in the channel length can be extremely smaller than that of a planar transistor. Furthermore, by reducing the thickness of the insulating layer 41, a transistor with an extremely short channel length can be manufactured. For example, it is possible to manufacture a transistor with a channel length of 50 nm or shorter, 30 nm or shorter, or 20 nm or shorter and 5 nm or longer, 7 nm or longer, or 10 nm or longer. Thus, even with a conventional light-exposure apparatus for mass production, a transistor with a channel length shorter than 10 nm can also be achieved without using an extremely expensive light-exposure apparatus used in the latest LSI technology.

A variety of semiconductor materials can be used for the semiconductor layer 21; in particular, an oxide semiconductor containing a metal oxide is preferably used. The use of an oxide semiconductor formed under an appropriate condition allows a transistor having both a high on-state current and an extremely low off-state current to be achieved at a low cost. Described below are preferable structure examples of the case where an oxide semiconductor is used for the semiconductor layer 21 unless otherwise specified.

The top surfaces of the conductive layers 24 and 25 are in contact with the semiconductor layer 21. Hence, in the case where an oxide semiconductor is used for the semiconductor layer 21, the top surface of the conductive layer 24 or 25 might be oxidized by the effect of heat or the like generated in a deposition step of a semiconductor film to be the semiconductor layer 21 or a later step, so that an insulating oxide film is formed between the conductive layer 24 or 25 and the semiconductor layer 21, increasing the contact resistance. Thus, an oxide conductor containing a conductive oxide is preferably used for the conductive layers 24 and 25. This can prevent an increase in the contact resistance due to the oxidation of the surfaces of the conductive layers 24 and 25. The conductive layers 24 and 25 can also be referred to as an oxide layer, a metal oxide layer, an oxide conductive layer, or the like.

The conductive layers 31, 32, and 23 can also be used as wirings. FIG. 2A1 and the like illustrate an example in which the conductive layers 31 and 23 are used as wirings extending in the Y direction and the conductive layer 32 is used as a wiring extending in the X direction. Since the conductive layers 32 and 23 overlap with each other with the insulating layer 22 therebetween, the parasitic capacitance between the conductive layers 32 and 23 is larger than that between other combinations of layers (between the conductive layers 31 and 23 and between the conductive layers 31 and 32). Hence, the conductive layer 32 is extended in the direction crossing the conductive layer 23, whereby the capacitance between the wirings can be reduced. The extending directions of the wirings are not limited thereto and can be determined as appropriate. The conductive layers 31 and 32 can also be referred to as metal layers, non-oxide layers, and the like in order to be distinguished from the conductive layers 24 and 25.

Figure 3A:
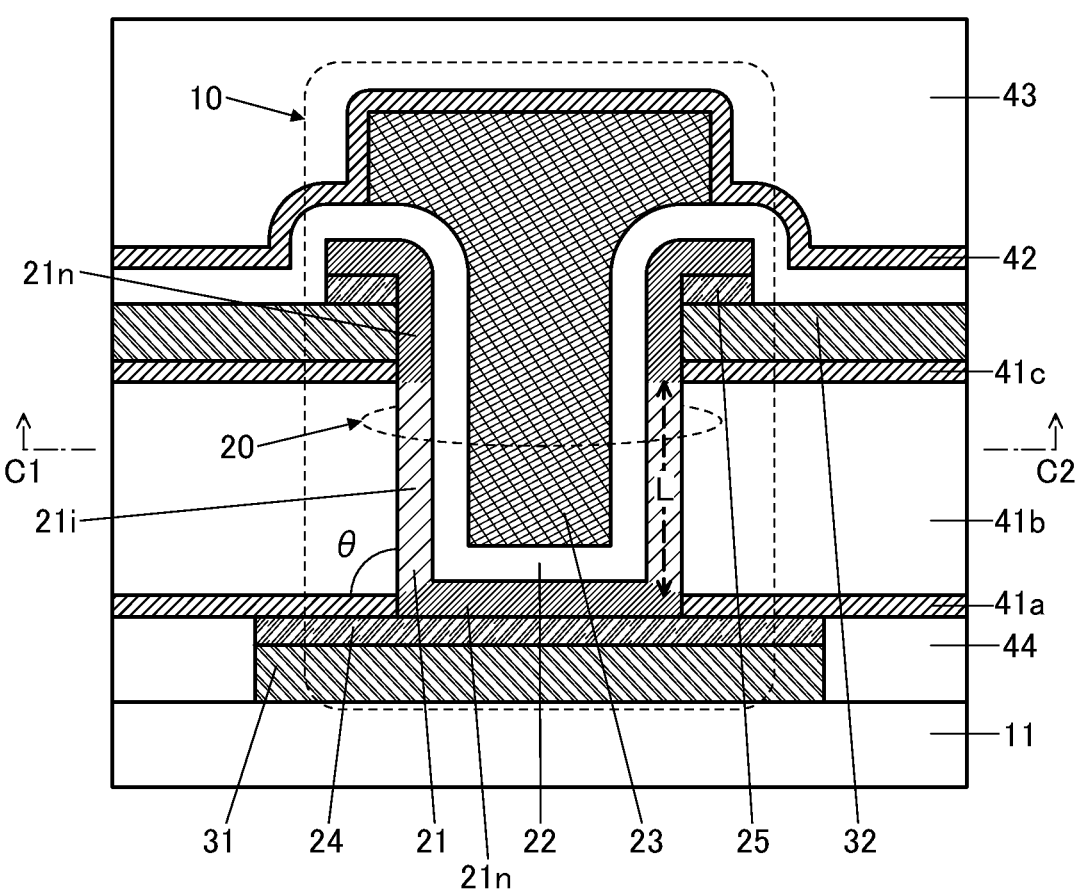
FIGS. 3A and 3B illustrate a structure example of a semiconductor device.

FIG. 3A is a schematic cross-sectional view of another structure example of the transistor 10. In FIG. 3A, an insulating layer 41*a*, an insulating layer 41*b*, and an insulating layer 41*c* are provided instead of the insulating layer 41.

The semiconductor layer 21 is provided in contact with the inner wall of the opening 20 in the insulating layer 41*b*. An oxide insulating film is preferably used as the insulating layer 41*b*. In particular, an oxide insulating film that releases oxygen by heating is preferably used. Furthermore, the insulating layer 41*b* is preferably interposed between the insulating layers 41*a* and 41*c* having a barrier property against oxygen. This enables oxygen contained in the insulating layer 41*b* to be enclosed in a region surrounded by the insulating layers 41*a* and 41*c* and the semiconductor layer 21, so that oxygen can be supplied to the semiconductor layer 21 more efficiently.

A part of the semiconductor layer 21 that is in contact with the insulating layer 41*b* is a region where oxygen vacancies are reduced, i.e., an i-type region. The other part of the semiconductor layer 21 that is not in contact with the insulating layer 41*b* is preferably an n-type region containing a large amount of carriers. That is, the part of the semiconductor layer 21 that is in contact with the insulating layer 41*b* can be referred to as a channel formation region and regions other than the part can be referred to as low-resistance regions (or a source region or a drain region). In FIG. 3A, different hatching patterns are given to a channel formation region 21*i* and low-resistance regions 21*n* of the semiconductor layer 21.

In that case, a channel length L of the transistor 10 can be defined as, as illustrated in FIG. 3A, the length of a part of the semiconductor layer 21 that is in contact with the insulating layer 41*b* on the shortest path connecting a part in contact with the conductive layer 24 and a part in contact with the conductive layer 25. When the opening 20 in the insulating layer 41*b* has a sidewall angle ($\theta$) of 90°, the channel length L is equal to the thickness of the insulating layer 41*b*. The channel length L can be increased with an increase in $\theta$.

Figure 3B:
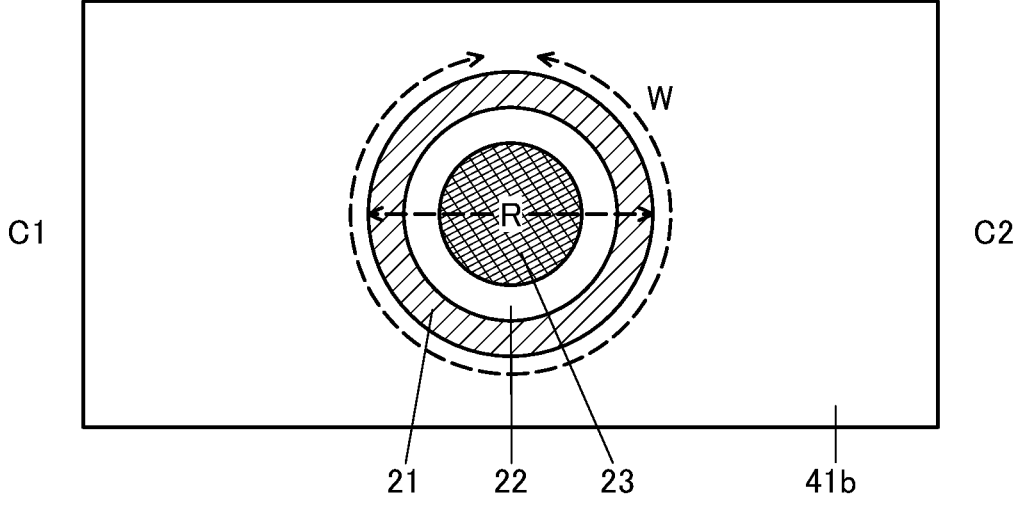

A channel width W of the transistor 10 depends on the shape of the opening 20. FIG. 3B is a plan view seen in the Z direction of a cross section along the line C1-C2 where the insulating layer 41*b* is provided in FIG. 3A. Here, the opening 20 has a cylindrical shape. When the outline of the opening 20 is a circle with a diameter R, the channel width W can be regarded as the circumference of the opening 20 (i.e., $W=\pi\times R$). Here, the circumference of the opening 20 varies with the height if the sidewall angle $\theta$ of the opening 20 in the insulating layer 41*b* shifts from 90°. In that case, the channel width W can be the circumference of the opening 20 with the minimum diameter or the circumference of the opening 20 at the upper end.

Since the semiconductor layer 21 and the insulating layer 22 are formed along the inner wall of the opening 20 in the insulating layer 41*b*, the thicknesses of the layers are sometimes reduced in the opening 20 by some deposition methods. For example, when a sputtering method or a plasma CVD method is used, a film deposited on a surface inclined with respect to the substrate surface or a surface perpendicular to the substrate surface tends to be thinner than a film deposited on a surface horizontal to the substrate surface. By contrast, a deposition method such as an atomic layer deposition (ALD) method or a thermal CVD method allows a film with a uniform thickness to be formed on a surface with any angle. The semiconductor layer 21 and the insulating layer 22 are preferably formed by an ALD method when the opening 20 in the insulating layer 41*b* has a sidewall angle $\theta$ of 75° or more, 80° or more, or 85° or more, for example.

{Capacitor 50}

Next, the capacitor 50 is described. Note that layers of the transistor 10 and the capacitor 50, which can be formed by processing the same film, are denoted by the same reference numeral in the following description. In other words, components of the transistor 10 and the capacitor 50, which are denoted by the same reference numeral, can be formed using the same material. For the components denoted by the same reference numeral, the above description of the transistor 10 can be referred to and the description of the components is omitted in some cases.

The capacitor 50 is provided over the insulating layer 11 and includes the conductive layer 31, the conductive layer 32, a conductive layer 51, the insulating layer 22, and the conductive layer 23. The capacitor 50 is constituted by the conductive layer 51 serving as one electrode, the conductive layer 23 serving as the other electrode, and the insulating layer 22 positioned therebetween and serving as a dielectric.

Like the semiconductor layer 21 of the transistor 10, the conductive layer 51 is provided along the inner wall of the opening 20 in the insulating layer 41. The capacitor 50 can be referred to as a vertical capacitor, a cylindrical capacitor, or the like, which is preferred because of having higher capacitance per occupied area than a parallel-plate-type capacitor.

The conductive layer 24 is provided over the conductive layer 31. The conductive layer 24 includes an opening at a position overlapping with the opening 20. The conductive layer 51 is in contact with the top surface of the conductive layer 31 through the opening in the conductive layer 24. The conductive layers 31 and 51 are thus connected not through the conductive layer 24 including an oxide conductor, so that the electric resistance between the conductive layers 31 and 51 can be reduced. The same applies to the conductive layers 32 and 51: the conductive layer 25 over the conductive layer 32 is removed and the conductive layers 32 and 51 are provided in contact with each other.

One or both of the conductive layers 31 and 23 serve(s) as a wiring. FIGS. 2B1 to 2B3 and the like illustrate an example in which the conductive layer 31 is used as a wiring extending in the X direction and the conductive layer 23 is used as a wiring extending in the Y direction. That is, the capacitor 50 is provided at the intersection of the conductive layers 31 and 23 in this example. In contrast, the conductive layer 32 is formed into an island shape without extending in the X direction or the Y direction.

Figure 4A:
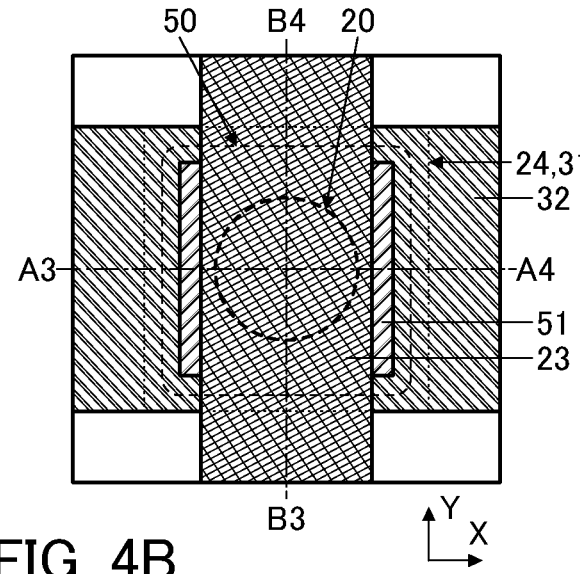
FIGS. 4A to 4C illustrate a structure example of a semiconductor device.
Figure 4B:
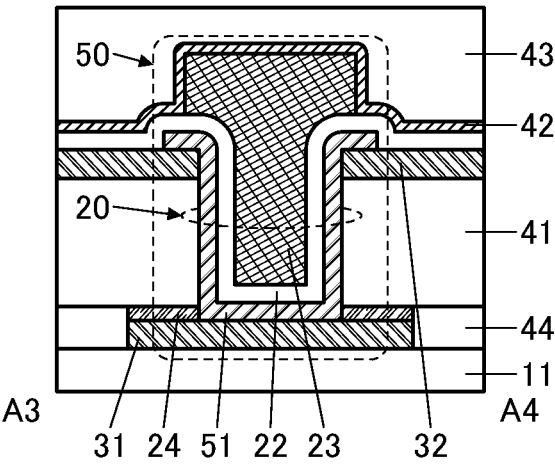
Figure 4C:
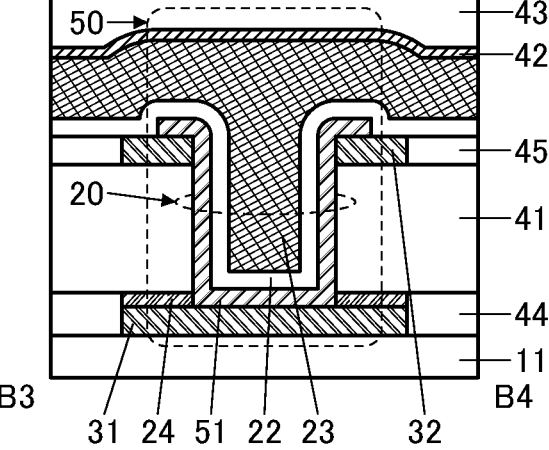

FIGS. 4A to 4C illustrate an example in which the conductive layer 32 is used as a wiring extending in the X direction and the conductive layer 31 is formed into an island shape. Note that each of the conductive layers 31 and 32 may be used as a wiring. For example, the conductive layer 31 and the conductive layer 32 may be used as a wiring extending in one of the X and Y directions and a wiring extending in the other direction, respectively.

{Components}

<Substrate>

As a substrate over which the transistor and the capacitor are formed, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Other examples include any of the above semiconductor substrates including an insulator region, e.g., a silicon on insulator (SOI) substrate. Examples of the conductor substrate include a graphite substrate, a metal substrate, an alloy substrate, and a conductive resin substrate. Other examples include a substrate containing a nitride of a metal and a substrate containing an oxide of a metal. Other examples include an insulator substrate provided with a conductive layer or a semiconductor layer, a semiconductor substrate provided with a conductive layer or an insulating layer, and a conductor substrate provided with a semiconductor layer or an insulating layer. Alternatively, these substrates provided with elements may be used. Examples of the elements provided over the substrates include a capacitor, a resistor, a switching element, a light-emitting element, and a memory element.

<Semiconductor Layer>

The semiconductor layer 21 preferably includes a metal oxide (an oxide semiconductor).

Examples of a metal oxide that can be used for the semiconductor layer 21 include an In oxide, a Ga oxide, and a Zn oxide. The metal oxide preferably contains at least In or Zn. The metal oxide preferably contains two or three elements selected from In, an element M, and Zn. The element M is a metal element or metalloid element that has a high bonding energy with oxygen, such as a metal element or metalloid element whose bonding energy with oxygen is higher than that of In. Specific examples of the element M include Al, Ga, Sn, Y, Ti, V, Cr, Mn, Fe, Co, Ni, Zr, Mo, Hf, Ta, W, La, Ce, Nd, Mg, Ca, Sr, Ba, B, Si, Ge, and Sb. The element M contained in the metal oxide is preferably one or more kinds selected from the above elements. Specifically, the element M is preferably one or more kinds selected from Al, Ga, Y, and Sn, further preferably Ga. Hereinafter, a metal oxide containing In, the element M, and Zn is referred to as In-M-Zn oxide in some cases. In this specification and the like, a metal element and a metalloid element may be collectively referred to as a "metal element" and a "metal element" in this specification and the like may refer to a metalloid element.

When the metal oxide is In-M-Zn oxide, the proportion of the number of In atoms is preferably greater than or equal to that of the number of element M atoms in the In-M-Zn oxide. Examples of the atomic ratio of the metal elements of such In-M-Zn oxide include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, and In:M:Zn=5:2:5 and a composition in the vicinity of any of the above atomic ratios. Note that the vicinity of the atomic ratio includes ±30% of an intended atomic ratio. By increasing the proportion of the number of In atoms in the metal oxide, the on-state current, field-effect mobility, or the like of the transistor can be improved.

The proportion of the number of In atoms may be less than that of the number of element M atoms in the In-M-Zn oxide. Examples of the atomic ratio of the metal elements of such In-M-Zn oxide include In:M:Zn=1:3:2, In:M:Zn=1:3:3, and In:M:Zn=1:3:4 and a composition in the vicinity of any of the above atomic ratios. By increasing the proportion of the number of element M atoms in the metal oxide, generation of oxygen vacancies can be inhibited.

For the semiconductor layer 21, for example, In—Zn oxide, In—Ga oxide, In—Sn oxide, In—Ti oxide, In—Ga—Al oxide, In—Ga—Sn oxide, In—Ga—Zn oxide, In—Sn—Zn oxide, In-A1-Zn oxide, In—Ti—Zn oxide, In—Ga—Sn—Zn oxide, or In—Ga—Al—Zn oxide can be used. Alternatively, Ga—Zn oxide may be used.

Note that the metal oxide may contain, instead of or in addition to In, one or more kinds selected from metal elements belonging to a period of a higher number in the periodic table. As the overlap between orbits of metal elements is larger, the metal oxide tends to have higher carrier conductivity. Thus, a transistor containing a metal element belonging to a period of a higher number in the periodic table can have high field-effect mobility in some cases. Examples of the metal element belonging to a period of a higher number in the periodic table include metal elements belonging to Period 5 and metal elements belonging to Period 6. Specific examples of the metal element include Y, Zr, Ag, Cd, Sn, Sb, Ba, Pb, Bi, La, Ce, Pr, Nd, Pm, Sm, and Eu. Note that La, Ce, Pr, Nd, Pm, Sm, and Eu are referred to as light rare earth elements.

The metal oxide may contain one or more kinds selected from nonmetallic elements. A transistor including the metal oxide containing a nonmetallic element can have high field-effect mobility in some cases. Examples of the nonmetallic element include carbon, nitrogen, phosphorus, sulfur, selenium, fluorine, chlorine, bromine, and hydrogen.

A sputtering method or an atomic layer deposition (ALD) method can be suitably used for forming the metal oxide. Note that in the case where the metal oxide is formed by a sputtering method, the atomic ratio of the deposited metal oxide may be different from the atomic ratio of a target. In particular, the zinc content of the deposited metal oxide may be reduced to approximately 50% of that of the target.

In this specification and the like, the content of a certain metal element in a metal oxide refers to the proportion of the number of atoms of the metal element to the total number of metal element atoms contained in the metal oxide. In the case where a metal oxide contains a metal element X, a metal element Y, and a metal element Z whose atomic numbers are respectively represented by $A_X$, $A_Y$, and $A_Z$, the content of the metal element X can be represented by $A_X/(A_X+A_Y+A_Z)$. Moreover, in the case where the atomic ratio of the metal element X to the metal element Y and the metal element Z contained in the metal oxide is represented by $B_X:B_Y:B_Z$, the content of the metal element X can be represented by $B_X/(B_X+B_Y+B_Z)$.

In the case of using a metal oxide containing In, for example, an increase in the In content enables a transistor to have a high on-state current.

When the semiconductor layer 21 includes a metal oxide not containing Ga or having a low Ga content, a transistor can have high reliability against positive bias application. That is, the transistor can show a small amount of change in the threshold voltage in the positive bias temperature stress (PBTS) test. In the case of using a metal oxide containing Ga, the Ga content is preferably lower than the In content. Accordingly, the transistor can have high mobility and high reliability.

Meanwhile, a transistor having a high Ga content can have high reliability against light. That is, the transistor can show a small amount of change in the threshold voltage of the transistor in the negative bias temperature illumination stress (NBTIS) test. Specifically, a metal oxide in which the proportion of the number of Ga atoms is greater than or equal to that of the number of In atoms has a wider band gap and can reduce the amount of change in the threshold voltage of the transistor in the NBTIS test.

Furthermore, a metal oxide having a high Zn content has high crystallinity, whereby diffusion of impurities in the metal oxide can be inhibited. Consequently, a change in electrical characteristics of the transistor is inhibited and the transistor can have high reliability.

The semiconductor layer 21 may have a stacked-layer structure including two or more metal oxide layers. The two or more metal oxide layers included in the semiconductor layer 21 may have the same composition or substantially the same compositions. Employing a stacked-layer structure of metal oxide layers having the same composition can reduce the manufacturing cost because the metal oxide layers can be formed using the same sputtering target. Note that a stacked-layer structure including two or more oxide semiconductor layers having different compositions may be employed. The use of an ALD method can form a metal oxide layer with a composition that continuously changes in the thickness direction. This increases the range of choices for design without need for use of a film with a predetermined composition, and can also prevent generation of an interface state or the like between two layers with different compositions; thus, the electrical characteristics and reliability can be improved.

It is preferable to use a metal oxide layer having crystallinity as the semiconductor layer 21. For example, a metal oxide layer having a c-axis aligned crystal (CAAC) structure, a polycrystalline structure, a nano-crystal (nc) structure, or the like can be used. By using a metal oxide layer having crystallinity as the semiconductor layer 21, the density of defect states in the semiconductor layer 21 can be reduced, which enables the semiconductor device to have high reliability.

As the crystallinity of the metal oxide layer used as the semiconductor layer 21 becomes higher, the density of defect states in the semiconductor layer 21 can be reduced. In contrast, with the use of a metal oxide layer having low crystallinity, a large amount of current can flow through a transistor.

A transistor including an oxide semiconductor (hereinafter referred to as an OS transistor) has much higher field-effect mobility than a transistor including amorphous silicon. In addition, the OS transistor has an extremely low leakage current between a source and a drain in an off state (the leakage current is hereinafter also referred to as an off-state current), and charge accumulated in a capacitor that is connected in series to the transistor can be retained for a long period. Furthermore, the power consumption of the semiconductor device can be reduced with the OS transistor.

The semiconductor device of one embodiment of the present invention can be used for a display device, for example. To increase the emission luminance of a light-emitting device included in a pixel circuit of a display device, it is necessary to increase the amount of current flowing through the light-emitting device. For this, it is necessary to increase the source—drain voltage of a driving transistor included in the pixel circuit. Since an OS transistor has a higher withstand voltage between the source and the drain than a transistor including silicon (hereinafter referred to as a Si transistor), a high voltage can be applied between the source and the drain of the OS transistor. Thus, with the use of an OS transistor as a driving transistor included in the pixel circuit, the amount of current flowing through the light-emitting device can be increased, resulting in an increase in emission luminance of the light-emitting device.

When transistors operate in a saturation region, a change in source—drain current relative to a change in gate—source voltage can be smaller in an OS transistor than in a Si transistor. Accordingly, when an OS transistor is used as the driving transistor included in the pixel circuit, the amount of current flowing through the light-emitting device can be precisely controlled. This can increase the gray level in the pixel circuit. Moreover, a stable current can flow through the light-emitting device even when the electrical characteristics (e.g., resistance) of the light-emitting device change or the electrical characteristics of the light-emitting devices vary.

As described above, with use of an OS transistor as a driving transistor included in the pixel circuit, it is possible to achieve "inhibition of black floating", "increase in emission luminance", "increase in gray level", "reduction in influence of variation in light-emitting devices", and the like.

A change in electrical characteristics of an OS transistor due to irradiation with radiation is small, i.e., the OS transistor has high resistance to radiation, and thus can be suitably used even in an environment where radiation can enter. It can also be said that the OS transistor has high reliability against radiation. For example, an OS transistor can be suitably used for a pixel circuit of an X-ray flat panel detector. Moreover, an OS transistor can be suitably used for a semiconductor device used in space. Examples of radiation include electromagnetic radiation (e.g., X-rays and gamma rays) and particle radiation (e.g., alpha rays, beta rays, a proton beam, and a neutron beam).

Note that a semiconductor material that can be used for the semiconductor layer 21 is not limited to an oxide semiconductor. For example, a single-element semiconductor or a compound semiconductor can be used. Examples of the single-element semiconductor include silicon (such as single crystal silicon, polycrystalline silicon, microcrystalline silicon, and amorphous silicon) and germanium. Examples of the compound semiconductor include gallium arsenide and silicon germanium. Examples of the compound semiconductor include an organic semiconductor, a nitride semiconductor, and an oxide semiconductor. These semiconductor materials may contain impurities as dopants.

Alternatively, the semiconductor layer 21 may include a layered material functioning as a semiconductor. The layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

There is no particular limitation on the crystallinity of a semiconductor material used for the semiconductor layer 21, and any of an amorphous semiconductor, a single crystal semiconductor, and a semiconductor having other crystallinity than single crystal (a polycrystalline semiconductor, a microcrystalline semiconductor, or a semiconductor partly including crystal regions) may be used. It is preferable to use a semiconductor having crystallinity, in which case deterioration of the transistor characteristics can be inhibited.

<Gate Insulating Layer>

The insulating layer 22 functions as a gate insulating layer of the transistor as well as a dielectric layer of the capacitor. In the case where the semiconductor layer 21 is formed using an oxide semiconductor, an oxide insulating film is preferably used for at least a part of the insulating layer 22 that is in contact with the semiconductor layer 21. For example, one or more of silicon oxide, silicon oxynitride, aluminum oxide, aluminum oxynitride, hafnium oxide, hafnium oxynitride, gallium oxide, gallium oxynitride, yttrium oxide, yttrium oxynitride, and Ga—Zn oxide can be used. In addition, as the insulating layer 22, a nitride insulating film of silicon nitride, silicon nitride oxide, aluminum nitride, or aluminum nitride oxide can also be used. The insulating layer 22 may have a stacked-layer structure, e.g., a stacked-layer structure including at least one oxide insulating film and at least one nitride insulating film.

Note that in this specification and the like, oxynitride refers to a material that contains more oxygen than nitrogen. Nitride oxide refers to a material that contains more nitrogen than oxygen.

The insulating layer 22 preferably has a stacked-layer structure using an insulating material that includes a high-k material. A stacked-layer structure including a high dielectric constant (high-k) material and a material having higher dielectric strength than the high-k material is preferably used. For example, as the insulating layer 22, an insulating film (also referred to as ZAZ) in which zirconium oxide, aluminum oxide, and zirconium oxide are stacked in this order can be used. An insulating film (also referred to as ZAZA) in which zirconium oxide, aluminum oxide, zirconium oxide, and aluminum oxide are stacked in this order can be used, for example. For another example, an insulating film in which hafnium zirconium oxide, aluminum oxide, hafnium zirconium oxide, and aluminum oxide are stacked in this order can be used. The stacking of such an insulator having relatively high dielectric strength, such as aluminum oxide, can increase the dielectric strength and inhibit electrostatic breakdown of the capacitor.

Alternatively, a material that exhibits ferroelectricity may be used for the insulating layer 22. Examples of the material that exhibits ferroelectricity include metal oxides such as hafnium oxide, zirconium oxide, and $HfZrO_X$ (X is a real number greater than 0).

<Conductive Layer>

The top surfaces of the conductive layers 24 and 25 are in contact with the semiconductor layer 21. Here, when the semiconductor layer 21 is formed using an oxide semiconductor and the conductive layer 24 or the conductive layer 25 is formed using, for example, a metal that is likely to be oxidized such as aluminum, an insulating oxide (e.g., aluminum oxide) is formed between the conductive layer 24 or 25 and the semiconductor layer 21, which might inhibit electrical continuity between the conductive layer and the semiconductor layer. Therefore, the conductive layers 24 and 25 are preferably formed using a conductive material that is less likely to be oxidized, a conductive material that maintains low electric resistance even when oxidized, or an oxide conductive material.

The conductive layers 24 and 25 are preferably formed using, for example, tantalum nitride, titanium nitride, a nitride containing titanium and aluminum, a nitride containing tantalum and aluminum, ruthenium, ruthenium oxide, ruthenium nitride, an oxide containing strontium and ruthenium, or an oxide containing lanthanum and nickel. These materials are preferable because they are conductive materials that are less likely to be oxidized or materials that maintain the conductivity even when oxidized.

It is also possible to use a conductive oxide such as indium oxide, zinc oxide, In—Sn oxide, In—Zn oxide, In—W oxide, In—W—Zn oxide, In—Ti oxide, In—Ti—Sn oxide, In—Sn oxide, In—Sn—Si oxide, or Ga—Zn oxide. A conductive oxide containing indium is particularly preferable because of its high conductivity.

The conductive layer 23 functions as a gate electrode and can be formed using a variety of conductive materials. The conductive layer 23 can be formed using, for example, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; or an alloy containing any of the above metal elements. It is also possible to use a nitride or an oxide of any of the above metals or the alloy. For example, tantalum nitride, titanium nitride, tungsten, a nitride containing titanium and aluminum, a nitride containing tantalum and aluminum, ruthenium oxide, ruthenium nitride, an oxide containing strontium and ruthenium, or an oxide containing lanthanum and nickel is preferably used. Alternatively, a semiconductor having high electric conductivity, typified by polycrystalline silicon containing an impurity element such as phosphorus, or silicide such as nickel silicide may be used.

For the conductive layer 23, the nitride and the oxide that can be used for the conductive layers 24 and 25 may be used.

The conductive layers 31 and 32 serve as wirings and thus can be formed using a low-resistance conductive material. The resistance of the conductive layer 51 is also preferably as low as possible. The conductive layers 31, 32, and 51 can be formed using any of the above conductive materials that can be used for the conductive layer 23.

<Insulating Layer>

The insulating layer 41 (or the insulating layer 41b) includes a part that is in contact with the semiconductor layer 21. In the case where the semiconductor layer 21 is formed using an oxide semiconductor, an oxide is preferably used for at least the part of the insulating layer 41 that is in contact with the semiconductor layer 21 in order to improve the properties of the interface between the semiconductor layer 21 and the insulating layer 41. For example, silicon oxide or silicon oxynitride can be suitably used.

As the insulating layer 41, a film from which oxygen is released by heating is further preferably used. Accordingly, oxygen is supplied to the semiconductor layer 21 owing to heat applied during the manufacturing process of the transistor 10, so that the amount of oxygen vacancy in the semiconductor layer 21 can be reduced and reliability can be improved. Examples of a method for supplying oxygen to the insulating layer 41 include heat treatment in an oxygen atmosphere and plasma treatment in an oxygen atmosphere. Alternatively, an oxide film may be deposited over the top surface of the insulating layer 41 by a sputtering method in an oxygen atmosphere to supply oxygen. After that, the oxide film may be removed.

The insulating layer 41 is preferably formed by a deposition method such as a sputtering method or a plasma CVD method. In particular, by a sputtering method using a deposition gas not containing a hydrogen gas, a film having an extremely low hydrogen content can be formed. Therefore, supply of hydrogen to the semiconductor layer 21 is inhibited and the electrical characteristics of the transistor 10 can be stabilized.

As the insulating layers 41a and 41c, films in which oxygen is less likely to be diffused are preferably used. Accordingly, it is possible to prevent oxygen contained in the insulating layer 41b from being diffused toward the insulating layer 11 side and the insulating layer 22 side through the insulating layer 41a and the insulating layer 41c, respectively, due to heating. In other words, when the insulating layer 41b is interposed between the insulating layers 41a and 41c in which oxygen is less likely to be diffused, oxygen can be enclosed in the insulating layer 41b. Accordingly, oxygen can be effectively supplied to the semiconductor layer 21.

For the insulating layers 41a and 41c, for example, one or more of silicon nitride, silicon nitride oxide, silicon oxynitride, aluminum oxide, aluminum oxynitride, aluminum nitride, hafnium oxide, and hafnium aluminate can be used. Silicon nitride and silicon nitride oxide are particularly suitable for the insulating layers 41a and 41c because they release fewer impurities (e.g., water and hydrogen) and are less likely to transmit oxygen and hydrogen.

Modification Example

A structure example partly different from the above structure examples will be described below. Note that portions similar to those described above are not described in some cases.

Modification Example 1

FIGS. 5A1 and 5A2 are cross-sectional views of a transistor 10a, and FIGS. 5B1 and 5B2 are cross-sectional views of a capacitor 50a. The transistor 10a and the capacitor 50a can be separately formed in the same process. The transistor 10a and the capacitor 50a are different from the transistor 10 and the capacitor 50 mainly in the structure of the conductive layer 23.

In the transistor 10a and the capacitor 50a, the conductive layer 23 is formed into an island shape and serves as a gate electrode. In FIG. 2A2 and the like, the conductive layer 23 is provided so as to fill the depression of the insulating layer 22; in the transistor 10a and the capacitor 50a, the conductive layer 23 is provided along the top surface of the insulating layer 22.

A conductive layer 33 serving as a gate wiring is provided over the conductive layer 23. The conductive layer 33 is embedded in the insulating layer 43 and in contact with the top surface of the conductive layer 23.

The conductive layer 33 and the insulating layer 22 may be in contact with each other by omitting the conductive layer 23; in that case, a part of the conductive layer 33 serves as a gate electrode. In contrast, when the conductive layer 23 is provided, the insulating layer 43 and the conductive layer 33 can be formed while the conductive layer 23 covers the surface of the insulating layer 22 serving as a gate insulating layer, which can inhibit generation of defect states between the gate insulating layer and the gate electrode and improve the reliability.

Modification Example 2

Figure 6A:
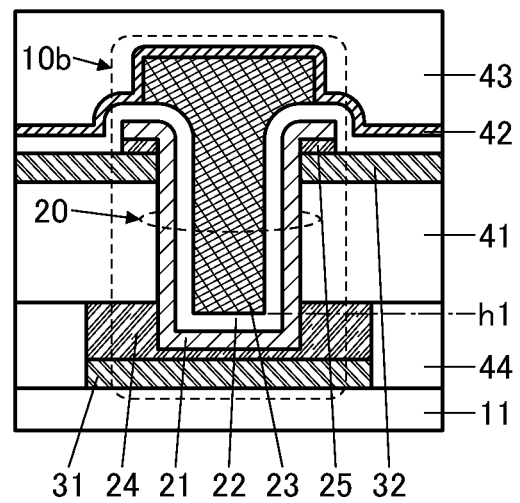
FIGS. 6A to 6D each illustrate a structure example of a semiconductor device.
Figure 6B:
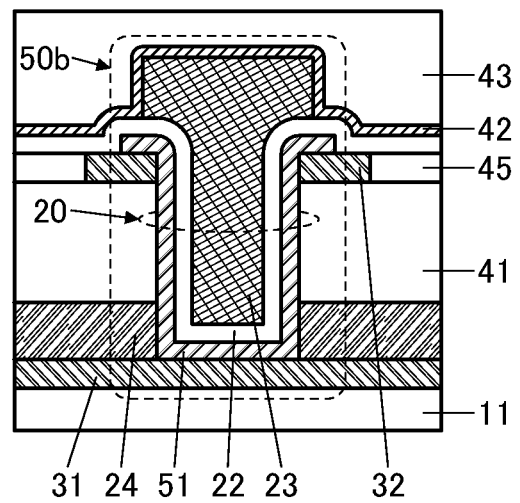

FIG. 6A is a cross-sectional view of a transistor 10b, and FIG. 6B is a cross-sectional view of a capacitor 50b. The transistor 10b and the capacitor 50b can be separately formed in the same process. The transistor 10b and the capacitor 50b are different from the transistor 10 and the capacitor 50 mainly in the structure of the conductive layer 24.

In the transistor 10b, the conductive layer 24 has a depression in a region overlapping with the opening 20. In that case, the level of the lower end of the conductive layer 23 (a level h1) is preferably lower than the level of the top surface of the conductive layer 24.

In the transistor 10b, a part of the semiconductor layer 21 that is in contact with the conductive layer 24 has a lower resistance than a channel-formation region. Thus, the level h1 lower than the level of the top surface of the conductive layer 24 enables a gate electric field to be uniformly applied to the whole channel formation region of the semiconductor layer 21, thereby preventing formation of a high-resistance region (offset region) due to a poor gate electric field in the semiconductor layer 21. As a result, the on-state current of the transistor can be increased. To achieve such a structure, for example, the thickness of the conductive layer 24 is preferably greater than at least the total thicknesses of the semiconductor layer 21 and the insulating layer 22.

In the capacitor 50b, an increase in the thickness of the conductive layer 24 increases the contact area between the conductive layers 51 and 24, which produces another effect such as a reduction in the contact resistance between the conductive layers 51 and 24.

Modification Example 3

Figure 6C:
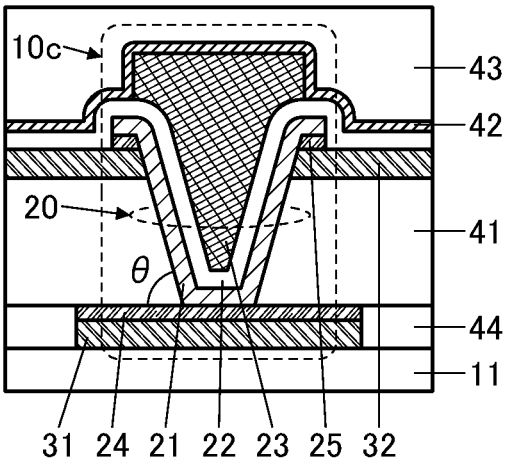
Figure 6D:
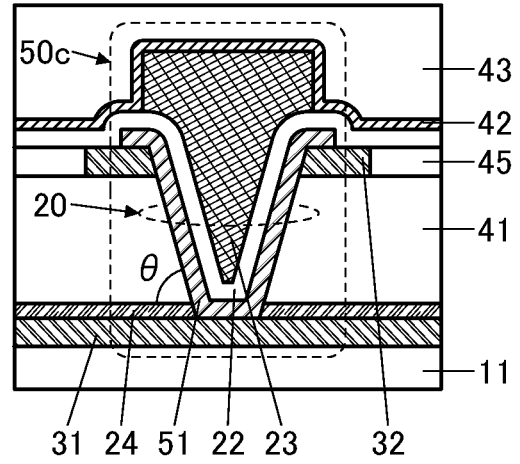

FIGS. 6C and 6D show an example in which the sidewall of the opening 20 has a tapered shape. FIG. 6C is a cross-sectional view of a transistor 10c and FIG. 6D is a cross-sectional view of a capacitor 50c. In FIGS. 6C and 6D, the opening 20 in the transistor 10c and the opening 20 in the capacitor 50c each have a larger diameter (opening diameter) at an upper end than at a lower end.

The tapered shape of the sidewall of the opening 20 improves the coverage with the semiconductor layer 21, the conductive layer 51, or the like, so that generation of defects such a low-density region in the film can be inhibited even when a deposition method such as a sputtering method is used. The angle $\theta$ can be, for example, greater than or equal to 45° and less than or equal to 90°, greater than or equal to 60° and less than 90°, or greater than or equal to 70° and less than 90°. Note that the angle $\theta$ may be greater than 90° when a deposition method achieving an extremely high coverage, such as an ALD method, is used.

In the case where the sidewall of the opening 20 has a tapered shape, the diameter of the opening 20, which corresponds to the channel width of the transistor 10c, increases from the conductive layer 24 side toward the conductive layer 25 side. The amount of current flowing through the transistor 10c at this time is limited to that of the part with the minimum diameter. Hence, the channel width of the transistor 10c can be regarded as the circumference of the opening 20 with the minimum diameter. Thus, when the sidewall of the opening 20 has a tapered shape, a transistor with a channel width smaller than the diameter of the upper end of the opening 20 can be fabricated.

In the capacitor 50c, electrostatic capacitance is reduced when the sidewall of the opening 20 has a tapered shape as compared with the case where the sidewall of the opening 20 has a cylindrical shape. The electrostatic capacitance can be increased by using a high dielectric constant material for the insulating layer 22, reducing the thickness of the insulating layer 22, or increasing the thickness of the insulating layer 41, for example.

The above is the description of the modification examples.

Manufacturing Method Example

Next, a method for manufacturing the semiconductor device of one embodiment of the present invention is described. Described below is an example in which the transistor and the capacitor are separately formed over the same plane.

Figure 8A:
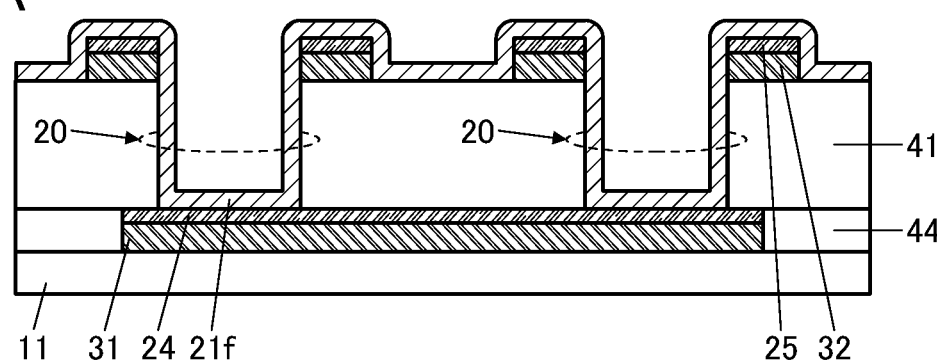
FIGS. 8A to 8D illustrate the manufacturing method example of a semiconductor device.
Figure 8B:
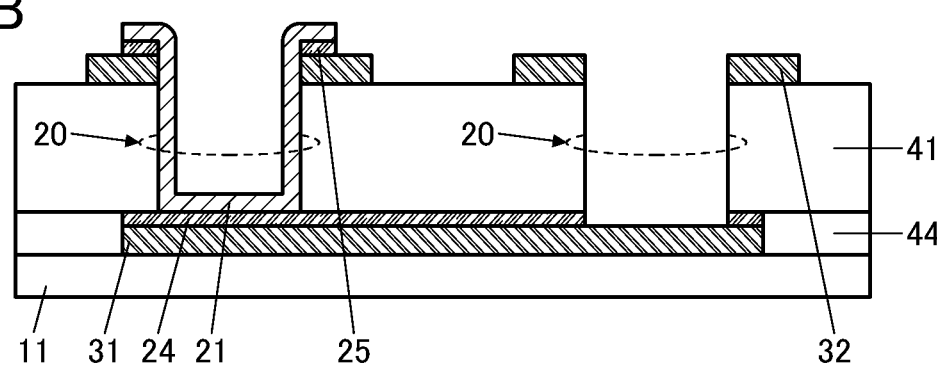
Figure 8C:
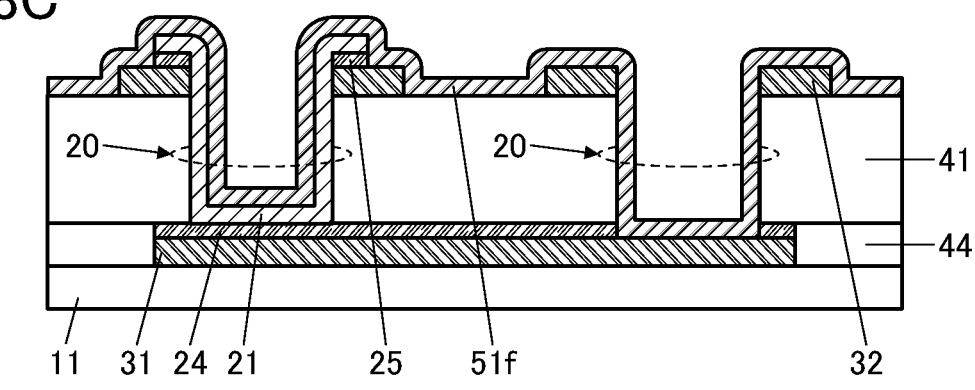
Figure 8D:
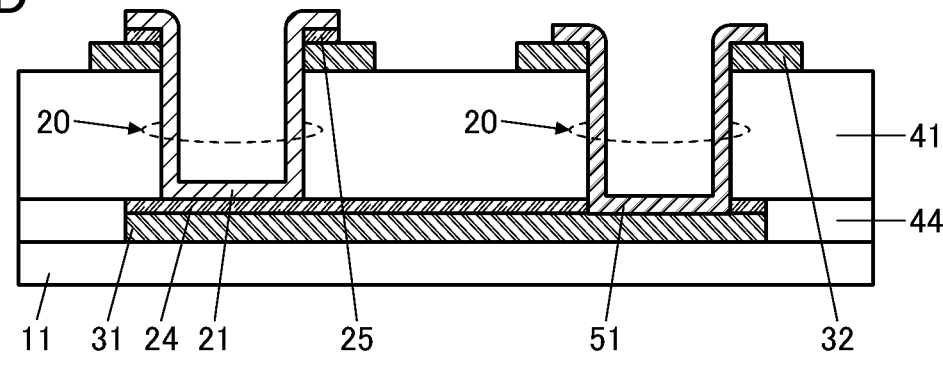
Figure 9A:
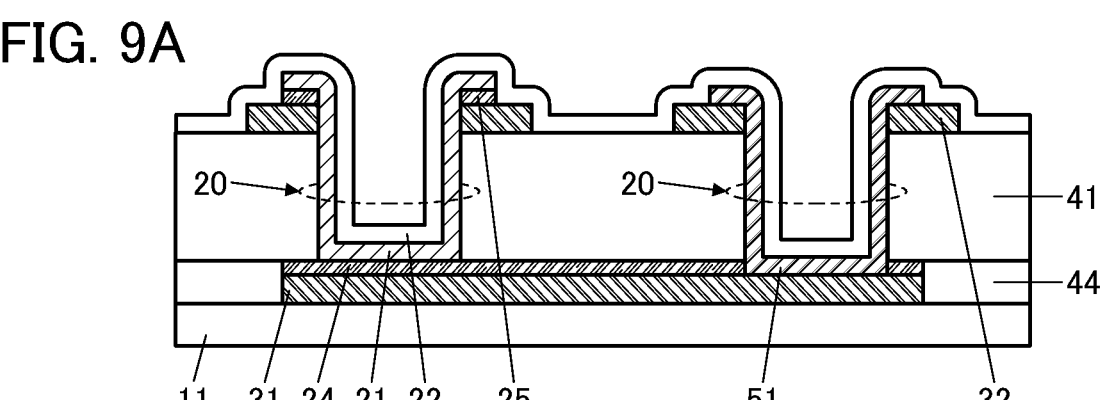
FIGS. 9A to 9C illustrate the manufacturing method example of a semiconductor device.
Figure 9B:
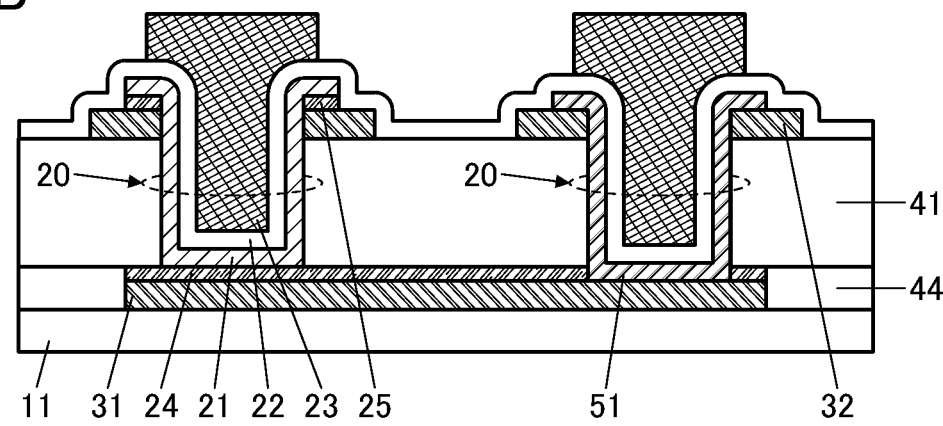
Figure 9C:
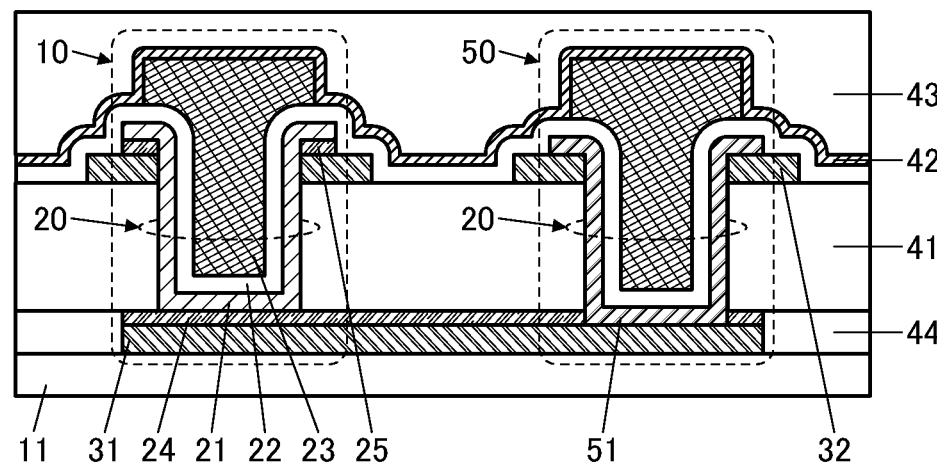

FIGS. 7A to 9C are cross-sectional schematic views of steps in the manufacturing method of the semiconductor device described below as an example. In each drawing, the transistor 10 and the capacitor 50 are shown on the left side and the right side, respectively. Described here is an example in which the conductive layer 31 is shared by the transistor 10 and the capacitor 50 as illustrated in FIG. 9C.

In the following steps, an insulating material for forming an insulator, a conductive material for forming a conductor, and a semiconductor material for forming a semiconductor can be deposited as appropriate by a sputtering method, a CVD method, an MBE method, a PLD method, an ALD method, or the like.

Examples of the sputtering method include an RF sputtering method in which a high-frequency power source is used for a sputtering power source, a DC sputtering method in which a DC power source is used, and a pulsed DC sputtering method in which a voltage is applied to an electrode while being changed in a pulsed manner. The RF sputtering method is mainly used in the case where an insulating film is formed, and the DC sputtering method is mainly used in the case where a metal conductive film is formed. The pulsed DC sputtering method is mainly used in the case where a compound such as an oxide, a nitride, or a carbide is deposited by a reactive sputtering method.

Note that CVD methods can be classified into a plasma enhanced CVD (PECVD) method using plasma, a thermal CVD (TCVD) method using heat, a photo CVD method using light, and the like. Moreover, CVD methods can be classified into a metal CVD (MCVD) method and a metal organic CVD (MOCVD) method according to a source gas.

A high-quality film can be obtained at a relatively low temperature through a PECVD method. A thermal CVD method does not use plasma and thus causes less plasma damage to an object. A wiring, an electrode, an element (e.g., a transistor or a capacitor), or the like included in a semiconductor device might be charged up by receiving charges from plasma, for example. In that case, accumulated charges might break the wiring, electrode, element, or the like included in the semiconductor device. By contrast, such plasma damage is not caused and the yield of semiconductor devices can be increased with the thermal CVD method which does not use plasma. A thermal CVD method yields a film with few defects because of no plasma damage during deposition.

As the ALD method, a thermal ALD method, in which a precursor and a reactant react with each other only by a thermal energy, a PEALD method, in which a reactant excited by plasma is used, or the like can be used.

Unlike a sputtering method, a CVD method and an ALD method are less likely to be influenced by the shape of an object to be processed and thus enable favorable step coverage. In particular, an ALD method can provide excellent step coverage and excellent thickness uniformity and thus can be suitably used for covering a surface of an opening portion with a high aspect ratio, for example. An ALD method has a relatively low deposition rate; thus, it is sometimes preferable to combine an ALD method with another deposition method with a high deposition rate such as a CVD method.

By a CVD method, a film with a certain composition can be deposited by adjusting the flow rate ratio of the source gases. For example, when the flow rate ratio of the source gases is changed during the deposition in a CVD method, a film whose composition is continuously changed can be deposited. In the case where a film is formed while the flow rate ratio of the source gases is changed, as compared with the case where a film is formed using a plurality of deposition chambers, the time taken for the deposition can be shortened because the time taken for transfer or pressure adjustment is omitted. Hence, the productivity of the semiconductor device can be improved in some cases.

An ALD method, with which a plurality of different kinds of precursors are introduced at a time, enables formation of a film with a certain composition. In the case where a plurality of different kinds of precursors are introduced, the cycle number of precursor deposition is controlled, whereby a film with a certain composition can be formed. Furthermore, a film whose composition is continuously changed can be formed as in the CVD method.

First, a substrate (not illustrated) is prepared, and the insulating layer 11 is formed over the substrate. An inorganic insulating film such as a silicon oxide film or a silicon oxynitride film can be used as the insulating layer 11. The insulating layer 11 can be formed by a sputtering method, a CVD method, an MBE method, a PLD method, an ALD method, or the like. In the case where the formation surface of the insulating layer 11 is not flat, planarization treatment is preferably performed after the deposition of the insulating layer 11 so that the insulating layer 11 has a flat top surface.

Figure 7A:
FIGS. 7A to 7D illustrate a manufacturing method example of a semiconductor device.

Then, a stacked film of a conductive film to be the conductive layer 31 and a conductive film to be the conductive layer 24 is formed over the insulating layer 11. After that, a resist mask is formed over the stacked film by a photolithography method or the like, a part of the stacked film that is not covered with the resist mask is removed by etching, and then, the resist mask is removed. As a result, the conductive layers 31 and 24 can be formed. Next, an insulating film to be the insulating layer 44 is formed and a part thereof that overlaps with the conductive layer 24 is removed, whereby the insulating layer 44 and the conductive layers 31 and 24 embedded in the insulating layer 44 can be formed (FIG. 7A). The insulating film to be the insulating layer 44 is preferably processed by a chemical mechanical polishing (CMP) method; for example, the insulating layer 44 illustrated in FIG. 7A can be formed by processing the insulating film until the top surface of the conductive layer 24 is exposed.

Figure 7B:

Then, the insulating layer 41, a conductive film 32f, and a conductive film 25f are formed over the conductive layer 24 and the insulating layer 44 (FIG. 7B).

The insulating layer 41 may be deposited as appropriate by a sputtering method, a CVD method, an MBE method, a PLD method, an ALD method, or the like. For example, a silicon oxide film may be deposited as the insulating layer 41 by a sputtering method.

The top surface of the insulating layer 41 can be made flat by performing planarization treatment such that the insulating layer 44 and the conductive layer 24 are level with each other. Note that the insulating layer 44 is not necessarily provided and the insulating layer 41 may be provided to cover the conductive layer 24; in that case, the top surface of the insulating layer 41 is preferably subjected to CMP treatment so as to have a flat surface.

Here, the thickness of the insulating layer 41 corresponds to the channel length of the transistor; thus, it is important to prevent a variation in the thickness of the insulating layer 41.

When the insulating layer 41 is deposited by a sputtering method in an oxygen-containing atmosphere, the insulating layer 41 containing a large amount of oxygen can be formed. Since a molecule containing hydrogen is not used as a deposition gas in the sputtering method, the concentration of hydrogen in the insulating layer 41 can be reduced. When the insulating layer 41 is deposited in this manner, oxygen can be supplied to the channel formation region of the semiconductor layer 21 from the insulating layer 41, so that oxygen vacancies can be reduced.

The conductive film 32f can be formed using a material and a method similar to those for the conductive film to be the conductive layer 31. The conductive film 25f can be formed using a material and a method similar to those for the conductive film to be the conductive layer 24.

Figure 7C:
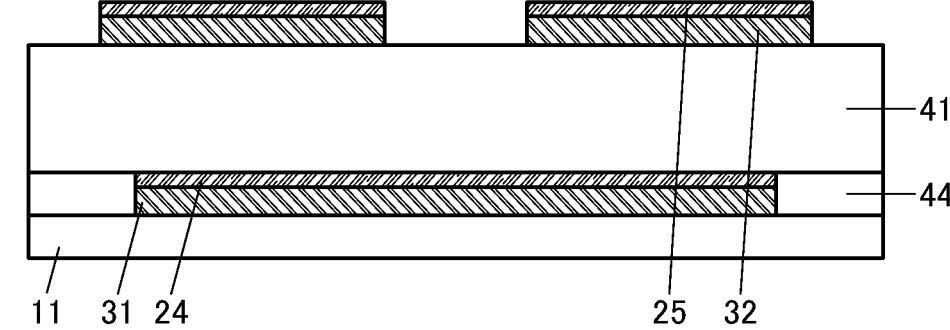

Then, parts of the conductive films 25f and 32f are removed by etching, whereby the conductive layers 25 and 32 are formed (FIG. 7C).

Figure 7D:
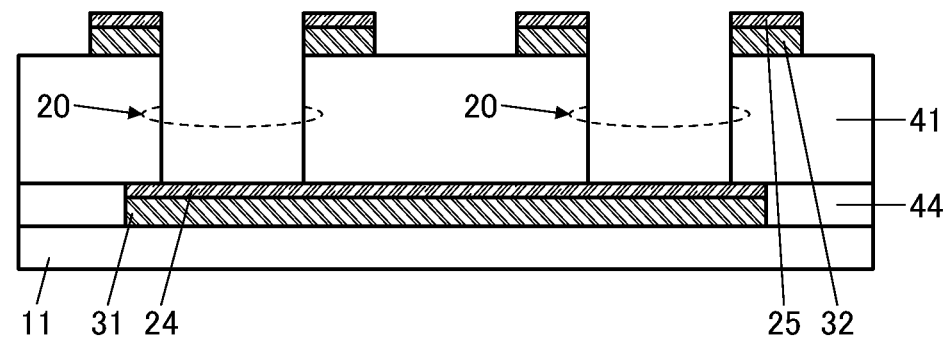

After that, the openings 20 reaching the conductive layer 24 are formed in the conductive layers 25 and 32 and the insulating layer 41 (FIG. 7D).

The sidewall of the opening 20 is preferably perpendicular to the top surface of the conductive layer 24. This structure can reduce the area occupied by the transistor and the capacitor. The sidewall of the opening 20 may have a tapered shape. The tapered shape improves the coverage with a film formed in the opening 20.

The maximum width of the opening 20 (the maximum diameter in the case where the opening 20 is circular in the plan view) is preferably as small as possible. For example, the maximum width of the opening 20 is preferably less than or equal to 60 nm, less than or equal to 50 nm, less than or equal to 40 nm, less than or equal to 30 nm, or less than or equal to 20 nm and greater than or equal to 5 nm. In order to process the opening 20 such finely, an electron beam or short-wavelength light such as EUV light is preferably used for the lithography method.

Since the opening 20 has a high aspect ratio, anisotropic etching is preferably used for the formation of the opening 20. It is particularly preferable to use a dry etching method because it is suitable for microfabrication. The conductive layers 25 and 32 and the insulating layer 41 may be etched under different processing conditions. The sidewall angle of the opening 20 may be different in the conductive layers 25 and 32 and the insulating layer 41.

When the insulating layer 41 is etched, the top surface of the conductive layer 24 is partly etched to reduce the thickness of the conductive layer 24 at the bottom of the opening 20 in some cases. Alternatively, the thickness of the conductive layer 24 can be reduced by partly etching the top surface of the conductive layer 24 after the formation of the opening 20.

Next, heat treatment may be performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under a reduced pressure. Alternatively, the heat treatment may be performed in such a manner that heat treatment is performed in an atmosphere of a nitrogen gas or an inert gas, and then another heat treatment is performed in an atmosphere containing an oxidizing gas at 10 ppm or more, 1% or more, or 10% or more in order to compensate for released oxygen. By the above-described heat treatment, impurities such as water contained in the insulating layer 41, for example, can be reduced before an oxide semiconductor film to be the semiconductor layer is deposited.

The gas used in the above-described heat treatment is preferably highly purified. For example, the amount of moisture contained in the gas used in the above-described heat treatment is 1 ppb or less, preferably 0.1 ppb or less, and further preferably 0.05 ppb or less. The heat treatment using a highly purified gas can, for example, prevent the entry of moisture into the insulating layer 41 as much as possible.

Then, a semiconductor film 21f is deposited to cover the insulating layer 41, the conductive layer 25, the opening 20, and the like (FIG. 8A).

An oxide semiconductor film can be used as the semiconductor film 21f. The oxide semiconductor film may be deposited as appropriate by a sputtering method, a CVD method, an MBE method, a PLD method, an ALD method, or the like. Here, the oxide semiconductor film is preferably formed in contact with the bottom and sidewall of the opening 20 with a high aspect ratio. Thus, the oxide semiconductor film is preferably formed by a deposition method with favorable coverage, and is further preferably formed by a CVD method, an ALD method, or the like. For example, an In—Ga—Zn oxide is deposited by an ALD method as the oxide semiconductor film. In the case where the opening 20 has a tapered shape, the oxide semiconductor film can be deposited by a sputtering method.

During or after the deposition of the oxide semiconductor film, microwave treatment is preferably performed in an oxygen-containing atmosphere so that the impurity concentration in the oxide semiconductor film can be reduced. Examples of the impurity especially include hydrogen and carbon. The microwave treatment can increase the crystallinity of the oxide semiconductor film in some cases. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. Oxygen acting in the oxide semiconductor has a variety of forms such as an oxygen atom, an oxygen molecule, an oxygen ion, and an oxygen radical (also referred to as O radical which is an atom, a molecule or an ion having an unpaired electron). The oxygen acting in the oxide semiconductor preferably has one or more of the above forms; an oxygen radical is particularly preferable.

The aforementioned microwave treatment in an oxygen-containing atmosphere is preferably performed while the substrate is heated, in which case the impurity concentration in the oxide semiconductor film can be further reduced. The substrate may be heated at a temperature higher than or equal to 100° C. and lower than or equal to 650° C., preferably higher than or equal to 200° C. and lower than or equal to 600° C., and further preferably higher than or equal to 300° C. and lower than or equal to 450° C.

When the microwave treatment in an oxygen-containing atmosphere is performed while the substrate is heated, the carbon concentration in the oxide semiconductor film, which is measured by SIMS, can be lower than $1 \times 10^{20}$ atoms/cm$^3$, preferably lower than $1 \times 10^{19}$ atoms/cm$^3$, further preferably lower than $1 \times 10^{18}$ atoms/cm$^3$.

Although the microwave treatment in an oxygen-containing atmosphere is performed on the oxide semiconductor film in the above example, one embodiment of the present invention is not limited thereto. For example, the microwave treatment in an oxygen-containing atmosphere may be performed on an insulating film, more specifically a silicon oxide film, which is positioned in the vicinity of the oxide semiconductor film. This can release hydrogen contained in the silicon oxide film to the outside as $H_2O$. Release of hydrogen from the silicon oxide film positioned in the vicinity of the oxide semiconductor film offers a highly reliable semiconductor device.

In the case where the semiconductor layer 21 has a stacked-layer structure, the layers may be deposited by the same method or different methods from each other. For example, in the case where the semiconductor layer 21 has a stacked-layer structure of two layers, the lower oxide semiconductor film may be deposited by a sputtering method and the upper oxide semiconductor film may be deposited by an ALD method. An oxide semiconductor film deposited by a sputtering method is likely to have crystallinity. Thus, when an oxide semiconductor film having crystallinity is provided as the lower oxide semiconductor film, the crystallinity of the upper oxide semiconductor film can be increased. Even when a pin hole, disconnection, or the like is formed in the lower oxide semiconductor film deposited by a sputtering method, the upper oxide semiconductor film deposited by an ALD method with favorable coverage can fill the portion.

Here, the oxide semiconductor film is preferably formed in contact with the top surface of the conductive layer 24 in the opening 20, the side surface of the insulating layer 41 in the opening 20, and the side surface and the top surface of the conductive layer over the insulating layer 41.

Next, heat treatment is preferably performed. The heat treatment may be performed at a temperature higher than or equal to 250° C. and lower than or equal to 650° C., preferably higher than or equal to 400° C. and lower than or equal to 600° C. so that the above-described oxide semiconductor film does not become polycrystals. The heat treatment is performed in a nitrogen gas atmosphere, an inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas is preferably approximately 20%. The heat treatment may be performed under a reduced pressure. Alternatively, the heat treatment may be performed in such a manner that heat treatment is performed in an atmosphere of a nitrogen gas or an inert gas, and then another heat treatment is performed in an atmosphere containing an oxidizing gas at 10 ppm or more, 1% or more, or 10% or more in order to compensate for released oxygen.

The gas used in the above-described heat treatment is preferably highly purified. For example, the amount of moisture contained in the gas used in the above-described heat treatment is 1 ppb or less, preferably 0.1 ppb or less, and further preferably 0.05 ppb or less. The heat treatment using a highly purified gas can, for example, prevent the entry of moisture into the oxide semiconductor film as much as possible.

Here, the above-described heat treatment is preferably performed in the state where the semiconductor film 21$f$ is in contact with the insulating layer 41 containing a large amount of oxygen. In that case, oxygen is supplied from the insulating layer 41 to the portion of the semiconductor film 21$f$ that is to be the channel formation region, whereby oxygen vacancies can be reduced.

Although the heat treatment is performed after the deposition of the oxide semiconductor film in the above description, the present invention is not limited thereto. Heat treatment may be further performed in a later step.

Then, a part of the semiconductor film 21$f$ is removed by etching to form the semiconductor layer 21 (FIG. 8B). The conductive layer 25 is also removed at the time of etching the semiconductor film 21$f$, so that only a part of the conductive layer 25 that is covered with the semiconductor layer 21 remains and the other part that is not covered with the semiconductor layer 21 is removed. As illustrated in the right of FIG. 8B, in the region to be the capacitor 50, the conductive layer 24 positioned at the bottom of the opening 20 is also preferably removed by the etching. In this manner, the conductive layers 25 and 24 are etched in the etching step of the semiconductor film 21$f$, whereby the conductive layer 51 formed later can be in direct contact with the conductive layers 32 and 31.

Subsequently, a conductive film 51$f$ to be the conductive layer 51 is deposited to cover the insulating layer 41, the conductive layer 32, the semiconductor layer 21, the opening 20 in the region to be the capacitor 50, and the like (FIG. 8C).

Then, an unnecessary part of the conductive film 51$f$ is removed by etching, whereby the conductive layer 51 is formed (see FIG. 8D). The conductive film 51$f$ is preferably etched under conditions where the conductive layer 32 is not etched or is unlikely to be etched. For easy etching, different conductive materials may be used for the conductive layer 32 and the conductive layer 51 (the conductive film 51$f$). In the case where the etching selectivity is not sufficiently high, the thickness of the conductive film 32$f$ to be the conductive layer 32 is preferably set in advance large enough to prevent the conductive film 51$f$ from disappearing due to etching.

After that, the insulating layer 22 is formed to cover the insulating layer 41, the conductive layer 32, the semiconductor layer 21, the conductive layer 51, and the like (FIG. 9A). The insulating layer 22 may be deposited as appropriate by a sputtering method, a CVD method, an MBE method, a PLD method, an ALD method, or the like. Since the insulating layer 22 is formed in contact with the semiconductor layer 21 and the conductive layer 51 provided in the opening 20 with a high aspect ratio, the insulating layer 22 is preferably formed by a deposition method with favorable coverage, and is further preferably formed by a CVD method, an ALD method, or the like. For example, silicon oxide may be deposited as the insulating layer 22 by an ALD method. In the case where the opening 20 has a sidewall with a tapered shape, the insulating layer 22 can be deposited by a sputtering method.

Next, a conductive film to be the conductive layer 23 is formed so as to fill the depression of the opening 20, and an unnecessary part of the conductive film is removed by etching, whereby the conductive layer 23 is formed (see FIG. 9B). The conductive film is preferably formed by a deposition method with favorable coverage or embeddability, and is further preferably formed by a CVD method, an ALD method, or the like. In the case where the opening 20 has a sidewall with a tapered shape, the conductive film can be deposited by a sputtering method.

Through the above steps, the transistor 10 and the capacitor 50 can be formed separately over the insulating layer 11. When the manufacturing steps are shared in the above manner, a multifunctional semiconductor device can be achieved at a low cost.

Then, the insulating layer 42 and the insulating layer 43 are formed in this order (FIG. 9C). The insulating layer 42 and the insulating layer 43 can be formed by a sputtering method, a CVD method, an MBE method, a PLD method, an ALD method, or the like.

The above is the description of the modification examples.

Application Example

A structure of a memory device including a transistor and a capacitor is described below.

Figure 10A:
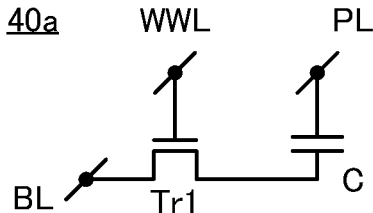
FIGS. 10A to 10C illustrate a structure example of a memory device.

FIG. 10A is a circuit diagram of a memory cell 40a. The memory cell 40a includes one transistor Tr1 and one capacitor C and is also referred to as 1Tr1C. A gate of the transistor Tr1 is connected to a wiring WWL, one of a source and a drain of the transistor Tr1 is connected to a wiring BL, and the other of the source and the drain of the transistor Tr1 is connected to one electrode of the capacitor C. The other electrode of the capacitor C is connected to a wiring PL.

Figure 10B:
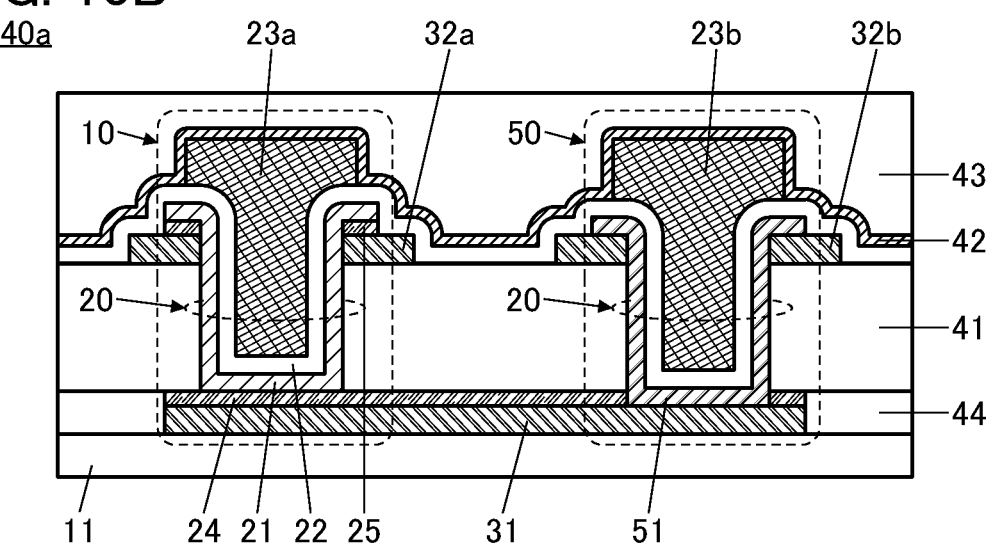

FIG. 10B is a cross-sectional view of the memory cell 40a. The transistor 10 corresponds to the transistor Tr1 and the capacitor 50 corresponds to the capacitor C.

The conductive layers formed using the same film are denoted above by the same reference numeral in the transistor 10 and the capacitor 50; in the following description, different reference numerals are used in some cases in order to distinguish electrically isolated conductive layers.

In FIG. 10B, the transistor 10 includes a conductive layer 32a and a conductive layer 23a, and the capacitor 50 includes a conductive layer 32b and a conductive layer 23b. The conductive layer 31 is shared by the transistor 10 and the capacitor 50. The conductive layer 23a, the conductive layer 32a, and the conductive layer 23b correspond to the wiring WWL, the wiring BL, and the wiring PL, respectively.

Figure 10C:
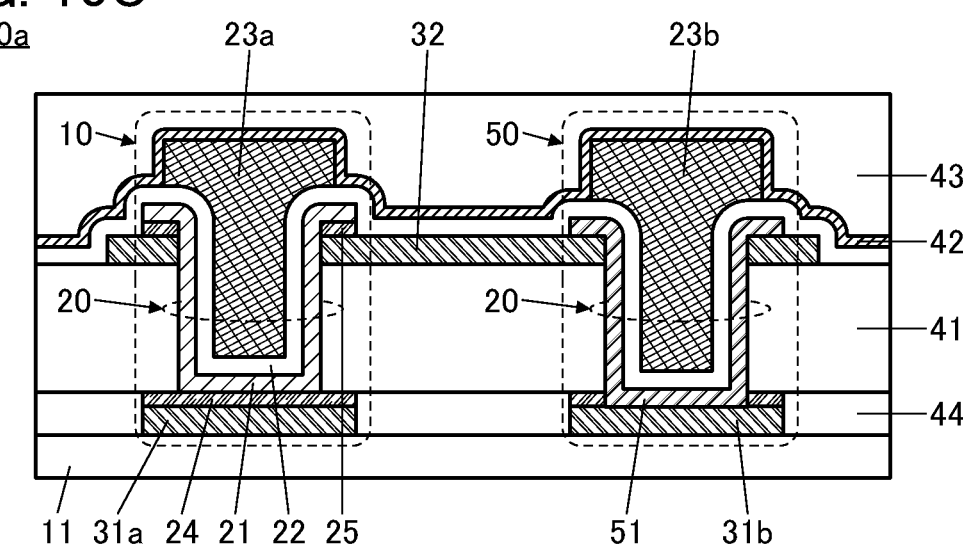

FIG. 10C illustrates an example of sharing the conductive layer 32. In FIG. 10C, the transistor 10 includes the conductive layer 23a corresponding to the wiring WWL and a conductive layer 31a corresponding to the wiring BL, and the capacitor 50 includes the conductive layer 23b corresponding to the wiring PL. The conductive layer 32 is shared by the transistor 10 and the capacitor 50. The capacitor 50 includes a conductive layer 31b.

Although the conductive layer 23b of the capacitor 50 corresponds to the wiring PL in the example described here, one or both of the conductive layers 31 and 32 may correspond to the wiring PL. In the latter case, the conductive layer 23b is electrically connected to one of the conductive layers 31 and 32 of the transistor 10.

Figure 11A:
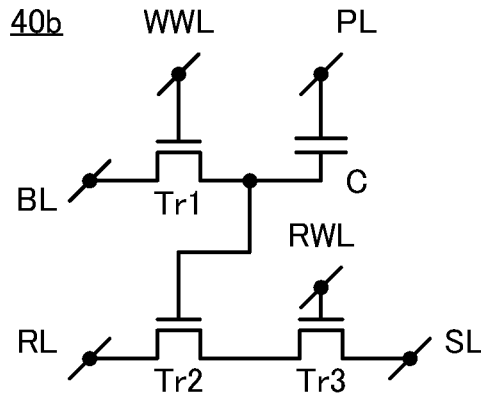
FIGS. 11A and 11B illustrate a structure example of a memory device.

A memory cell 40b illustrated in FIG. 11A includes three transistors (the transistor Tr1, a transistor Tr2, and a transistor Tr3) and one capacitor C and is also referred to as 3Tr1C. The memory cell 40b has a structure in which the transistors Tr2 and Tr3 are added to the memory cell 40a illustrated in FIG. 10A. A gate of the transistor Tr2 is connected to the other of the source and the drain of the transistor Tr1 and one electrode of the capacitor C, one of a source and a drain of the transistor Tr2 is connected to a wiring RL, and the other of the source and the drain of the transistor Tr2 is connected to one of a source and a drain of the transistor Tr3. A gate of the transistor Tr3 is connected to a wiring RWL and the other of the source and the drain of the transistor Tr3 is connected to a wiring SL.

The wiring BL serves as a write bit line and is supplied with a data potential. The wiring WWL serves as a write word line and is supplied with a control signal for controlling on/off of the transistor Tr1. The data potential is charged and retained in the capacitor C through the transistor Tr1. One of the wirings RL and SL serves as a read line and is connected to a read circuit such as a sense amplifier, and the other of the wirings RL and SL is supplied with a fixed potential or a signal. The wiring PL is supplied with a fixed potential or a ground potential.

Figure 11B:
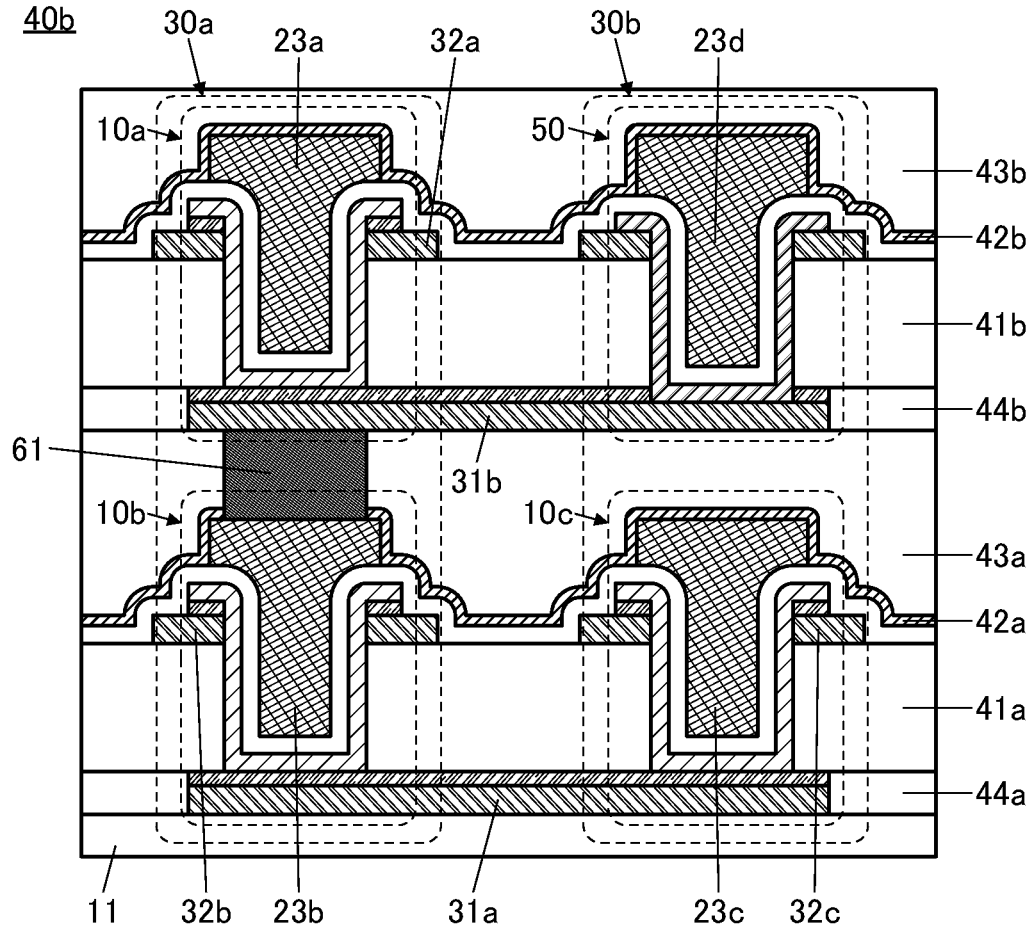

FIG. 11B is a cross-sectional view of the memory cell 40b. The memory cell 40b includes the transistor 10a, the transistor 10b, the transistor 10c, and the capacitor 50. The transistor 10b and the transistor 10c are provided under the transistor 10a and the capacitor 50.

The transistors 10a, 10b, and 10c have the same structure. The transistor 10a includes the conductive layer 23a, the conductive layer 31b, and the conductive layer 32a. The transistor 10b includes the conductive layer 23b, the conductive layer 31a, and the conductive layer 32b. The transistor 10c includes a conductive layer 23c, the conductive layer 31a, and a conductive layer 32c. The capacitor 50 includes the conductive layer 31b and a conductive layer 23d. In FIG. 11B, an insulating layer 44a, the insulating layer 41a, an insulating layer 42a, an insulating layer 43a, an insulating layer 44b, the insulating layer 41b, an insulating layer 42b, and an insulating layer 43b are stacked from the insulating layer 11 side. The conductive layer 31b is connected to the conductive layer 23b through a conductive layer 61 embedded in the insulating layer 43a and serving as a connection electrode (plug).

The transistor 10a, the transistor 10b, and the transistor 10c correspond to the transistor Tr1, the transistor Tr2, and the transistor Tr3, respectively. The conductive layer 23a, the conductive layer 32a, the conductive layer 23d, the conductive layer 32b, the conductive layer 23c, and the conductive layer 32c correspond to the wiring WWL, the wiring BL, the wiring PL, the wiring RL, the wiring RWL, and the wiring SL, respectively.

In FIG. 11B, the transistors 10b and 10a overlap with each other and the transistor 10c and the capacitor 50 overlap with each other. Such a stacked-layer structure allows the area occupied by the memory cell 40b in a plan view to be reduced as compared with the case where each transistor and the capacitor 50 do not overlap with each other.

Figure 12A:
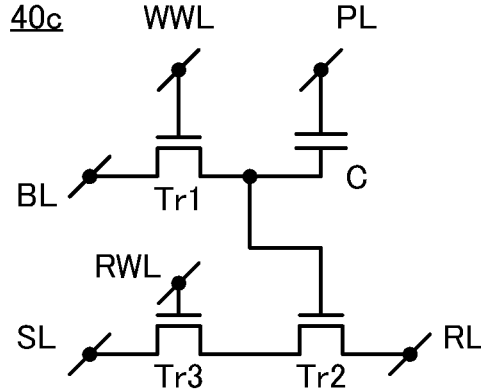
FIGS. 12A and 12B illustrate a structure example of a memory device.
Figure 12B:
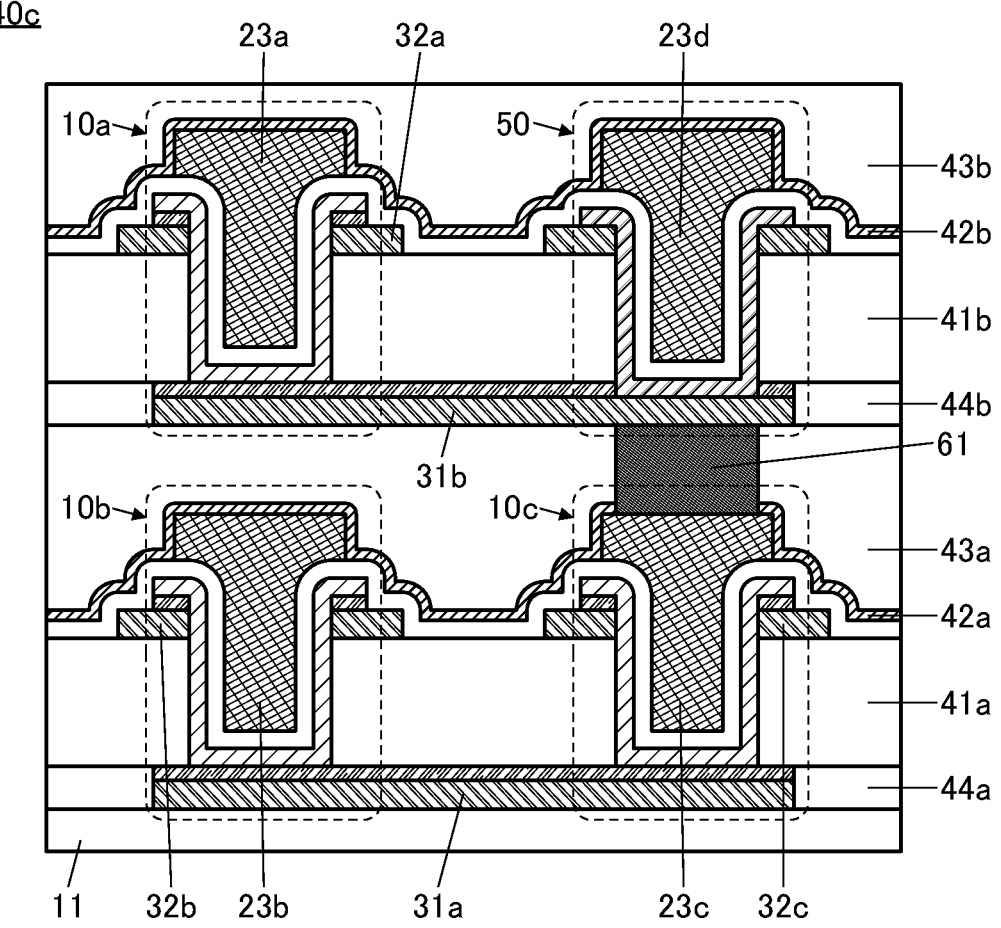

FIGS. 12A and 12B illustrate an example in which the transistor Tr2 and the transistor Tr3 in the memory cell 40c are replaced with each other. The transistor 10b and the transistor 10c in FIG. 12B correspond to the transistor Tr3 and the transistor Tr2 in FIG. 12A, respectively. In FIG. 12B, the conductive layer 23c of the transistor 10c is connected to the conductive layer 31b through the conductive layer 61. The conductive layer 23b, the conductive layer 32b, and the conductive layer 32c correspond to the wiring RWL, the wiring SL, and the wiring RL, respectively.

Described next is an arrangement method of memory cells in a memory device including a plurality of memory cells 40b. The following description is made with the structure illustrated in FIG. 11B used as an example. As illustrated in FIG. 11B, a stacked-layer structure of the transistors 10a and 10b is referred to as a unit 30a, and a stacked-layer structure of the capacitor 50 and the transistor 10c is referred to as a unit 30*b*. The unit 30*a* is connected to the wirings WWL, BL, and RL. The unit 30*b* is connected to the wirings PL, RWL, and SL.

Figure 13A:
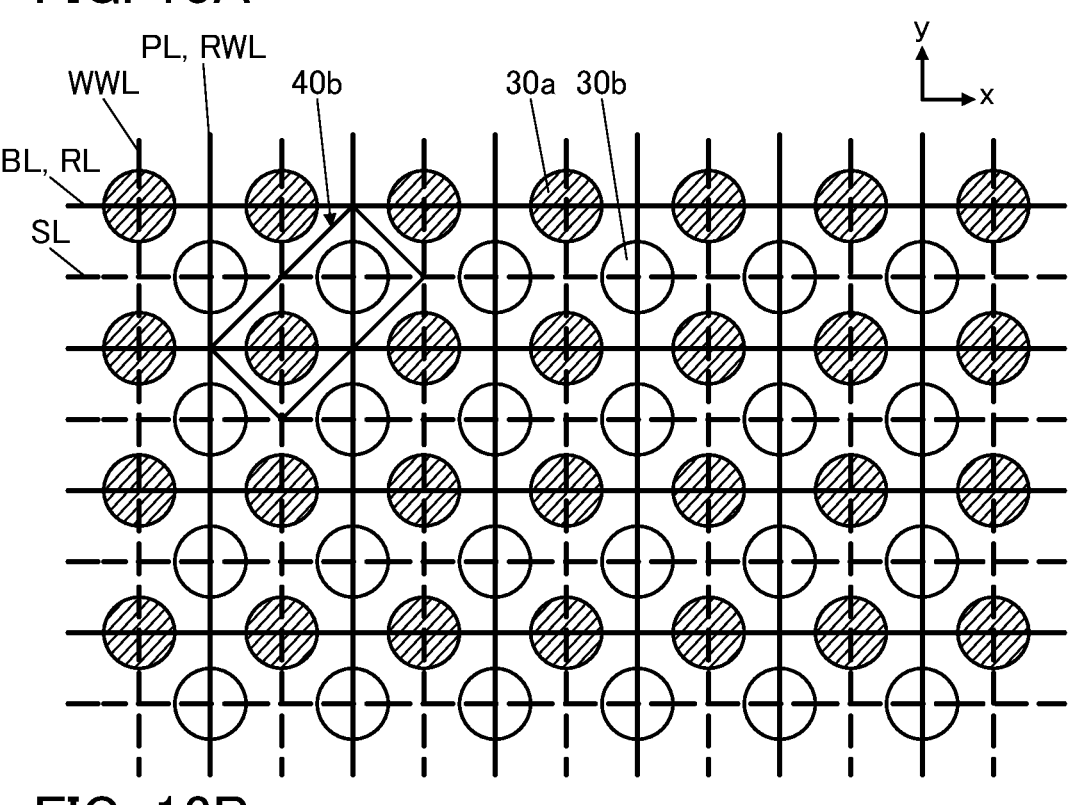
FIGS. 13A and 13B illustrate a structure example of a memory device.

FIG. 13A illustrates a method example in which the memory cells 40*b* are periodically arranged. FIG. 13A is a plan view schematically showing an arrangement method of the memory cells 40*b*. In FIG. 13A, the x direction and the y direction are denoted by arrows as rectangular coordinates.

In FIG. 13A, a hatched circle shows the unit 30*a* and a white circle shows the unit 30*b*. A pair of units 30*a* and 30*b* constitutes the memory cell 40*b*.

The wiring BL, the wiring RL, and the wiring SL extend in the x direction. The wiring WWL, the wiring PL, and the wiring RWL extend in the y direction. The wiring BL and the wiring RL overlap with each other and are collectively denoted by a solid line (a wiring BL, RL), and the wiring SL is denoted by a dashed line. The wiring PL and the wiring RWL overlap with each other and are collectively denoted by a solid line (a wiring PL, RWL), and the wiring WWL is denoted by a dashed line.

In the plan view, the wiring WWL and the wiring PL, RWL are arranged at regular intervals. The wiring SL and the wiring BL, RL are also arranged at regular intervals. The distance between wirings extending in the x direction is equal to the distance between wirings extending in the y direction.

The unit 30*a* is positioned at the intersection of the wiring BL, RL and the wiring WWL. The unit 30*b* is positioned at the intersection of the wiring SL and the wiring PL, RWL. The direction connecting the units 30*a* and 30*b* is inclined 45° with respect to the x direction and the y direction.

With such a structure, the memory cells 40*b* can be arranged at the highest density.

Figure 13B:
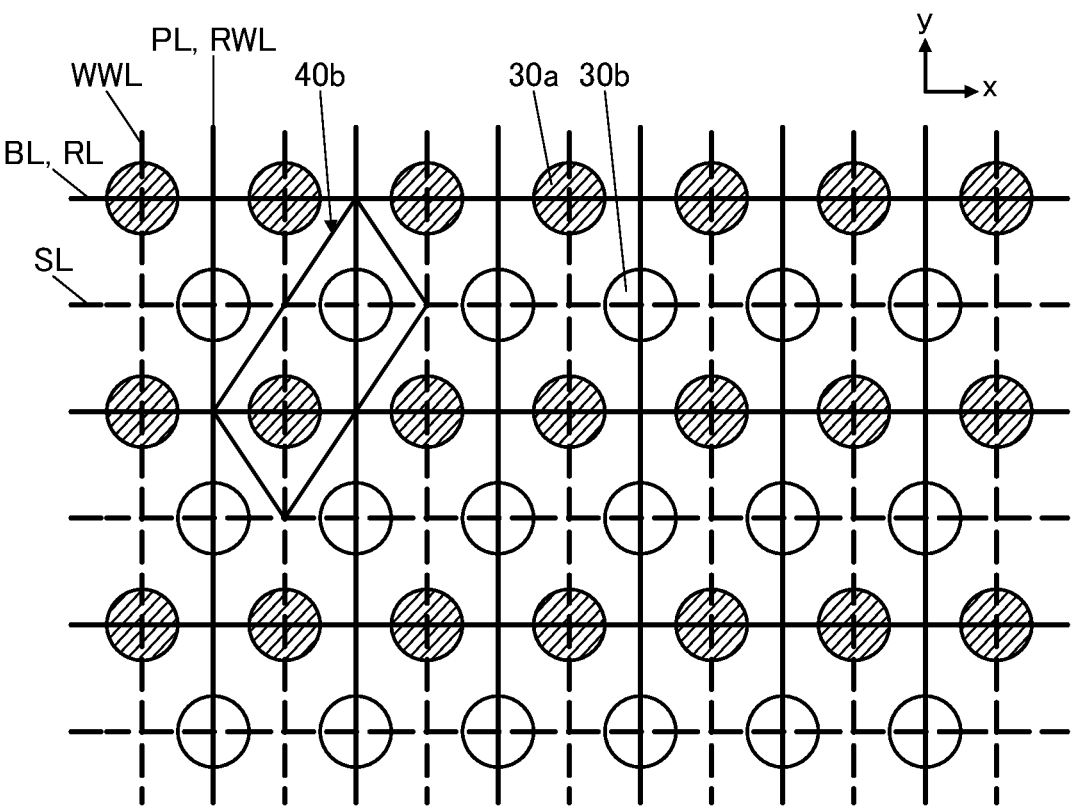

Note that FIG. 13A shows an ideal example in which the distance between wirings is the same in the x direction and the y direction; however, the distance between wirings may be different in the x direction and the y direction. FIG. 13B shows an example in which the distance between wirings in the y direction is larger than that in the x direction. The distance between wirings in the x direction may be larger than that in the y direction.

Figure 14A:
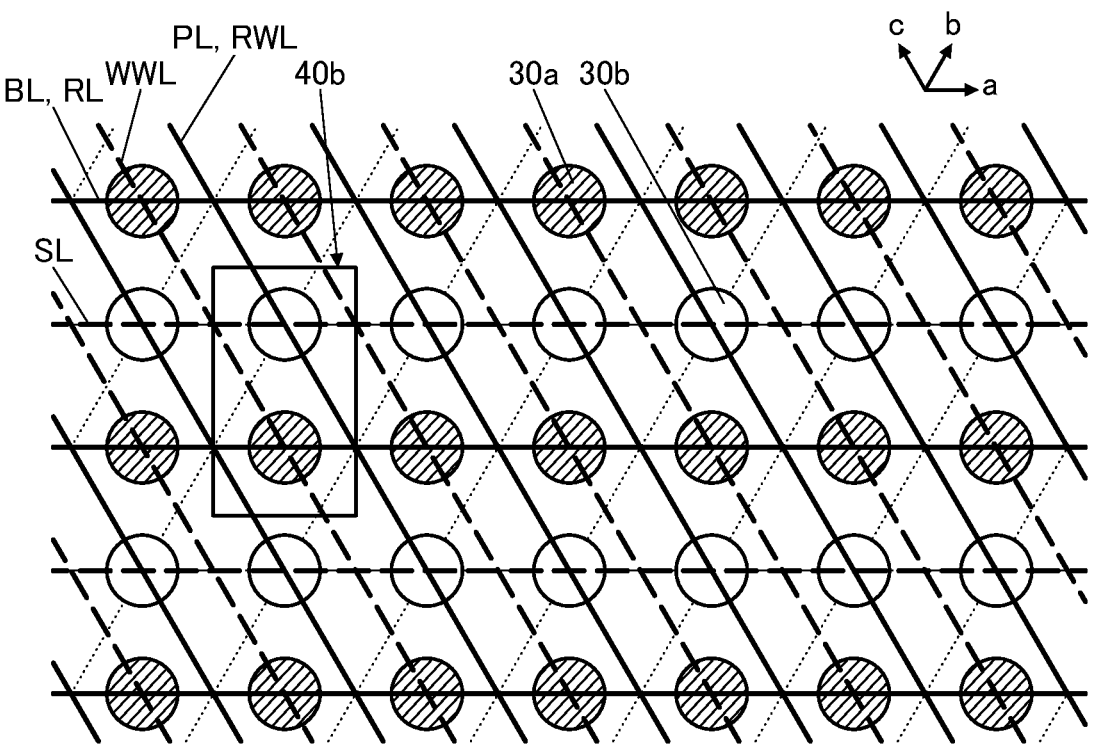
FIGS. 14A and 14B illustrate a structure example of a memory device.

FIG. 14A shows an example in which wirings intersect obliquely. In FIG. 14A, three directions intersecting at 60° (a direction, b direction, and c direction) are denoted by arrows as oblique coordinates. Thin dashed lines represent the direction parallel to the b direction.

The wiring SL and the wiring BL, RL extend in the a direction, and the wiring WWL and the wiring PL, RWL extend in the c direction. The straight line connecting the units 30*a* and 30*b* is parallel to the direction orthogonal to the a direction.

Figure 14B:
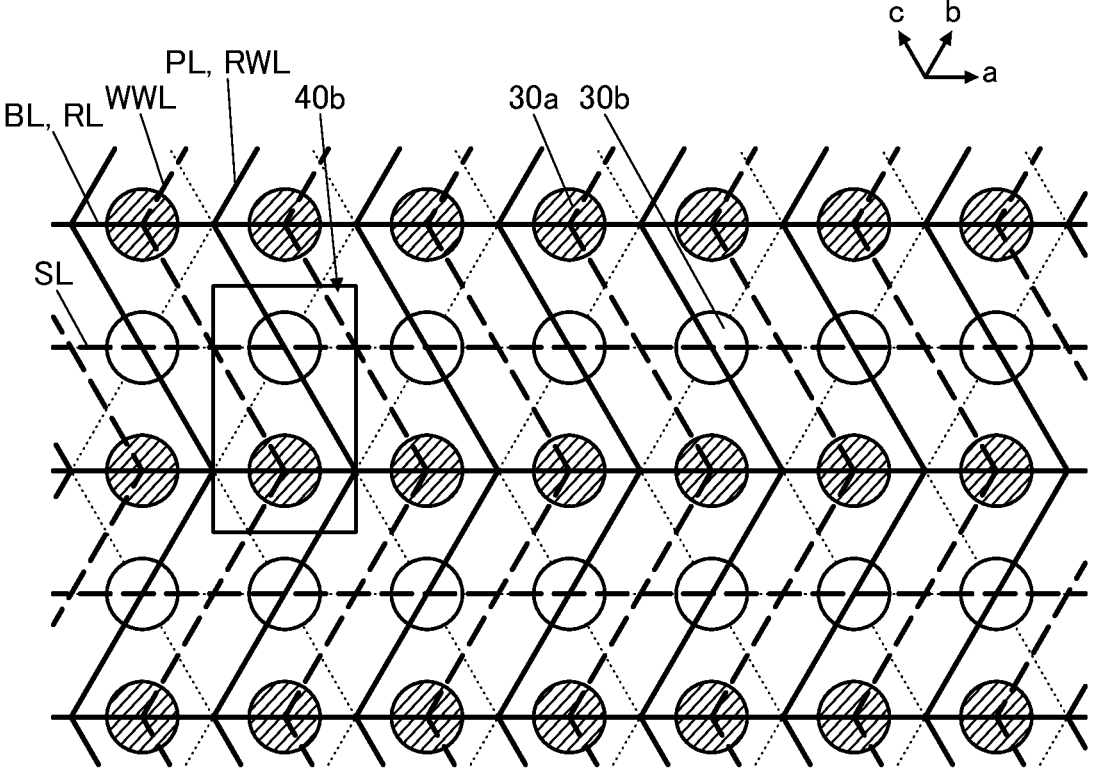

FIG. 14B shows an example of having wiring shapes different from those in FIG. 14A. In FIG. 14B, a plurality of wirings WWL and a plurality of wirings PL, RWL each have zigzag pattern having a portion parallel to the b direction and a portion parallel to the c direction, and are aligned in the a direction. In the example shown in FIG. 14A, the external shape of a memory cell array needs to be a parallelogram (including a rhombus) so that wirings extending in the c direction are each connected to the same number of memory cells 40*b*. In contrast, the wirings with a zigzag pattern as in FIG. 14B allow the external shape of the memory cell array to be a rectangle (including a square) as in the arrangement with rectangular coordinates.

Figure 15:
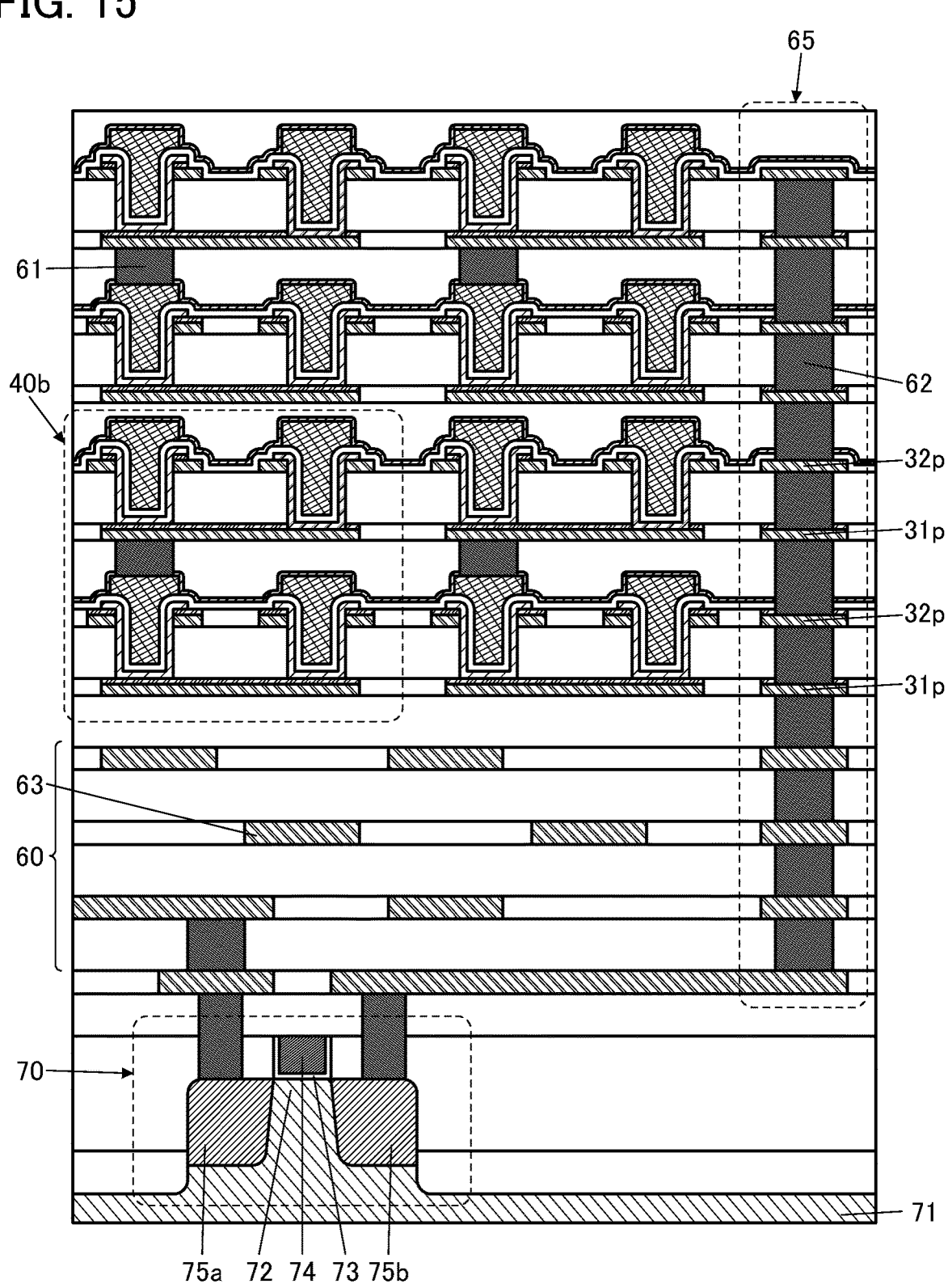
FIG. 15 illustrates a structure example of a memory device.

FIG. 15 illustrates a cross-sectional structure example of a memory device in which a layer including a memory cell is stacked over a layer including a driver circuit provided with a sense amplifier.

FIG. 15 shows an example in which a wiring layer 60 is provided above a transistor 70 and two layers of the memory cells 40*b* are stacked above the wiring layer 60. Note that three or more layers of the memory cells 40*b* may be stacked. The above description can be referred to for the structure of the memory cell 40*b*.

The transistor 70 is provided on a substrate 71 and includes a conductive layer 74 serving as a gate, an insulating layer 73 serving as a gate insulating layer, a semiconductor region 72 that is a part of the substrate 71, and a low-resistance region 75*a* and a low-resistance region 75*b* serving as a source region and a drain region. The transistor 70 may be either a p-channel or an n-channel transistor.

In the transistor 70, the semiconductor region 72 (part of the substrate 71) in which a channel is formed has a projecting portion. Furthermore, the conductive layer 74 is provided so as to cover side and top surfaces of the semiconductor region 72 with the insulating layer 73 therebetween. The transistor 70 having such a structure is also referred to as a FIN transistor because the projecting portion of the semiconductor substrate is utilized. An insulator functioning as a mask for forming the projecting portion may be provided in contact with the upper portion of the projecting portion. Although the case where the projecting portion is formed by processing part of the semiconductor substrate is described here, a semiconductor film having a projecting shape may be formed by processing an SOI substrate. The structure of the transistor 70 is not limited to this example. A transistor with an appropriate structure can be used in accordance with the circuit configuration or the driving method.

The wiring layer 60 including a plurality of wirings 63 is provided in FIG. 15. Such a wiring layer including an interlayer film, a wiring, a plug, and the like may be provided between structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, in some cases, part of a conductor functions as a wiring or part of a conductor functions as a plug.

For example, a plurality of interlayer films are stacked over the transistor 70. A plug for electrically connecting a wiring between interlayer films may be embedded in the interlayer films. An insulator functioning as the interlayer film may function as a planarization film that covers a roughness thereunder. For example, the top surface of the insulator may be planarized by planarization treatment using a CMP method or the like to improve the planarity.

FIG. 15 illustrates a connection layer 65 including a plurality of plugs 62 and a plurality of conductive layers. Some conductive layers in the connection layer 65 and conductive layers in the memory cell 40*b* are preferably formed by processing the same conductive film. For example, a conductive layer 31*p* and a conductive layer 32*p* in the connection layer 65 can be formed in the same process as the conductive layers 31 and 32 in the memory cell 40*b*.

The above is the description of the application example.

In one embodiment of the present invention, a transistor and a capacitor can be separately formed easily; thus, a variety of circuits including a transistor and a capacitor can be formed at a low cost. Furthermore, the transistor of one embodiment of the present invention can have an extremely small channel length and an extremely low off-state current, achieving a high on/off ratio. This can reduce the time needed for charging and discharging a capacitor and can also retain the potential at the capacitor for a long time. One embodiment of the present invention can be used for a variety of circuits requiring a transistor and a capacitor, such as pixel circuits of a display device and an imaging device as well as a memory device, and devices including these circuits.

At least part of this embodiment can be implemented in combination with any of the other embodiments described in this specification, as appropriate.

Embodiment 2

In this embodiment, a memory device of one embodiment of the present invention will be described with reference to drawings.

Figures 16A, 16B:
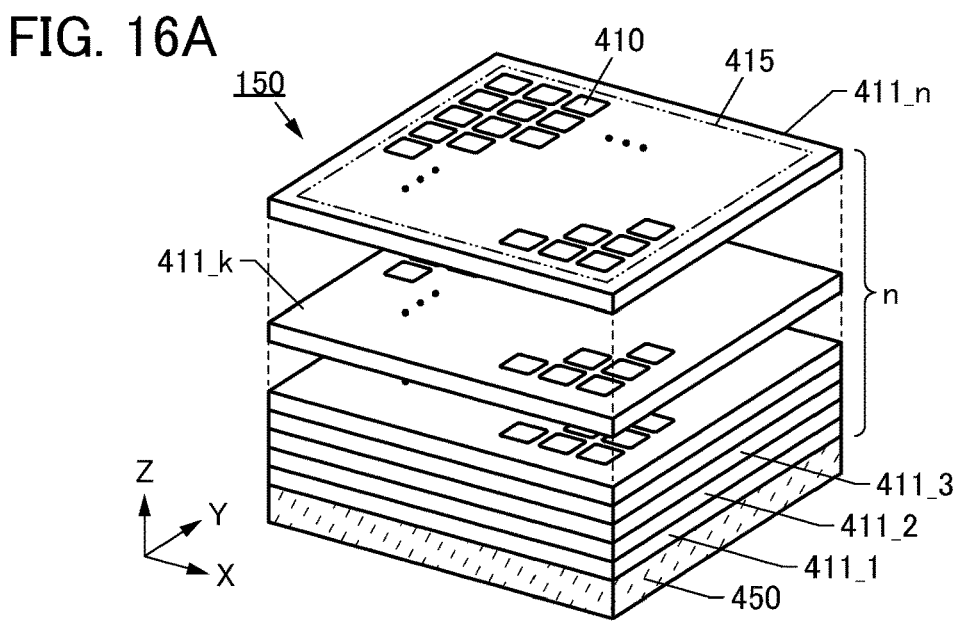
FIGS. 16A and 16B illustrate an example of a memory device.

FIG. 16A is a schematic perspective view illustrating a memory device of one embodiment of the present invention. FIG. 16B is a block diagram of the memory device of one embodiment of the present invention.

A memory device 150 illustrated in FIGS. 16A and 16B includes a driver circuit layer 450 and n memory layers 411. The memory layers 411 each include a memory cell array 415. The memory cell array 415 includes a plurality of memory cells 410.

The n memory layers 411 are provided over the driver circuit layer 450. Stacking of the n memory layers 411 over the driver circuit layer 450 can reduce the area occupied by the memory device 150. Furthermore, the memory capacity per unit area can also be increased.

In this embodiment, the n-th memory layer 411 is denoted by a memory layer 411_$n$ (n is an integer greater than or equal to 1). In this embodiment and the like, the "memory layer 411" is merely stated in some cases when describing a matter related to all the n memory layers 411 or showing a matter common to the n memory layers 411.

Structure Example of Driver Circuit Layer 450

The driver circuit layer 450 includes a PSW 422 (power switch), a PSW 423, and a peripheral circuit 431. The peripheral circuit 431 includes a peripheral circuit 441, a control circuit 432, and a voltage generation circuit 433.

In the memory device 150, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside.

The signal CLK is a clock signal. The signal BW, the signal CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 432.

The control circuit 432 is a logic circuit having a function of controlling the entire operation of the memory device 150. For example, the control circuit performs a logical operation on the signal CE, the signal GW, and the signal BW to determine an operation mode (e.g., a writing operation or a reading operation) of the memory device 150. Alternatively, the control circuit 432 generates a control signal for the peripheral circuit 441 so that the operation mode is executed.

The voltage generation circuit 433 has a function of generating a negative voltage. The signal WAKE has a function of controlling the input of the signal CLK to the voltage generation circuit 433. For example, when an H-level signal is supplied as the signal WAKE, the signal CLK is input to the voltage generation circuit 433, and the voltage generation circuit 433 generates a negative voltage.

The peripheral circuit 441 is a circuit for writing and reading data to/from the memory cells 410. The peripheral circuit 441 includes a row decoder 442, a column decoder 444, a row driver 443, a column driver 445, an input circuit 447 (Input Cir.), an output circuit 448 (Output Cir.), and a sense amplifier 446.

The row decoder 442 and the column decoder 444 have a function of decoding the signal ADDR. The row decoder 442 is a circuit for specifying a row to be accessed, and the column decoder 444 is a circuit for specifying a column to be accessed. The row driver 443 has a function of selecting the wiring WWL (write word line) or the wiring RWL (read word line) specified by the row decoder 442. The column driver 445 has a function of writing data to the memory cells 410, a function of reading data from the memory cells 410, a function of retaining the read data, and the like. The column driver 445 has a function of selecting a wiring WBL (write bit line) or a wiring RBL (read bit line) specified by the column decoder 444.

The input circuit 447 has a function of retaining the signal WDA. Data retained by the input circuit 447 is output to the column driver 445. Data output from the input circuit 447 is data (Din) to be written to the memory cells 410. Data (Dout) read from the memory cells 410 by the column driver 445 is output to the output circuit 448. The output circuit 448 has a function of retaining Dout. In addition, the output circuit 448 has a function of outputting Dout to the outside of the memory device 150. Data output from the output circuit 448 is the signal RDA.

The PSW 422 has a function of controlling supply of VDD to the peripheral circuit 431. The PSW 423 has a function of controlling supply of VHM to the row driver 443. Here, in the memory device 150, a high power supply voltage is VDD and a low power supply voltage is GND (a ground potential). In addition, VHM is a high power supply voltage used to set a word line at a high level and is higher than VDD. The on/off of the PSW 422 is controlled by the signal PON1, and the on/off of the PSW 423 is controlled by the signal PON2. The number of power domains to which VDD is supplied is one in the peripheral circuit 431 in FIG. 16B but can be more than one. In this case, a power switch is provided for each power domain.

Structure Example of Memory Layer 411

A structure example of the n memory layers 411 is described. Each of the n memory layers 411 includes a memory cell array 415. The memory cell array 415 includes a plurality of memory cells 410. FIGS. 16A and 16B show an example in which the memory cell array 415 includes a plurality of memory cells 410 arranged in a matrix of p rows and q columns (each of p and q is an integer greater than or equal to 2).

Note that the rows and the columns extend in directions orthogonal to each other. In this embodiment, the X direction is referred to as a "row" and the Y direction is referred to as a "column", but the X direction may be referred to as a "column" and the Y direction may be referred to as a "row".

In FIG. 16B, the memory cell 410 in the first row and the first column is referred to as a memory cell 410[1,1], and the memory cell 410 in the p-th row and the q-th column is referred to as a memory cell 410[p,q]. The memory cell 410 in the i-th row and the j-th column (i is an integer greater than or equal to 1 and less than or equal top, and j is an integer greater than or equal to 1 and less than or equal to q) is referred to as a memory cell 410[i,j].

Figure 17A:
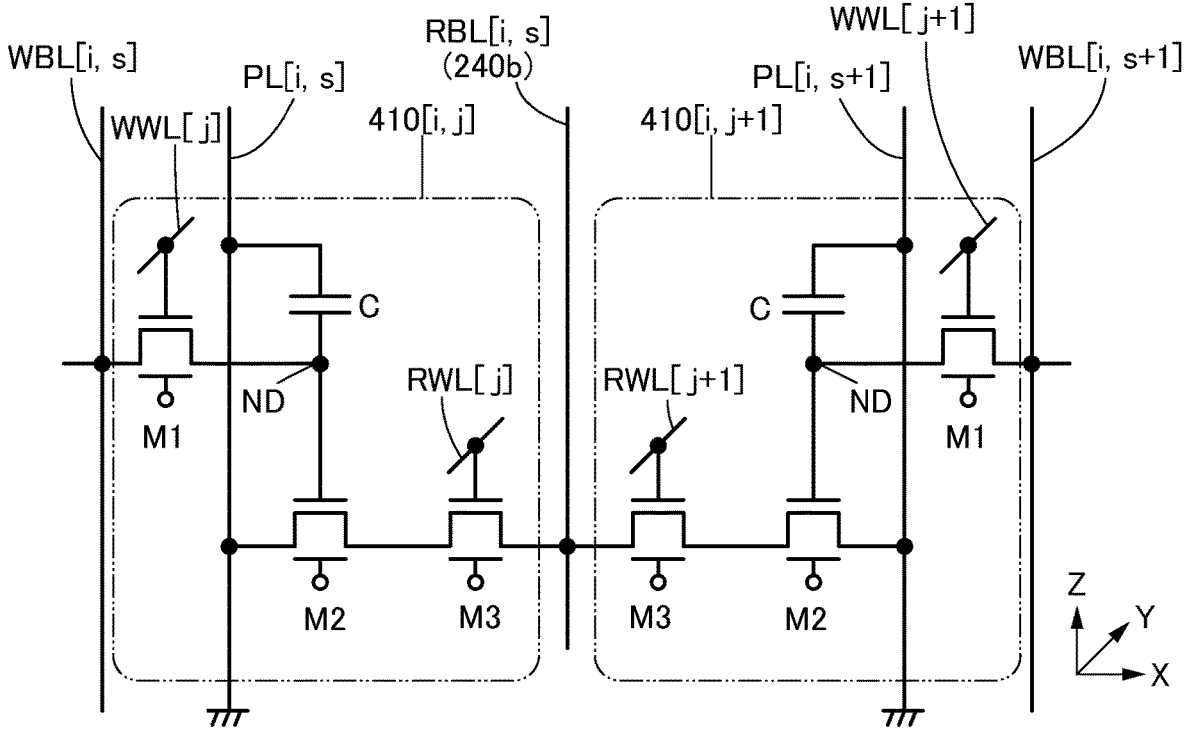
FIGS. 17A and 17B are circuit diagrams each illustrating an example of a memory layer.
Figure 17B:
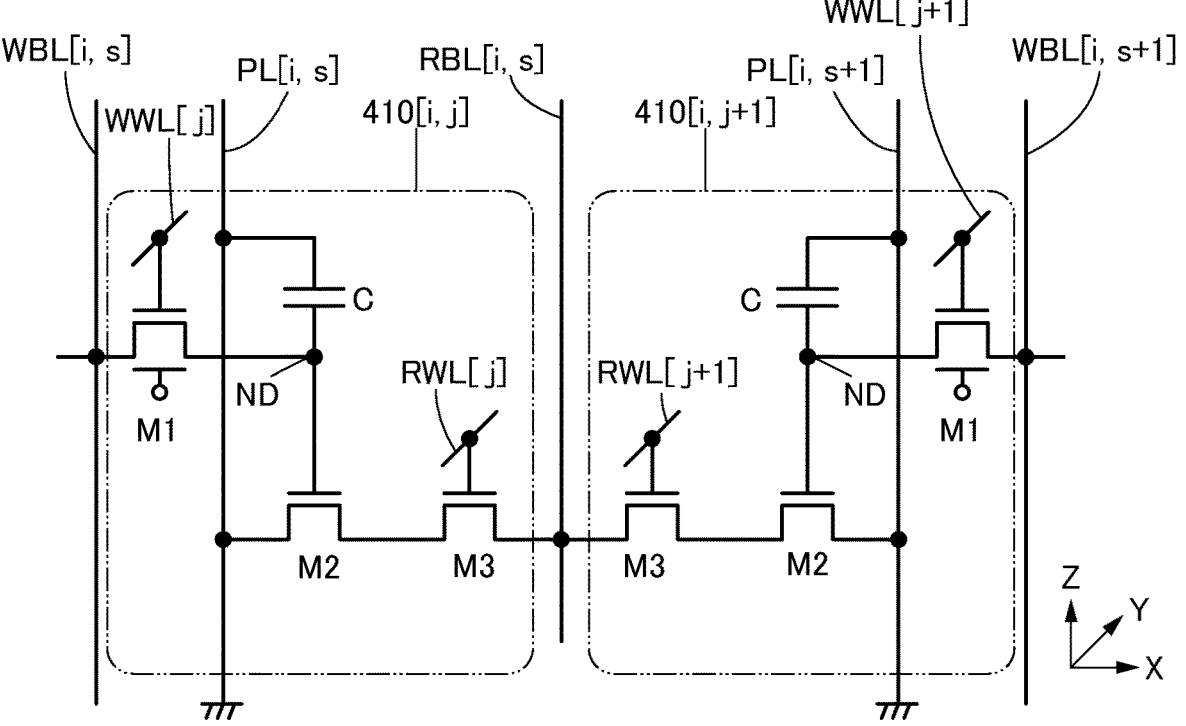

FIGS. 17A and 17B illustrate circuit configuration examples of the memory cell.

The memory cell 410 includes a transistor M1, a transistor M2, a transistor M3, and the capacitor C. A memory cell including three transistors and one capacitor is also referred to as a 3Tr1C memory cell. Thus, the memory cell 410 shown in this embodiment is a 3Tr1C memory cell.

In the memory cell 410[i,j], a gate of the transistor M1 is electrically connected to a wiring WWL[j], and one of a source and a drain of the transistor M1 is electrically connected to a wiring WBL[i,s]. FIG. 17A shows a structure example in which a part of the wiring WWL[j] serves as the gate of the transistor M1. One electrode of the capacitor C is electrically connected to a wiring PL[i,s] and the other electrode thereof is electrically connected to the other of the source and the drain of the transistor M1. FIG. 17A shows a structure example in which part of the wiring PL[i,s] serves as the one electrode of the capacitor C. A gate of the transistor M2 is electrically connected to the other electrode of the capacitor C, one of a source and a drain of the transistor M2 is electrically connected to one of a source and a drain of the transistor M3, and the other of the source and the drain of the transistor M2 is electrically connected to the wiring PL[i,s]. A gate of the transistor M3 is electrically connected to a wiring RWL[j] and the other of the source and the drain of the transistor M3 is electrically connected to a wiring RBL[i,s].

In the memory cell 410[i,j], a region where the other electrode of the capacitor C, the other of the source and the drain of the transistor M1, and the gate of the transistor M2 are electrically connected and have the same potential constantly is referred to as a node ND.

In a memory cell 410[i,j+1], the gate of the transistor M1 is electrically connected to a wiring WWL[j+1], and one of the source and the drain of the transistor M1 is electrically connected to a wiring WBL[i,s+1]. FIG. 17A shows a structure example in which part of the wiring WWL[j+1] serves as the gate of the transistor M1. One electrode of the capacitor C is electrically connected to a wiring PL[i,s+1] and the other electrode thereof is electrically connected to the other of the source and the drain of the transistor M1. FIG. 17A shows a structure example in which part of the wiring PL[i,s+1] serves as the one electrode of the capacitor C. The gate of the transistor M2 is electrically connected to the other electrode of the capacitor C, one of the source and the drain of the transistor M2 is electrically connected to one of the source and the drain of the transistor M3, and the other of the source and the drain of the transistor M2 is electrically connected to a wiring PL[i,s+1]. The gate of the transistor M3 is electrically connected to a wiring RWL[j+1] and the other of the source and the drain of the transistor M3 is electrically connected to a wiring RBL[i,s].

Thus, the wiring RBL[i,s] is electrically connected to the other of the source and the drain of the transistor M3 included in the memory cell 410[i,j] and the other of the source and the drain of the transistor M3 included in the memory cell 410[i,j+1]. Accordingly, the wiring RBL[i,s] is shared by the memory cell 410[i,j] and the memory cell 410[i,j1+1]. Although not illustrated, the wiring WBL[i,s] is shared by a memory cell 410[i,j−1] and the memory cell 410[i,j], and a wiring WBL[i,s+1] is shared by a memory cell 410[i,j+1] and a memory cell 410[i,j1+2].

In the memory cell 410[i,j+1], a region where the other electrode of the capacitor C, the other of the source and the drain of the transistor M1, and the gate of the transistor M2 are electrically connected and have the same potential constantly is referred to as the node ND.

As illustrated in FIG. 17A, each of the transistors M1, M2, and M3 may be a transistor with a back gate. The back gate is positioned so that a channel formation region of a semiconductor is interposed between the gate and the back gate. The gate and the back gate are formed using a conductor. The back gate can function in a manner similar to that of the gate. The threshold voltage of the transistor can be changed by changing the potential of the back gate. The potential of the back gate may be equal to that of the gate or may be a ground potential or a given potential.

Each of the transistors M1, M2, and M3 does not necessarily include a back gate. For example, as illustrated in FIG. 17B, a transistor with a back gate may be used as the transistor M1 and a transistor without a back gate may be used as the transistors M2 and M3.

The gate and the back gate are formed using conductors and thus each have a function of preventing an electric field generated outside the transistor from affecting the semiconductor in which a channel is formed (in particular, a blocking function against static electricity). That is, the variation in the electrical characteristics of the transistor due to the influence of external electric field such as static electricity can be inhibited. By providing the back gate, the amount of change in threshold voltage of the transistor in a bias-temperature (BT) stress test can be reduced.

For example, the use of a transistor with a back gate for the transistor M1 can reduce the influence of an external electric field, allowing the transistor M1 to be maintained in the stable off state. Thus, data written to the node ND can be retained stably. The back gate stabilizes the operation of the memory cell 410 and increases the reliability of a memory device including the memory cell 410.

Likewise, the use of a transistor with a back gate for the transistor M3 can reduce the influence of an external electric field, allowing the transistor M3 to be maintained in the stable off state. Thus, leakage current between the wiring RBL and the wiring PL can be reduced, resulting in a reduction in the power consumption of the memory device including the memory cell 410.

For a semiconductor layer in which the channel of each of the transistors M1, M2, and M3 is formed, one or a combination of a single crystal semiconductor, a polycrystalline semiconductor, a microcrystalline semiconductor, an amorphous semiconductor, and the like can be used. Examples of the semiconductor material include silicon and germanium. Alternatively, a compound semiconductor such as silicon germanium, silicon carbide, gallium arsenide, an oxide semiconductor, or a nitride semiconductor can be used.

Each of the transistors M1, M2, and M3 is preferably a transistor using an oxide semiconductor, which is one type of metal oxide, in a semiconductor layer where a channel is formed (also referred to as an OS transistor). An oxide semiconductor has a band gap of 2 eV or more, achieving an extremely low off-state current. Accordingly, the power consumption of the memory cell 410 can be reduced, resulting in a reduction in the power consumption of the memory device 150 including the memory cell 410.

A memory cell including an OS transistor can be referred to as an OS memory. The memory device 150 including the memory cell can also be referred to as an OS memory.

The OS transistor operates stably even in a high-temperature environment and has a small variation in characteristics. For example, the off-state current hardly increases even in a high-temperature environment. Specifically, the off-state current hardly increases even at an environment temperature higher than or equal to room temperature and lower than or equal to 200° C. In addition, the on-state current of the OS transistor is less likely to decrease even in a high-temperature environment. Thus, the OS memory achieves a stable operation and high reliability even in a high-temperature environment.

Operation Example of Memory Cell 410

Data writing and reading operation examples of the memory cell 410 will be described. In this embodiment, normally-off n-channel transistors are used as the transistors M1, M2, and M3.

Figure 18:
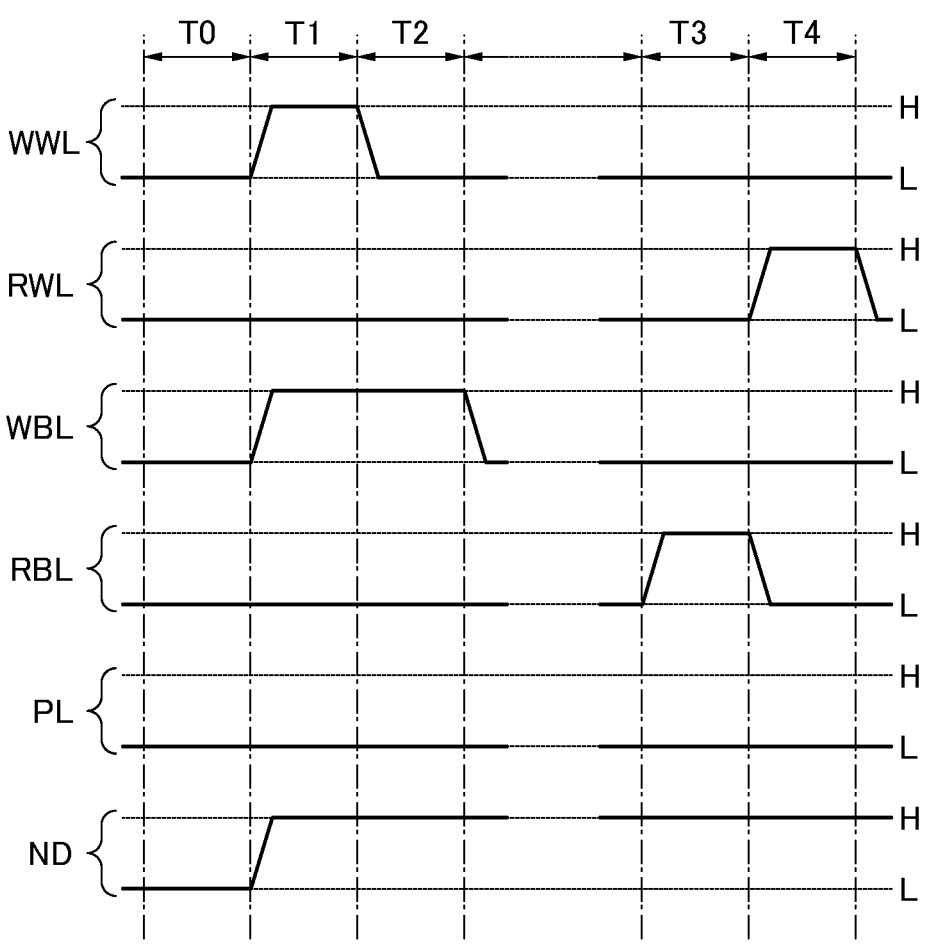
FIG. 18 is a timing chart showing an operation example of a memory cell.

FIG. 18 is a timing chart showing an operation example of the memory cell 410. FIGS. 19A, 19B, 20A, and 20B are circuit diagrams showing operation examples of the memory cell 410.

In the drawings and the like, for easy understanding of the potentials of a wiring and an electrode, "H" representing a potential H or "L" representing a potential L is sometimes written near the wiring and the electrode. In addition, enclosed "H" or "L" is sometimes written near a wiring and an electrode whose potentials are changed. Moreover, a symbol "x" is sometimes written on a transistor in an off state.

When the potential H is supplied to a gate of an n-channel transistor, the transistor is turned on. When the potential L is supplied to the gate of the n-channel transistor, the transistor is turned off. Thus, the potential H is higher than the potential L. The potential H may be equal to a high power supply potential VDD. The potential L is lower than the potential H. The potential L may be equal to a ground potential GND. In this embodiment the potential L is set to be equal to the ground potential GND.

First, in Period T0, the wirings WWL, RWL, WBL, RBL, and PL and the node ND are set to the potential L (FIG. 18). In addition, the ground potential GND is supplied to the back gates of the transistors M1, M2, and M3.

[Data Writing Operation]

Figure 19A:
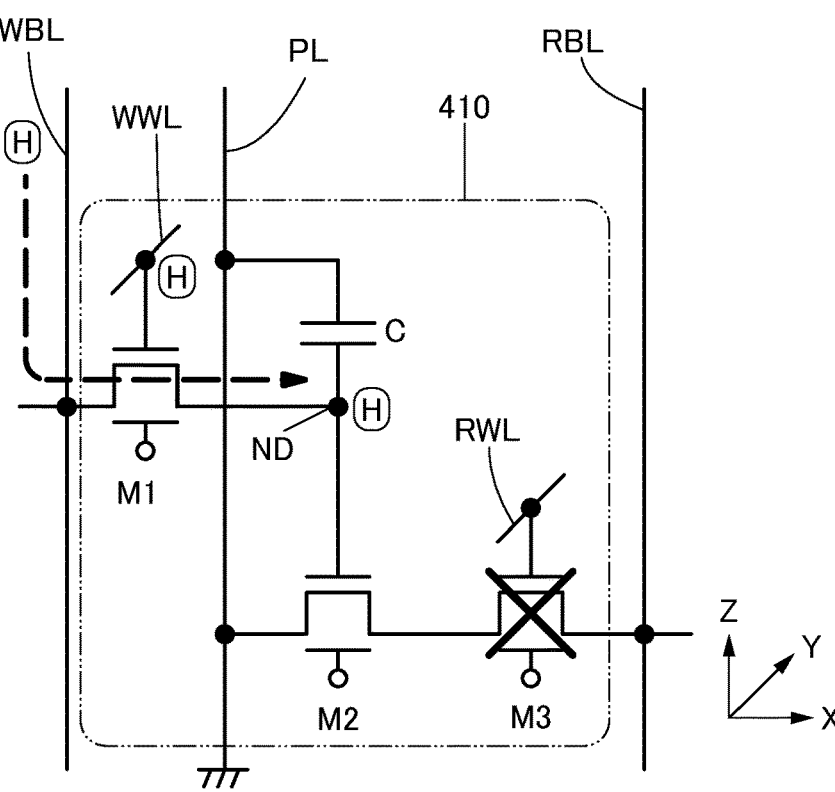
FIGS. 19A and 19B are circuit diagrams each showing an operation example of a memory cell.

In Period Ti, the potential H is supplied to the wiring WWL and the wiring WBL (FIG. 18 and FIG. 19A). Accordingly, the transistor M1 is turned on and the potential H is written to the node ND as data indicating "1".

When the node ND has the potential H, the transistor M2 is turned on. Since the wiring RWL has the potential L, the transistor M3 is in the off state. The transistor M3 in the off state can prevent a short circuit between the wiring RBL and the wiring PL.

[Retaining Operation]

Figure 19B:
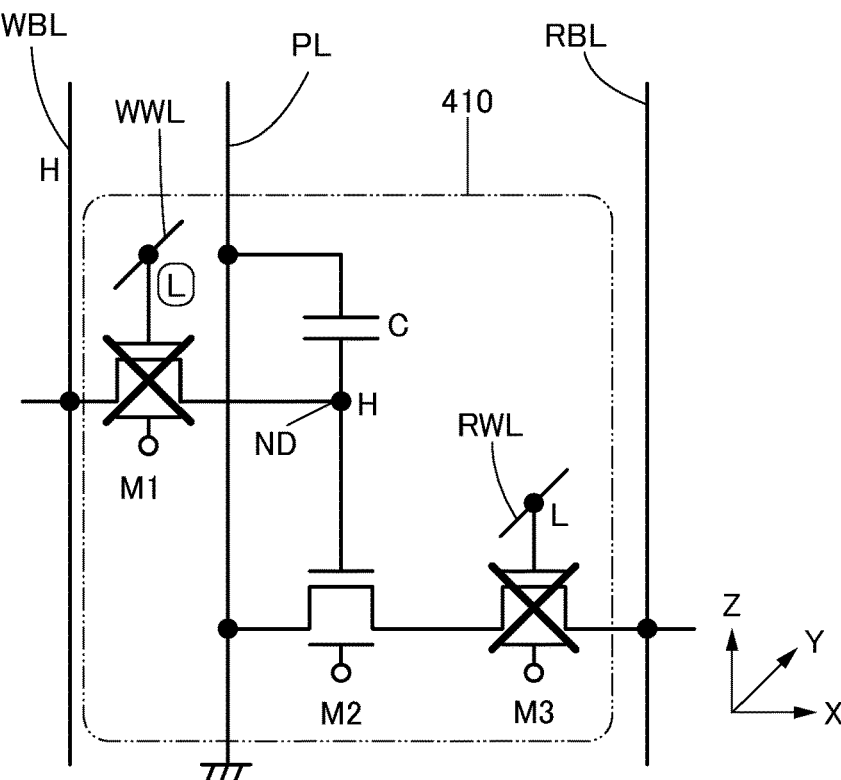

In Period T2, the potential L is supplied to the wiring WWL. Then, the transistor M1 is turned off and the node ND is brought into a floating state. Thus, data (potential H) written to the node ND is retained (FIGS. 18 and 19B). Note that after Period T2, the wiring WBL has the potential L.

As described above, the OS transistor has an extremely low off-state current. When the OS transistor is used as the transistor M1, the data written to the node ND can be retained for a long period. Therefore, it becomes unnecessary to refresh the potential of the node ND and the power consumption of the memory cell 410 can be reduced. Thus, the power consumption of the memory device 150 can be reduced.

When the OS transistor is used as one or both of the transistors M2 and M3, the amount of leakage current flowing between the wiring RBL and the wiring PL in the writing and retaining operations can be significantly reduced.

In addition, the OS transistor has a higher withstand voltage between its source and drain than a transistor including silicon in a semiconductor layer where a channel is formed (also referred to as a Si transistor). When the OS transistor is used as the transistor M1, a higher potential can be supplied to the node ND. This increases the range of a potential retained at the node ND. An increase in the range of the potential retained at the node ND makes it easy to retain multilevel data or analog data.

[Reading Operation]

Figure 20A:
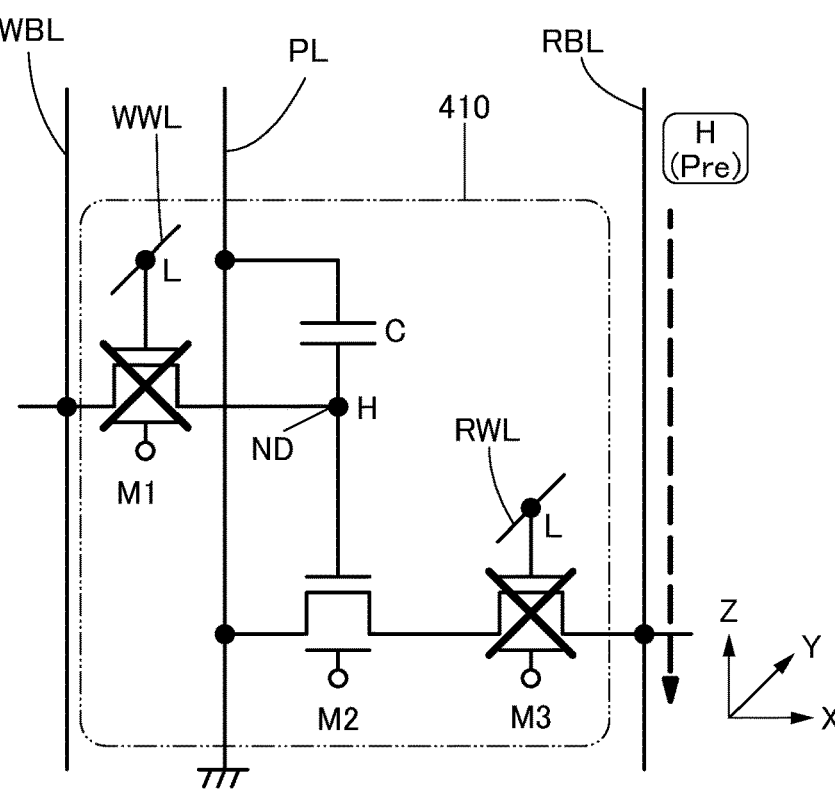
FIGS. 20A and 20B are circuit diagrams each showing an operation example of a memory cell.

In Period T3, the wiring RBL is precharged to the potential H. That is, the wiring RBL is set to the potential H and then is brought into a floating state (FIGS. 18 and 20A).

Figure 20B:
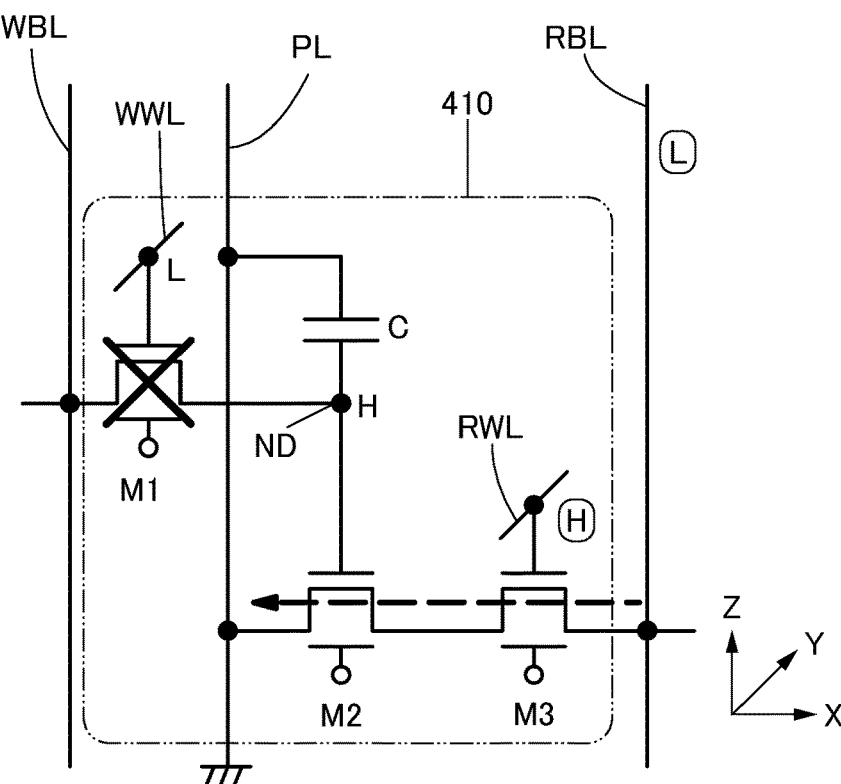

Next, the potential H is supplied to the wiring RWL in Period T4, so that the transistor M3 is turned on (FIGS. 18 and 20B). In the case where the node ND has the potential H at this time, electrical continuity is established between the wiring RBL and the wiring PL through the transistors M2 and M3 because the transistor M2 is in the on state. When electrical continuity is established between the wiring RBL and the wiring PL, the potential of the wiring RBL, which is in a floating state, changes from the potential H to the potential L.

Note that the transistor M2 is in the off state in the case where the potential L is written to the node ND as data indicating "0". Thus, electrical continuity is not established between the wiring RBL and the wiring PL even when the transistor M3 is turned on, and the potential of the wiring RBL remains at the potential H.

By thus detecting a change in the potential of the wiring RBL when the potential H is supplied to the wiring RWL, data written to the memory cell 410 can be read.

In the memory cell 410 including the OS transistor, charge is written to the node ND through the OS transistor; hence, high voltage, which a conventional flash memory requires, is unnecessary and high-speed write operation is possible. Unlike in a flash memory, charge injection and extraction into/from a floating gate or a charge trap layer are not performed in the memory cell 410, allowing a substantially unlimited number of data writing and reading operations. Furthermore, unlike in a flash memory, unstableness due to an increase of electron trap centers is not observed in the memory cell 410 including the OS transistor even when rewrite operation is repeated. The memory cell 410 including the OS transistor is less likely to degrade than a conventional flash memory and can have high reliability.

Unlike a magnetic memory, a resistive random access memory, or the like, the memory cell 410 using the OS transistor has no change in the structure at the atomic level. Thus, the memory cell 410 using the OS transistor has higher write endurance than the magnetic memory and the resistive random access memory.

Structure Example of Sense Amplifier 446

Next, a structure example of the sense amplifier 446 is described. Specifically, a structure example of a write read circuit, which includes the sense amplifier 446 and performs writing or reading of a data signal, is described.

Figure 21:
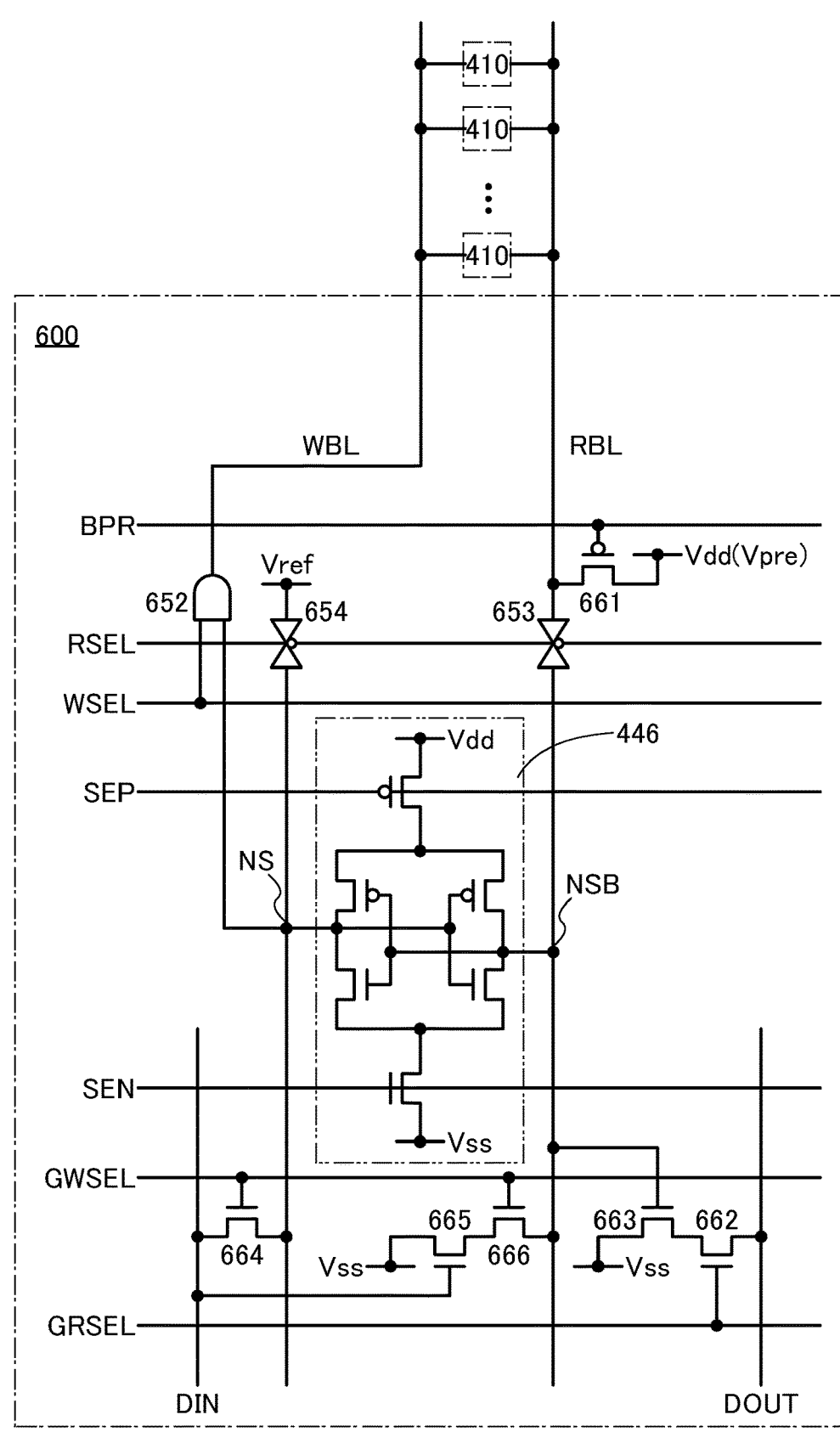
FIG. 21 is a circuit diagram showing a configuration example of a semiconductor device.

FIG. 21 is a circuit diagram showing a configuration example of a circuit 600, which includes the sense amplifier 446 and performs writing or reading of a data signal. The circuit 600 is provided for every wiring WBL and every wiring RBL.

The circuit 600 includes a transistor 661 to a transistor 666, the sense amplifier 446, an AND circuit 652, an analog switch 653, and an analog switch 654.

The circuit 600 operates in accordance with a signal SEN, a signal SEP, a signal BPR, a signal RSEL, a signal WSEL, a signal GRSEL, and a signal GWSEL.

Data DIN input to the circuit 600 is written to the memory cell 410 through the wiring WBL electrically connected to a node NS. The Data DIN written to the memory cell 410 is transmitted to the wiring RBL electrically connected to anode NSB and output from the circuit 600 as data DOUT.

Note that the data DIN and the data DOUT are internal signals and correspond to the signal WDA and the signal RDA, respectively.

The transistor 661 constitutes a precharge circuit. The wiring RBL is precharged to a precharge potential Vpre by the transistor 661. Note that in this embodiment, the case where a potential Vdd (high level) (denoted by Vdd (Vpre) in FIG. 21) is used as the precharge potential Vpre is described. The signal BPR is a precharge signal and controls the conduction state of the transistor 661.

In the reading operation, the sense amplifier 446 determines whether data input to the wiring RBL is at a high level or a low level. In the writing operation, the sense amplifier 446 functions as a latch circuit that temporarily retains the data DIN input to the circuit 600.

The sense amplifier 446 illustrated in FIG. 21 is a latch sense amplifier. The sense amplifier 446 includes two inverter circuits, and an input node of one of the inverter circuits is connected to an output node of the other inverter circuit. When the input node and the output node of the one inverter circuit are the node NS and the node NSB, respectively, complementary data is retained at the node NS and the node NSB.

The signal SEN and the signal SEP are each a sense amplifier enable signal for activating the sense amplifier 446, and a reference potential Vref is a read judge potential. The sense amplifier 446 determines whether the potential of the node NSB at the time of the activation is at a high level or a low level on the basis of the reference potential Vref.

The AND circuit 652 controls electrical continuity between the node NS and the wiring WBL. The analog switch 653 controls electrical continuity between the node NSB and the wiring RBL, and the analog switch 654 controls electrical continuity between the node NS and a wiring for supplying the reference potential Vref.

In data reading, the potential of the wiring RBL is transmitted to the node NSB by the analog switch 653. When the potential of the wiring RBL is lower than the reference potential Vref, the sense amplifier 446 determines that the wiring RBL is at low level. When the potential of the wiring RBL is not lower than the reference potential Vref, the sense amplifier 446 determines that the wiring RBL is at high level.

The signal WSEL is a write selection signal, which controls the AND circuit 652. The signal RSEL is a read selection signal, which controls the analog switches 653 and 654.

A transistor 662 and a transistor 663 constitute an output multiplexer (MUX) circuit. The signal GRSEL is a global read selection signal and controls the output MUX circuit. The output MUX circuit has a function of selecting the wiring RBL for data reading.

The output MUX circuit has a function of outputting the data DOUT read from the sense amplifier 446.

The transistors 664 to 666 constitute a write driver circuit. The signal GWSEL is a global write selection signal and controls the write driver circuit. The write driver circuit has a function of writing the data DIN to the sense amplifier 446.

The write driver circuit has a function of selecting a column to which the data DIN is to be written. The write driver circuit writes data in byte units, half-word units, or word units in response to the signal GWSEL.

In a gain-cell memory cell, at least two transistors are required for one memory cell, which makes it difficult to increase the number of memory cells per unit area. However, when an OS transistor is used as a transistor included in the memory cell 410, a plurality of memory cell arrays 415 can be stacked. That is, the amount of data that can be stored per unit area can be increased. The gain-cell memory cell can operate as a memory by amplifying accumulated charge by the closest transistor even when charge is accumulated in small capacitance. Furthermore, the capacitance of a capacitor can be reduced by using an OS transistor with an extremely low off-state current as a transistor included in the memory cell 410. Alternatively, one or both of the gate capacitance of the transistor and the parasitic capacitance of the wiring can be utilized as a capacitor, in which case the capacitor can be omitted, i.e., the area of the memory cell 410 can be reduced.

At least part of this embodiment can be implemented in combination with any of the other embodiments described in this specification, as appropriate.

Embodiment 3

In this embodiment, an example of a chip on which the memory device of one embodiment of the present invention is mounted will be described with reference to the drawings.

Figure 22A:
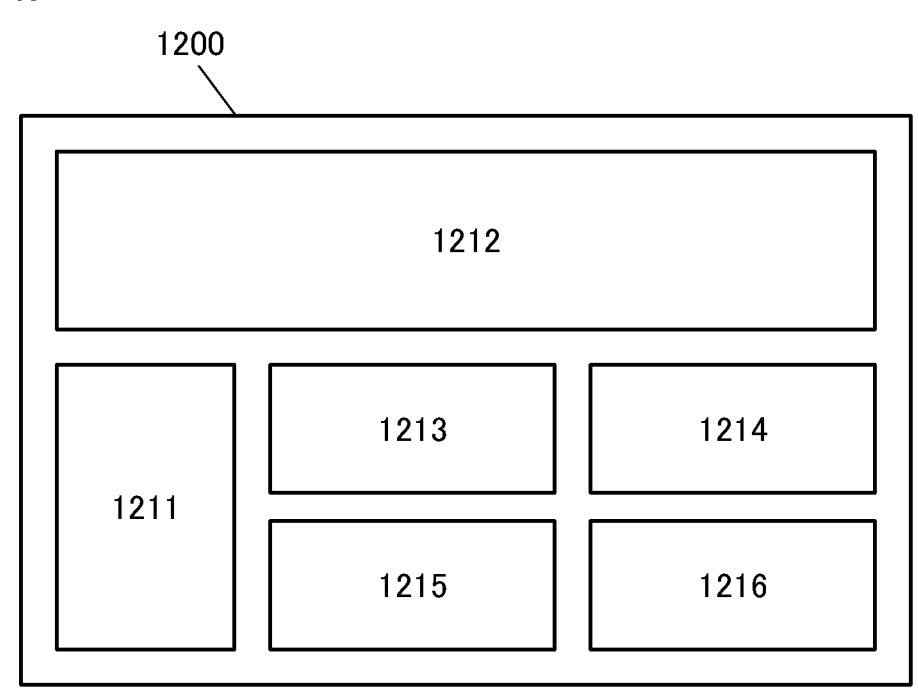
FIGS. 22A and 22B illustrate an example of a semiconductor device.
Figure 22B:
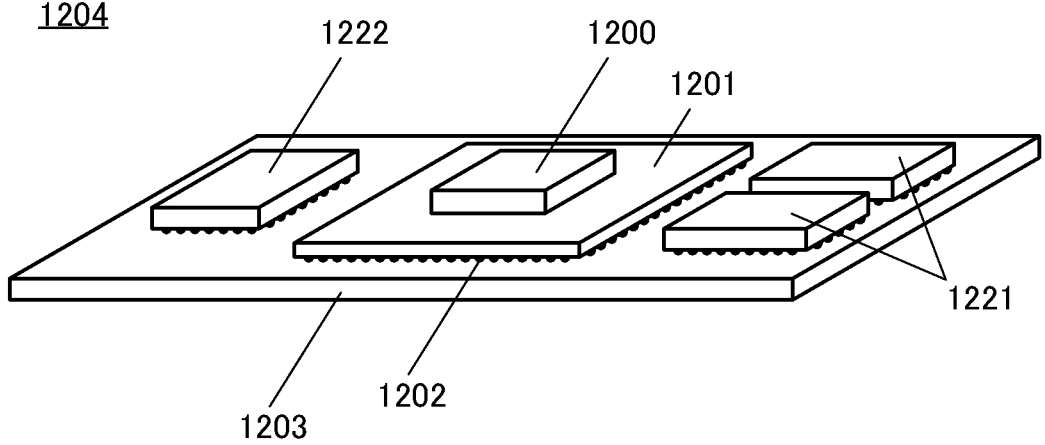

A plurality of circuits (systems) are mounted on a chip 1200 illustrated in FIGS. 22A and 22B. The technique for integrating a plurality of circuits (systems) on one chip is referred to as system on chip (SoC) in some cases.

As illustrated in FIG. 22A, the chip 1200 includes a CPU 1211, a GPU 1212, at least one analog arithmetic unit 1213, at least one memory controller 1214, at least one interface 1215, at least one network circuit 1216, and the like.

A bump (not illustrated) is provided on the chip 1200, and as illustrated in FIG. 22B, the chip 1200 is connected to a first surface of a package substrate 1201. A plurality of bumps 1202 are provided on the rear side of the first surface of the package substrate 1201, and the package substrate 1201 is connected to a motherboard 1203.

A memory device such as a DRAM 1221 or a flash memory 1222 may be provided over the motherboard 1203. For example, the DOSRAM described in the above embodiment can be used as the DRAM 1221. This can make the DRAM 1221 have low power consumption, operate at high speed, and have a large capacity.

The CPU 1211 preferably includes a plurality of CPU cores. The GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM described above can be used as the memory. The GPU 1212 is suitable for parallel computation of a number of data and thus can be used for image processing or product-sum operation. When an image processing circuit or a product-sum operation circuit including an OS transistor is provided in the GPU 1212, image processing or product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an analog/digital (A/D) converter circuit and a digital/analog (D/A) converter circuit. Furthermore, the analog arithmetic unit 1213 may include the above-described product-sum operation circuit. The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, universal serial bus (USB), high-definition multimedia interface (HDMI) (registered trademark), or the like can be used.

The network circuit 1216 includes a network circuit of a local-area network (LAN) or the like. Furthermore, the network circuit 1216 may include a circuit for network security.

The circuits (systems) described above can be formed in the chip 1200 in the same manufacturing process. Therefore, even when the number of circuits needed for the chip 1200 is increased, there is no need to increase the number of steps in the manufacturing process; thus, the chip 1200 can be manufactured at a low cost.

The motherboard 1203 provided with the package substrate 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement techniques such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

At least part of this embodiment can be implemented in combination with any of the other embodiments described in this specification, as appropriate.

Embodiment 4

Described in this embodiment are examples of an electronic component including the memory device of one embodiment of the present invention.

[Electronic Component]

Figure 23A:
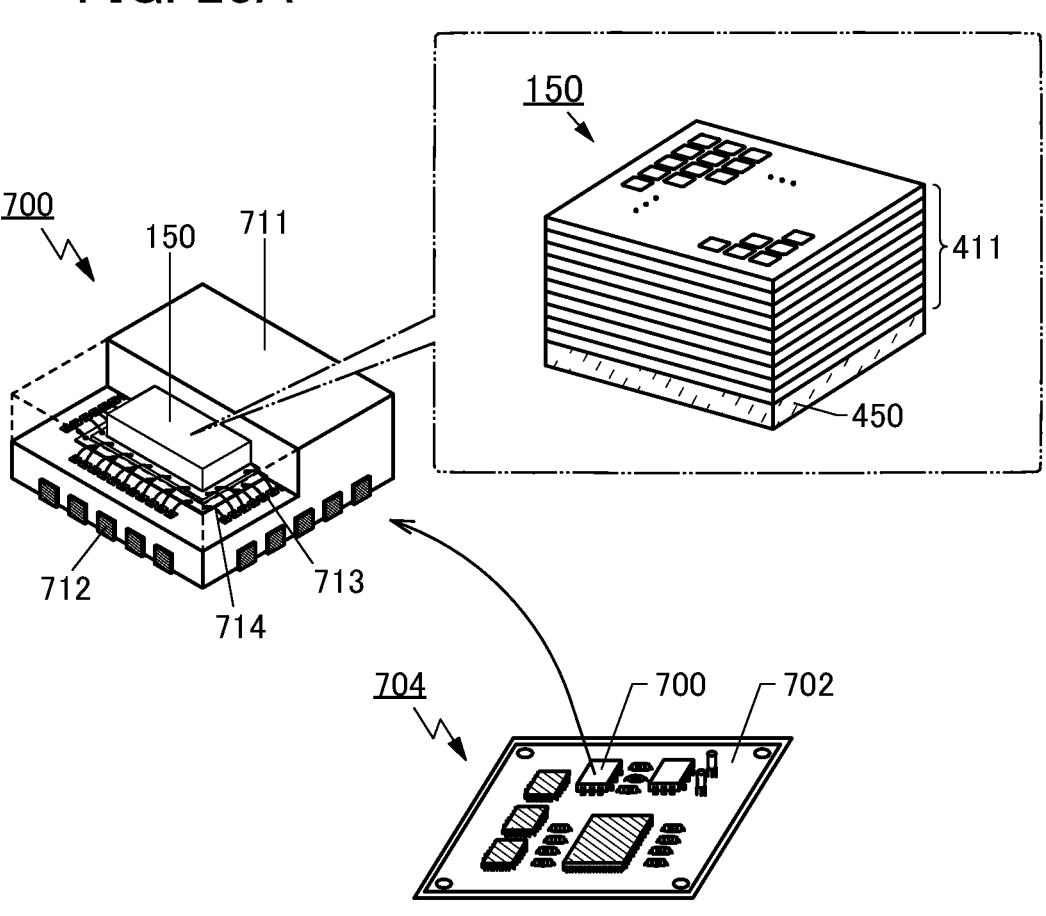
FIGS. 23A and 23B each illustrate an example of an electronic component.

FIG. 23A is a perspective view of an electronic component 700 and a substrate (circuit board 704) on which the electronic component 700 is mounted. The electronic component 700 illustrated in FIG. 23A includes the memory device 150 of one embodiment of the present invention in a mold 711. FIG. 23A omits some components to show the inside of the electronic component 700. The electronic component 700 includes a land 712 outside the mold 711. The land 712 is electrically connected to an electrode pad 713, and the electrode pad 713 is electrically connected to the memory device 150 via a wire 714. The electronic component 700 is mounted on a printed circuit board 702, for example. A plurality of such electronic components are combined and electrically connected to each other on the printed circuit board 702, which forms the circuit board 704.

As described in the above embodiments, the memory device 150 includes the driver circuit layer 450 and the memory layer 411 (including the memory cell array 415).

Figure 23B:
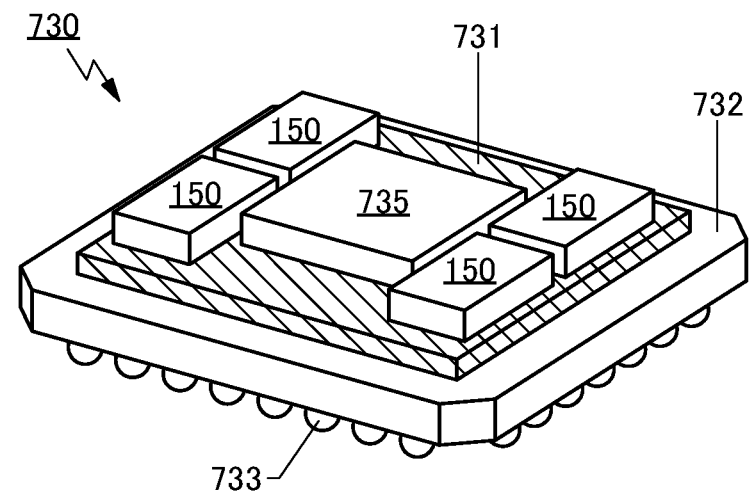

FIG. 23B is a perspective view of an electronic component 730. The electronic component 730 is an example of a SiP (System in package) or an MCM (Multi Chip Module). In the electronic component 730, an interposer 731 is provided over a package substrate 732 (printed circuit board) and a semiconductor device 735 and a plurality of memory devices 150 are provided over the interposer 731.

The electronic component 730 using the memory device 150 as a high bandwidth memory (HBM) is illustrated as an example. An integrated circuit (a semiconductor device) such as a CPU, a GPU, or an FPGA can be used as the semiconductor device 735.

As the package substrate 732, a ceramic substrate, a plastic substrate, or a glass epoxy substrate can be used, for example. As the interposer 731, a silicon interposer or a resin interposer can be used, for example.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 to be used for electrically connecting the integrated circuit and the package substrate 732. In the case of using a silicon interposer, a TSV (Through Silicon Via) can also be used as the through electrode.

A silicon interposer is preferably used as the interposer 731. The silicon interposer can be fabricated at a lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in expansion coefficient between an integrated circuit and the interposer is unlikely to occur. Furthermore, a surface of a silicon interposer has high planarity; thus, a poor connection between the silicon interposer and an integrated circuit provided on the silicon interposer is unlikely to occur. It is particularly preferable to use a silicon interposer for a 2.5D package (2.5D mounting) in which a plurality of integrated circuits are arranged side by side on the interposer.

A heat sink (radiator plate) may be provided to overlap with the electronic component 730. In the case of providing a heat sink, the heights of integrated circuits provided on the interposer 731 are preferably equal to each other. In the electronic component 730 described in this embodiment, the heights of the memory device 150 and the semiconductor device 735 are preferably equal to each other, for example.

An electrode 733 may be provided on the bottom portion of the package substrate 732 to mount the electronic component 730 on another substrate. FIG. 23B illustrates an example in which the electrode 733 is formed of a solder ball. Solder balls are provided in a matrix on the bottom portion of the package substrate 732, whereby a BGA (Ball Grid Array) can be achieved. Alternatively, the electrode 733 may be formed of a conductive pin. When conductive pins are provided in a matrix on the bottom portion of the package substrate 732, a PGA (Pin Grid Array) can be achieved.

The electronic component 730 can be mounted on another substrate by various mounting methods not limited to BGA and PGA. Examples of a mounting method include staggered pin grid array (SPGA), land grid array (LGA), quad flat package (QFP), quad flat J-leaded package (QFJ), and quad flat non-leaded package (QFN).

At least part of this embodiment can be implemented in combination with any of the other embodiments described in this specification, as appropriate.

Embodiment 5

Described in this embodiment are application examples of the memory device of one embodiment of the present invention.

The memory device of one embodiment of the present invention can be used as memory devices of a variety of electronic devices (e.g., information terminals, computers, smartphones, e-book readers, digital still cameras, video cameras, video recording/reproducing devices, navigation systems, and game machines). The memory device of one embodiment of the present invention can also be used for image sensors, Internet of Things (IoT) devices, healthcare devices, and the like. Here, the computers refer not only to tablet computers, notebook computers, and desktop computers, but also to large computers such as server systems.

Examples of an electronic device including the memory device of one embodiment of the present invention will be described. FIGS. 24A to 24J and FIGS. 25A to 25E each show that the electronic component 700 or the electronic component 730, each of which includes the memory device described in the above embodiments, is included in an electronic device.

[Mobile Phone]

Figures 24A, 24B, 24C, 24D, 24E, 24F, 24G, 24H, 24I, 24J:
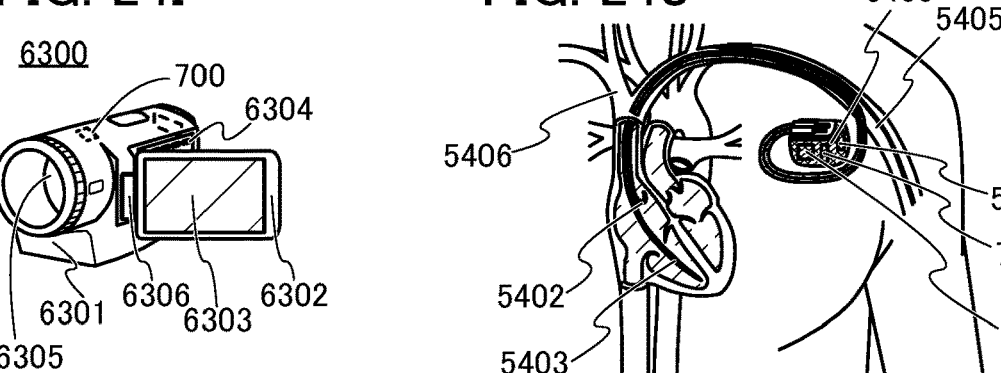
FIGS. 24A to 24J each illustrate an example of an electronic device.

An information terminal 5500 illustrated in FIG. 24A is a mobile phone (a smartphone), which is a type of information terminal. The information terminal 5500 includes a housing 5510 and a display portion 5511. As input interfaces, a touch panel and a button are provided in the display portion 5511 and the housing 5510, respectively.

By using the memory device of one embodiment of the present invention, the information terminal 5500 can hold a temporary file generated at the time of executing an application (e.g., a web browser's cache).

[Wearable Terminal]

FIG. 24B illustrates an information terminal 5900 as an example of a wearable terminal. The information terminal 5900 includes a housing 5901, a display portion 5902, an operation switch 5903, an operation switch 5904, a band 5905, and the like.

Like the aforementioned information terminal 5500, the wearable terminal can retain a temporary file generated at the time of executing an application, by using the memory device of one embodiment of the present invention.

[Information Terminal]

FIG. 24C illustrates a desktop information terminal 5300. The desktop information terminal 5300 includes a main body 5301 of the information terminal, a display portion 5302, and a keyboard 5303.

Like the information terminal 5500, the desktop information terminal 5300 can retain a temporary file generated at the time of executing an application, by using the memory device of one embodiment of the present invention.

Although FIGS. 24A to 24C illustrate a smartphone, a wearable terminal, and a desktop information terminal as electronic devices, one embodiment of the present invention can also be applied to other information terminals such as a personal digital assistant (PDA), a laptop information terminal, and a workstation.

[Household Appliance]

FIG. 24D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is compatible with the Internet of Things (IoT).

The memory device of one embodiment of the present invention can be used in the electric refrigerator-freezer 5800. The electric refrigerator-freezer 5800 can transmit and receive data on food stored in the electric refrigerator-freezer 5800, food expiration dates, and the like to/from an information terminal via the Internet, for example. In the electric refrigerator-freezer 5800, the memory device of one embodiment of the present invention can retain a temporary file generated at the time of transmitting the data.

An electric refrigerator-freezer is described as an example of a household appliance in FIG. 24D; other examples of household appliances include a vacuum, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 24E illustrates a portable game machine 5200 as an example of a game machine. The portable game machine 5200 includes a housing 5201, a display portion 5202, a button 5203, and the like.

FIG. 24F illustrates a stationary game machine 7500 as another example of a game machine. The stationary game machine 7500 can be especially referred to as a home-use stationary game machine. The stationary game machine 7500 includes a main body 7520 and a controller 7522. The controller 7522 can be connected to the main body 7520 with or without a wire. Although not illustrated in FIG. 24F, the controller 7522 can include a display portion that displays a game image, and an input interface besides a button, such as a touch panel, a stick, a rotating knob, and a sliding knob, for example. The shape of the controller 7522 is not limited to that in FIG. 24F and may be changed variously in accordance with the genres of games. For example, in a shooting game such as a first person shooter (FPS) game, a gun-shaped controller having a trigger button can be used. As another example, in a music game or the like, a controller having a shape of a music instrument, audio equipment, or the like can be used. Furthermore, the stationary game machine may include one or more of a camera, a depth sensor, and a microphone, so that the game player can play a game using a gesture or a voice instead of a controller.

Videos displayed on the game machine can be output with a display device such as a television device, a personal computer display, a game display, or a head-mounted display.

By using the memory device of one embodiment of the present invention in the portable game machine 5200 or the stationary game machine 7500, low power consumption can be achieved. The low power consumption reduces heat generation from a circuit; thus, the influence of heat generation on the circuit, the peripheral circuit, and the module can be reduced.

Moreover, with the use of the memory device of one embodiment of the present invention, the portable game machine 5200 or the stationary game machine 7500 can retain a temporary file or the like necessary for arithmetic operation that occurs during game play.

As examples of game machines, FIGS. 24E and 24F illustrates a portable game machine and a home-use stationary game machine; other examples of the game machines include an arcade game machine installed in an entertainment facility (e.g., a game center and an amusement park) and a throwing machine for batting practice, installed in sports facilities.

[Moving Vehicle]

The memory device of one embodiment of the present invention can be used in an automobile, which is a moving vehicle, and around the driver's seat in an automobile.

FIG. 24G illustrates an automobile 5700 as an example of a moving vehicle.

An instrument panel that provides various kinds of information by displaying a speedometer, a tachometer, a mileage, a fuel meter, a gearshift indicator, air-conditioning settings, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, displaying an image taken by the imaging device provided on the exterior of the automobile 5700 eliminates blind areas and enhances safety.

The memory device of one embodiment of the present invention can temporarily retain data, and thus can be used to retain temporary data necessary in an automatic driving system for the automobile 5700 and a system for navigation and risk prediction, for example. The memory device of one embodiment of the present invention may be configured to retain a video taken by a driving recorder provided on the automobile 5700.

Although an automobile is described above as an example of a moving vehicle, moving vehicles are not limited to an automobile. Other examples of moving vehicles include a train, a monorail train, a ship, and a flying object (a helicopter, an unmanned aircraft (a drone), an airplane, and a rocket).

[Camera]

The memory device of one embodiment of the present invention can be used in a camera.

FIG. 24H illustrates a digital camera 6240 as an example of an imaging device. The digital camera 6240 includes a housing 6241, a display portion 6242, operation switches 6243, a shutter button 6244, and the like. An attachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 may be configured to be equipped with a stroboscope, a viewfinder, or the like.

By using the memory device of one embodiment of the present invention in the digital camera 6240, low power consumption can be achieved. The low power consumption reduces heat generation from a circuit; thus, the influence of heat generation on the circuit, the peripheral circuit, and the module can be reduced.

[Video Camera]

The memory device of one embodiment of the present invention can be used in a video camera.

FIG. 24I illustrates a video camera 6300 as an example of an imaging device. The video camera 6300 includes a first housing 6301, a second housing 6302, a display portion 6303, an operation switch 6304, a lens 6305, a joint 6306, and the like. The operation switch 6304 and the lens 6305 are provided for the first housing 6301, and the display portion 6303 is provided for the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When a video taken by the video camera 6300 is recorded, the video needs to be encoded based on a data recording format. With the use of the memory device of one embodiment of the present invention, the video camera 6300 can retain a temporary file generated in encoding.

[ICD]

The memory device of one embodiment of the present invention can be used in an implantable cardioverter-defibrillator (ICD).

FIG. 24J is a schematic cross-sectional view illustrating an example of an ICD. An ICD main unit 5400 includes at least a battery 5401, the electronic component 700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of them placed in the right ventricle and the end of the other placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 700.

The antenna 5404 can receive power, and the power is charged into the battery 5401. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 that can receive power, an antenna that can transmit a physiological signal may be provided. For example, a system that monitors the cardiac activity and is capable of monitoring physiological signals such as pulses, respiratory rate, heart rate, and body temperature with an external monitoring device may be constructed.

[Expansion Device for Personal Computer]

The memory device of one embodiment of the present invention can be used in a computer such as a personal computer (PC) and an expansion device for an information terminal.

Figure 25A:
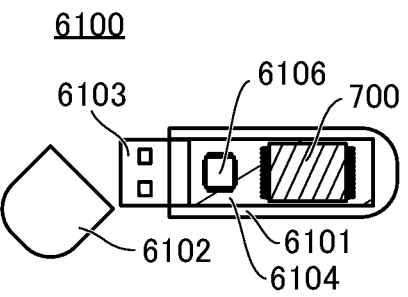
FIGS. 25A to 25E each illustrate an example of an electronic device.

FIG. 25A illustrates, as an example of the expansion device, a portable expansion device 6100 that is externally attached to a PC and includes a chip capable of storing data. When the expansion device 6100 is connected to a PC with a universal serial bus (USB), for example, data can be stored in the chip. FIG. 25A illustrates the portable expansion device 6100; however, the expansion device of one embodiment of the present invention is not limited to this and may be a relatively large expansion device including a cooling fan, for example.

The expansion device 6100 includes a housing 6101, a cap 6102, a USB connector 6103, and a substrate 6104. The substrate 6104 is held in the housing 6101. The substrate 6104 is provided with a circuit for driving the memory device of one embodiment of the present invention, for example. For example, the substrate 6104 is provided with the electronic component 700 and a controller chip 6106. The USB connector 6103 functions as an interface for connection to an external device.

[SD Card]

The memory device of one embodiment of the present invention can be used in an SD card that can be attached to electronic devices such as an information terminal and a digital camera.

Figure 25B:
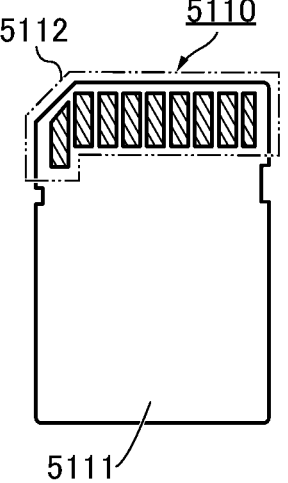
Figure 25C:
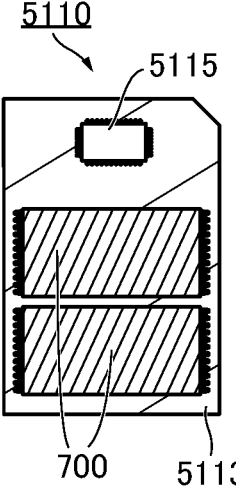

FIG. 25B is a schematic external view of an SD card, and FIG. 25C is a schematic view illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with the electronic component 700 and a controller chip 5115. Note that the circuit configurations of the electronic component 700 and the controller chip 5115 are not limited to those described above and can be changed as appropriate depending on circumstances. For example, a write circuit, a row driver, a read circuit, and the like that are provided in an electronic component may be incorporated into the controller chip 5115 instead of the electronic component 700.

When the electronic component 700 is also provided on the back side of the substrate 5113, the capacity of the SD card 5110 can be increased. In addition, a wireless chip with a radio communication function may be provided on the substrate 5113. This enables wireless communication between an external device and the SD card 5110, making it possible to write and read data to and from the electronic component 700.

[SSD]

The memory device of one embodiment of the present invention can be used in a solid state drive (SSD) that can be attached to electronic devices such as information terminals.

Figure 25D:
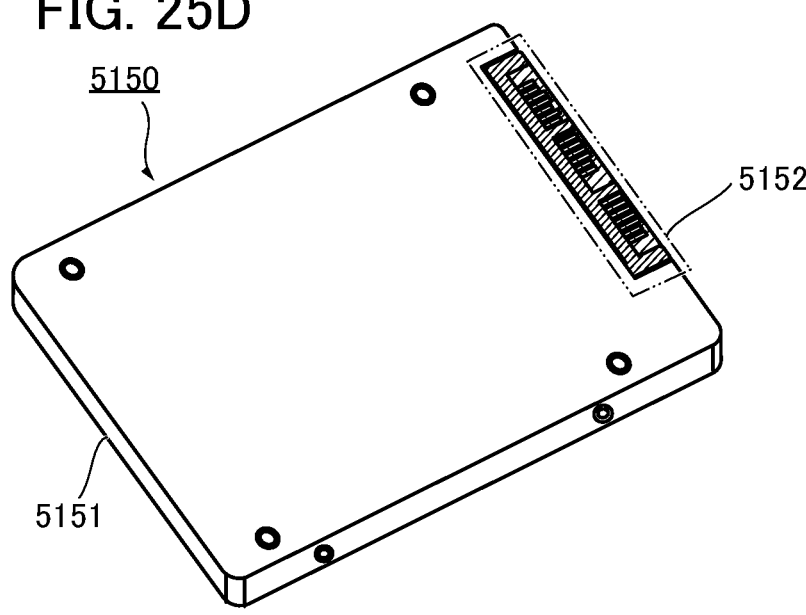
Figure 25E:
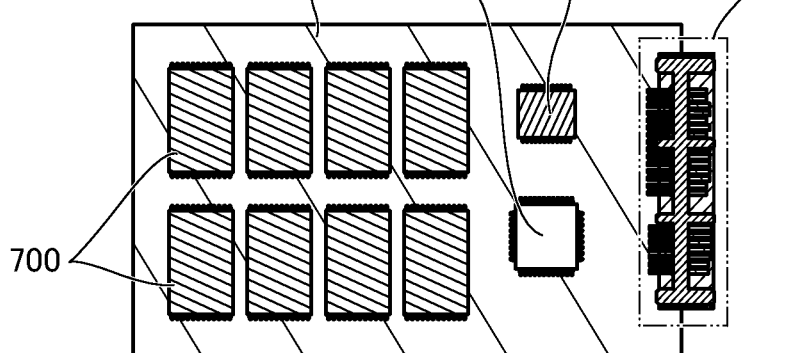

FIG. 25D is a schematic external view of an SSD, and FIG. 25E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with the electronic component 700, a memory chip 5155, and a controller chip 5156. When the electronic component 700 is also provided on the back side of the substrate 5153, the capacity of the SSD 5150 can be increased. A work memory is incorporated into the memory chip 5155. For example, a DRAM chip may be used as the memory chip 5155. A processor, an error-correcting code (ECC) circuit, and the like are incorporated into the controller chip 5156. Note that the circuit configurations of the electronic component 700, the memory chip 5155, and the controller chip 5156 are not limited to those described above and can be changed as appropriate depending on circumstances. For example, a memory functioning as a work memory may also be provided in the controller chip 5156.

[Computer]

Figure 26A:
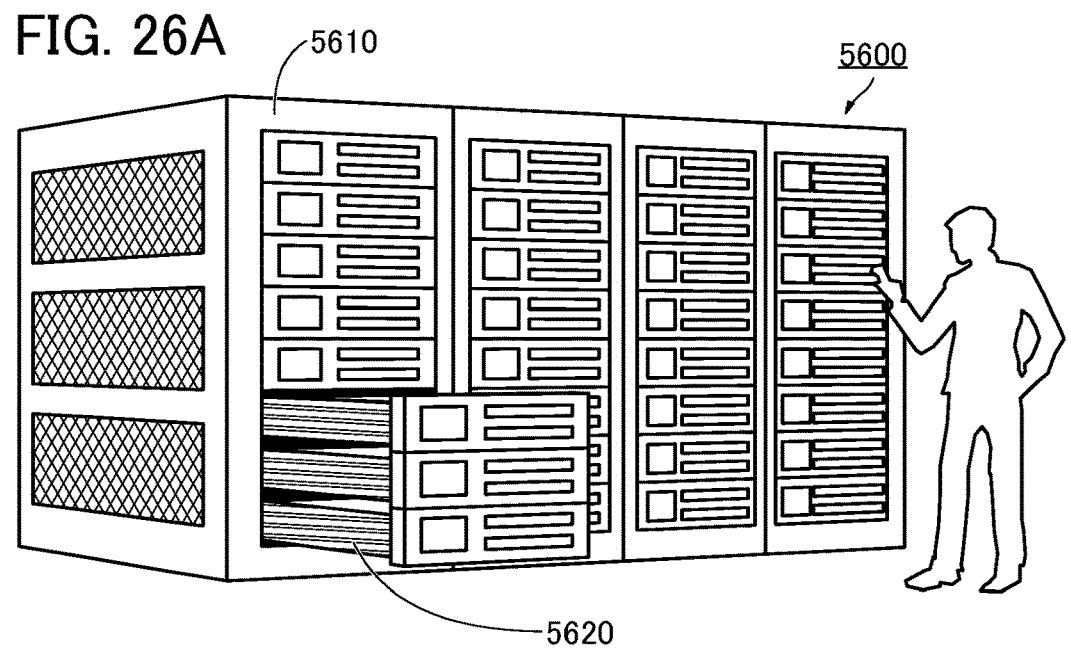
FIGS. 26A to 26C each illustrate an example of an electronic device.

A computer 5600 illustrated in FIG. 26A is an example of a large computer. In the computer 5600, a plurality of rack mount computers 5620 are stored in a rack 5610.

Figure 26B:
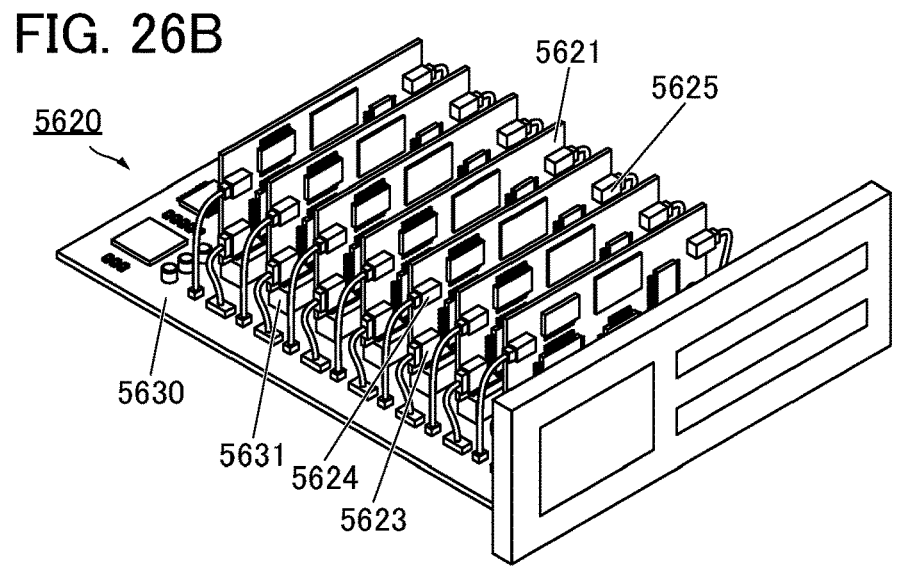

The computer 5620 can have a structure in a perspective view illustrated in FIG. 26B, for example. In FIG. 26B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 26C:
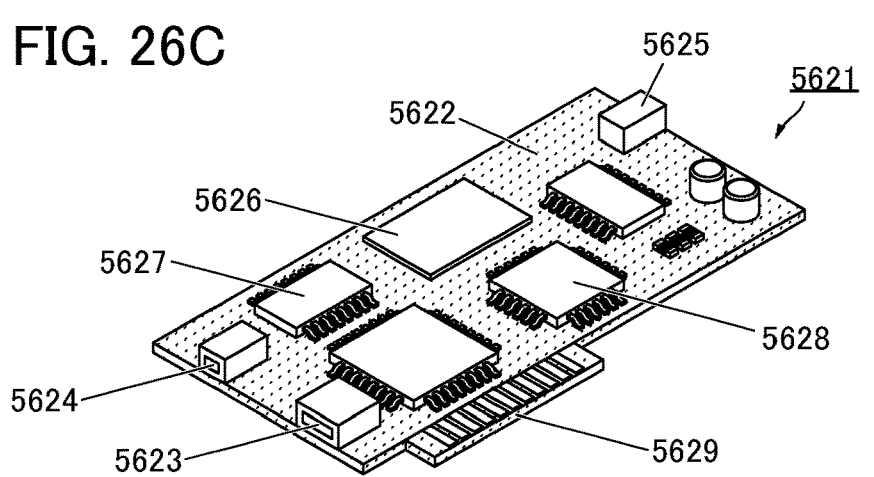

The PC card 5621 illustrated in FIG. 26C is an example of a processing board provided with a CPU, a GPU, a memory device, and the like. The PC card 5621 includes a board 5622. The board 5622 includes a connection terminal 5623, a connection terminal 5624, a connection terminal 5625, a semiconductor device 5626, a semiconductor device 5627, a semiconductor device 5628, and a connection terminal 5629. Note that FIG. 26C also illustrates semiconductor devices other than the semiconductor device 5626, the semiconductor device 5627, and the semiconductor device 5628, the following description of the semiconductor device 5626, the semiconductor device 5627, and the semiconductor device 5628 can be referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve as, for example, an interface for performing power supply, signal input, and the like to the PC card 5621. As another example, they can serve as an interface for outputting a signal calculated by the PC card 5621. Examples of the standard for each of the connection terminal 5623, the connection terminal 5624, and the connection terminal 5625 include universal serial bus (USB), serial ATA (SATA), and small computer system interface (SCSI). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include a field programmable gate array (FPGA), a GPU, and a CPU. As the semiconductor device 5627, the electronic component 730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a memory device. As the semiconductor device 5628, the electronic component 700 can be used, for example.

The computer 5600 can also function as a parallel computer. When the computer 5600 is used as a parallel computer, large-scale computation necessary for artificial intelligence learning and inference can be performed, for example.

By using the memory device of one embodiment of the present invention in the aforementioned electronic devices and the like, low power consumption can be achieved. The memory device of one embodiment of the present invention has low power consumption, and thus can reduce heat generation from a circuit. Accordingly, the adverse effects of heat generation on the circuit, the peripheral circuit, and the module can be reduced. Furthermore, the use of the memory device of one embodiment of the present invention can achieve an electronic device that operates stably even in a high temperature environment. Thus, the reliability of the electronic device can be improved.

At least part of this embodiment can be implemented in combination with any of the other embodiments described in this specification, as appropriate.

Embodiment 6

In this embodiment, a specific example of using the semiconductor device of one embodiment of the present invention in a device for space will be described with reference to FIG. 27.

The semiconductor device of one embodiment of the present invention includes an OS transistor. A change in electrical characteristics of the OS transistor due to radiation irradiation is small. That is, the OS transistor is highly resistant to radiation, and thus can be suitably used even in an environment where radiation can enter. For example, the OS transistor can be suitably used in outer space.

Figure 27:
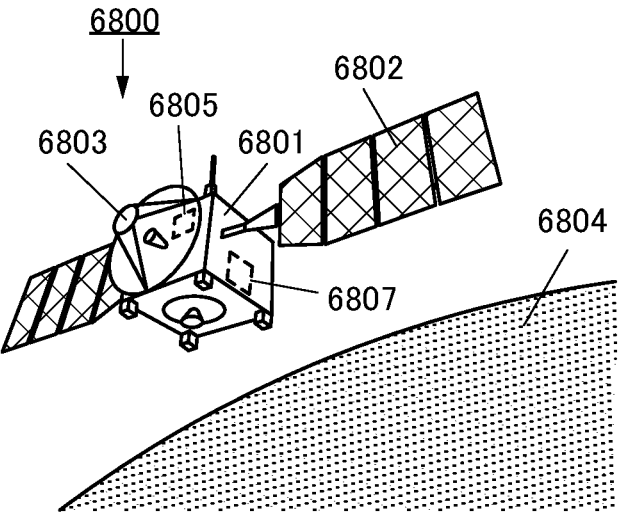
FIG. 27 illustrates an example of a device for space.

FIG. 27 illustrates an artificial satellite 6800 as an example of a device for space. The artificial satellite 6800 includes a body 6801, a solar panel 6802, an antenna 6803, a secondary battery 6805, and a control device 6807. In FIG. 27, a planet 6804 in outer space is illustrated. Note that outer space refers to, for example, space at an altitude greater than or equal to 100 km, and outer space described in this specification may include one or more of thermosphere, mesosphere, and stratosphere.

The amount of radiation in outer space is 100 or more times that on the ground. Examples of radiation include electromagnetic waves (electromagnetic radiation) typified by X-rays and gamma rays and particle radiation typified by alpha rays, beta rays, neutron beam, proton beam, heavy-ion beams, and meson beams.

When the solar panel 6802 is irradiated with sunlight, electric power required for operation of the artificial satellite 6800 is generated. However, for example, in the situation where the solar panel is not irradiated with sunlight or the situation where the amount of sunlight with which the solar panel is irradiated is small, the amount of generated electric power is small. Accordingly, a sufficient amount of electric power required for operation of the artificial satellite 6800 might not be generated. In order to operate the artificial satellite 6800 even with a small amount of generated electric power, the artificial satellite 6800 is preferably provided with the secondary battery 6805. Note that a solar panel is referred to as a solar cell module in some cases.

The artificial satellite 6800 can generate a signal. The signal is transmitted through the antenna 6803, and can be received by a ground-based receiver or another artificial satellite, for example. When the signal transmitted by the artificial satellite 6800 is received, the position of a receiver that receives the signal can be measured. Thus, the artificial satellite 6800 can construct a satellite positioning system.

The control device 6807 has a function of controlling the artificial satellite 6800. The control device 6807 is formed with one or more selected from a CPU, a GPU, and a memory device, for example. Note that the semiconductor device including the OS transistor of one embodiment of the present invention is suitably used for the control device 6807. A change in electrical characteristics of the OS transistor due to radiation irradiation is smaller than a change in electrical characteristics of a Si transistor. Accordingly, the OS transistor has high reliability and thus can be suitably used even in an environment where radiation can enter.

The artificial satellite 6800 can include a sensor. For example, with a structure including a visible light sensor, the artificial satellite 6800 can have a function of sensing sunlight reflected by a ground-based object. Alternatively, with a structure including a thermal infrared sensor, the artificial satellite 6800 can have a function of sensing thermal infrared rays emitted from the surface of the earth. Thus, the artificial satellite 6800 can function as an earth observing satellite, for example.

Although the artificial satellite is described as an example of a device for space in this embodiment, one embodiment of the present invention is not limited to this example. The semiconductor device of one embodiment of the present invention can be suitably used for a device for space such as a spacecraft, a space capsule, or a space probe, for example.

At least part of this embodiment can be implemented in combination with any of the other embodiments described in this specification, as appropriate.

This application is based on Japanese Patent Application Serial No. 2022-165163 filed with Japan Patent Office on Oct. 14, 2022, the entire contents of which are hereby incorporated by reference.

What is claimed is:

1. A semiconductor device comprising:

a first transistor;

a capacitor; and a first insulating layer, wherein the first transistor comprises a first conductive layer, a second conductive layer, a third conductive layer, a semiconductor layer, and a second insulating layer, wherein the capacitor comprises a fourth conductive layer, a fifth conductive layer, a sixth conductive layer, a seventh conductive layer, and the second insulating layer, wherein the first insulating layer is provided over the first conductive layer and the fourth conductive layer and comprises a first opening reaching the first conductive layer and a second opening reaching the fourth conductive layer, wherein the second conductive layer and the fifth conductive layer are provided over the first insulating layer, wherein the semiconductor layer comprises a part in contact with the first conductive layer in the first opening and a part in contact with the second conductive layer, wherein the sixth conductive layer comprises a part in contact with the fourth conductive layer in the second opening and a part in contact with the fifth conductive layer, wherein the second insulating layer comprises a part covering the semiconductor layer in the first opening and a part covering the sixth conductive layer in the second opening, wherein the third conductive layer comprises a part overlapping with the semiconductor layer with the second insulating layer therebetween in the first opening, and wherein the seventh conductive layer comprises a part overlapping with the sixth conductive layer with the second insulating layer therebetween in the second opening.

2. The semiconductor device according to claim 1, wherein the first conductive layer comprises a first metal layer and a first oxide layer over the first metal layer, wherein the second conductive layer comprises a second metal layer and a second oxide layer over the second metal layer, and wherein the semiconductor layer is in contact with the first oxide layer and the second oxide layer.

3. The semiconductor device according to claim 1, wherein the first conductive layer includes a same material as the fourth conductive layer, wherein the second conductive layer includes a same material as the fifth conductive layer, and wherein the third conductive layer includes a same material as the seventh conductive layer.

4. The semiconductor device according to claim 1, further comprising a third insulating layer, wherein the third conductive layer and the seventh conductive layer are provided so as to be embedded in the third insulating layer.

5. The semiconductor device according to claim 1, further comprising an eighth conductive layer and a ninth conductive layer, wherein the eighth conductive layer comprises a part positioned between the second insulating layer and the third conductive layer in the first opening, and wherein the ninth conductive layer comprises a part positioned between the second insulating layer and the seventh conductive layer in the second opening.

6. The semiconductor device according to claim 1, wherein the first opening has a larger diameter at an upper end than at a lower end, and wherein the second opening has a larger diameter at an upper end than at a lower end.

7. The semiconductor device according to claim 1, wherein the first conductive layer is electrically connected to the fourth conductive layer, the fifth conductive layer, and the sixth conductive layer.

8. The semiconductor device according to claim 1, wherein the second conductive layer is electrically connected to the fourth conductive layer, the fifth conductive layer, and the sixth conductive layer.

9. The semiconductor device according to claim 1, further comprising a second transistor and a third transistor, wherein a gate of the second transistor is electrically connected to the first conductive layer, and wherein one of a source and a drain of the third transistor is electrically connected to one of a source and a drain of the second transistor.

10. The semiconductor device according to claim 9, wherein the second transistor and the third transistor are positioned below the first conductive layer, wherein the second transistor comprises a part overlapping with the first transistor, and wherein the third transistor comprises a part overlapping with the capacitor.

11. The semiconductor device according to claim 9, wherein the second transistor and the third transistor are positioned below the first conductive layer, wherein the second transistor comprises a part overlapping with the capacitor, and wherein the third transistor comprises a part overlapping with the first transistor.

12. A semiconductor device comprising:

a first transistor; and a capacitor, wherein the first transistor comprises:

a first conductive layer;

a first insulating layer over the first conductive layer, the first insulating layer having a first opening reaching the first conductive layer;

a second conductive layer over the first insulating layer;

a semiconductor layer comprising a part in contact with the first conductive layer in the first opening and a part in contact with the second conductive layer;

a second insulating layer comprising a part covering the semiconductor layer in the first opening; and a third conductive layer comprising a part overlapping with the semiconductor layer with the second insulating layer therebetween in the first opening, and wherein the capacitor comprises:

a fourth conductive layer;

the first insulating layer over the fourth conductive layer, the first insulating layer having a second opening reaching the fourth conductive layer;

a fifth conductive layer over the first insulating layer;

a sixth conductive layer comprising a part in contact with the fourth conductive layer in the second opening and a part in contact with the fifth conductive layer;

the second insulating layer comprising a part covering the sixth conductive layer in the second opening; and a seventh conductive layer comprising a part overlapping with the sixth conductive layer with the second insulating layer therebetween in the second opening.

13. The semiconductor device according to claim 12, wherein the first conductive layer comprises a first metal layer and a first oxide layer over the first metal layer, wherein the second conductive layer comprises a second metal layer and a second oxide layer over the second metal layer, and wherein the semiconductor layer is in contact with the first oxide layer and the second oxide layer.

14. The semiconductor device according to claim 12, wherein the first conductive layer includes a same material as the fourth conductive layer, wherein the second conductive layer includes a same material as the fifth conductive layer, and wherein the third conductive layer includes a same material as the seventh conductive layer.

15. The semiconductor device according to claim 12, further comprising a third insulating layer, wherein the third conductive layer and the seventh conductive layer are provided so as to be embedded in the third insulating layer.

16. The semiconductor device according to claim 12, further comprising an eighth conductive layer and a ninth conductive layer, wherein the eighth conductive layer comprises a part positioned between the second insulating layer and the third conductive layer in the first opening, and wherein the ninth conductive layer comprises a part positioned between the second insulating layer and the seventh conductive layer in the second opening.

17. The semiconductor device according to claim 12, wherein the first opening has a larger diameter at an upper end than at a lower end, and wherein the second opening has a larger diameter at an upper end than at a lower end.

18. The semiconductor device according to claim 12, wherein the first conductive layer is electrically connected to the fourth conductive layer, the fifth conductive layer, and the sixth conductive layer.

19. The semiconductor device according to claim 12, wherein the second conductive layer is electrically connected to the fourth conductive layer, the fifth conductive layer, and the sixth conductive layer.

20. The semiconductor device according to claim 12, further comprising a second transistor and a third transistor, wherein a gate of the second transistor is electrically connected to the first conductive layer, and wherein one of a source and a drain of the third transistor is electrically connected to one of a source and a drain of the second transistor.

21. The semiconductor device according to claim 20, wherein the second transistor and the third transistor are positioned below the first conductive layer, wherein the second transistor comprises a part overlapping with the first transistor, and wherein the third transistor comprises a part overlapping with the capacitor.

22. The semiconductor device according to claim 20, wherein the second transistor and the third transistor are positioned below the first conductive layer, wherein the second transistor comprises a part overlapping with the capacitor, and wherein the third transistor comprises a part overlapping with the first transistor.

* * * * *